(12) United States Patent
Yoon et al.

(10) Patent No.: US 9,159,443 B2
(45) Date of Patent: *Oct. 13, 2015

(54) NONVOLATILE MEMORY DEVICE, OPERATING METHOD THEREOF AND MEMORY SYSTEM INCLUDING THE SAME

(71) Applicant: SAMSUNG ELECTRONICS CO., LTD., Suwon-si, Gyeonggi-do (KR)

(72) Inventors: Chi Weon Yoon, Seoul (KR); Donghyuk Chae, Seoul (KR); Jae-Woo Park, Gyeonggi-do (KR); Sang-Wan Nam, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 85 days.

This patent is subject to a terminal disclaimer.

(21) Appl. No.: 14/052,227

(22) Filed: Oct. 11, 2013

(65) Prior Publication Data

US 2014/0092685 A1   Apr. 3, 2014

Related U.S. Application Data

(63) Continuation of application No. 13/045,661, filed on Mar. 11, 2011, now Pat. No. 8,559,235.

(30) Foreign Application Priority Data

Aug. 26, 2010   (KR) .................. 10-2010-0083044

(51) Int. Cl.
*G11C 11/34* (2006.01)
*G11C 16/34* (2006.01)
*G11C 16/04* (2006.01)
*G11C 16/06* (2006.01)
*G11C 16/16* (2006.01)

(52) U.S. Cl.
CPC ........ *G11C 16/3445* (2013.01); *G11C 16/0483* (2013.01); *G11C 16/06* (2013.01); *G11C 16/16* (2013.01)

(58) Field of Classification Search
CPC ..... G11C 16/16; G11C 16/14; G11C 16/3445
USPC ............................ 365/185.29, 185.22, 63, 51
See application file for complete search history.

(56) References Cited

U.S. PATENT DOCUMENTS

| | | | |
|---|---|---|---|
| 7,110,301 B2 | 9/2006 | Lee et al. | |
| 7,529,138 B2 | 5/2009 | Park et al. | |
| 7,551,492 B2 * | 6/2009 | Kim | 365/185.29 |
| 7,782,681 B2 | 8/2010 | Kim et al. | |
| 8,559,235 B2 * | 10/2013 | Yoon et al. | 365/185.29 |
| 8,951,862 B2 * | 2/2015 | Chen et al. | 438/258 |

FOREIGN PATENT DOCUMENTS

| | | |
|---|---|---|
| KR | 1020000027554 | 5/2000 |
| KR | 1020100018457 | 2/2010 |
| KR | 1020100024257 | 3/2010 |

* cited by examiner

*Primary Examiner* — Son Dinh
(74) *Attorney, Agent, or Firm* — F. Chau & Associates, LLP

(57) ABSTRACT

A method of operating a non-volatile memory device includes performing an erasing operation to memory cells associated with a plurality of string selection lines (SSLs), the memory cells associated with the plurality of SSLs constituting a memory block, and verifying the erasing operation to second memory cells associated with a second SSL after verifying the erasing operation to first memory cells associated with a first SSL.

33 Claims, 63 Drawing Sheets

| SSL | Float |
| --- | --- |
| WL | Vwe1 |
| GSL | Float |
| Substrate | Vers1 |

Fig. 12

| BL | Vpre(Vcc) |
|---|---|
| Selected SSL | Vssl2(Vcc) |
| Unselected SSL | Vssl3(Vss) |
| WL | Vvfy(Vss) |
| GSL | Vgsl2(Vcc) |
| CSL | Vcsl(Vss) |

Fig. 16

| SSL | Float |
|---|---|
| WL of unselected sub-block | Float |
| WL of selected sub-block | Vwe1 |
| DWL | Vdwl1 |
| GSL | Float |
| Substrate | Vers1 |

Fig. 19

| BL | Vpre(Vcc) |
|---|---|
| Selected SSL | Vssl2(Vcc) |
| Unselected SSL | Vssl3(Vss) |
| WL of selected sub-block | Vvfy(Vss) |
| WL of unselected sub-block | Vread1 |
| DWL | Vread2 |
| GSL | Vgsl2(Vcc) |
| CSL | Vcsl(Vss) |

Fig. 23

| BL | Vpre(Vcc) |
|---|---|
| Selected SSL | Vssl2(Vcc) |
| Unselected SSL | Vssl3(Vcc) |
| WL | Vvfy(Vss) |
| Selected GSL | Vgsl2(Vcc) |
| Unselected GSL | Vgsl3(Vss) |
| CSL | Vcsl(Vss) |

| SSLs | Float |
|---|---|
| WLs | Float → Vwe2 |
| GSL | Vss → Float |
| Substrate | Vpr → Vers2 |

Fig. 41

| SSL | Float |
|---|---|
| WL of unselected sub block | Float |
| WL of selected sub block | Float → Vwe2 |
| DWL | Vdwl2 |
| GSL | Vss → Float |
| Substrate | Vpr → Vers2 |

NONVOLATILE MEMORY DEVICE, OPERATING METHOD THEREOF AND MEMORY SYSTEM INCLUDING THE SAME

CROSS-REFERENCE TO RELATED APPLICATION

This application is a continuation application of co-pending U.S. application Ser. No. 13/045,661 filed Mar. 11, 2011, which claims priority to Korean Patent Application No. 10-2010-0083044, filed on Aug. 26, 2010, the entire contents of which are hereby incorporated by reference.

BACKGROUND

1. Technical Field

The present disclosure relates to a semiconductor memory device, and more particularly, to a nonvolatile memory device having a Three-Dimensional (3D) array structure, an operating method thereof, and a memory system including the same.

2. Related Art

A semiconductor memory device comprises semiconductor materials such as silicon (Si), germanium (Ge), gallium arsenide (GaAs) and indium phosphide (InP). The semiconductor memory device includes volatile memory devices and nonvolatile memory devices.

In the volatile memory device, stored data are erased when a power source is shut off. The volatile memory device includes Static Random Access Memory (SRAM), Dynamic Random Access Memory (DRAM), and Synchronous Dynamic Random Access Memory (SDRAM). The nonvolatile memory device can retain stored data even when a power source is shut off. The nonvolatile memory device includes Read-Only Memory (ROM), Programmable Read Only Memory (PROM), Erasable Programmable Read Only Memory (EPROM), Electrical Erasable Programmable Read Only Memory (EEPROM), flash memory device, Phase-change Random Access Memory (PRAM), Magnetoresistive Random Access Memory (MRAM), Resistive Random Access Memory (RRAM), and Ferroelectric Random Access Memory (FRAM). The flash memory device includes a NOR type flash memory device and a NAND type flash memory device.

SUMMARY

According to an embodiment of the inventive concept, a method of
operating a non-volatile memory device comprises performing an erasing operation to memory cells associated with a plurality of string selection lines (SSLs), the memory cells associated with the plurality of SSLs constituting a memory block, and verifying the erasing operation to second memory cells associated with a second SSL after verifying the erasing operation to first memory cells associated with a first SSL.

The method may further comprise resetting an SSL count and an erase count prior to the erasing operation.

The method may further comprise counting up the SSL count when verifying the erasing operation to first memory cells associated with the first SSL passes prior to verifying the erasing operation to second memory cells associated with the second SSL.

The method may further comprise counting up the erase count when verifying the erasing operation to first memory cells associated with the first SSL fails, and adjusting an erase voltage to erase the memory block.

The method may further comprise performing an error report when the erase count reaches a preset value.

The memory cells of the non-volatile memory device can be stacked in a direction perpendicular with respect to a major axis of a substrate where the memory cells are disposed.

The method may further comprise resetting an SSL latch and an erase count prior to the erasing operation.

The method may further comprise storing an address of the first SSL into the SSL latch when verifying the erasing operation to first memory cells associated with the first SSL fails.

The method may further comprise counting up the erase count when the SSL latch stores the address of the first SSL after completing verifying the erasing operation to memory cells associated with the plurality of SSLs, and adjusting an erase voltage to erase the memory block.

The method may further comprise verifying the erasing operation to the first memory cells associated with the first SSL.

The method may further comprise deleting the address of the first SSL from the SSL latch when verifying the erasing operation to the first memory cells associated with the first SSL passes.

The method may further comprise setting an SSL latch and resetting an erase count prior to the erasing operation.

The method may further comprise deleting an address of the first SSL from the SSL latch when verifying the erasing operation to first memory cells associated with the first SSL passes.

The method may further comprise counting up the erase count when the SSL latch stores the address of the second SSL remaining in the SSL latch after completing verifying the erasing operation to memory cells associated with the plurality of SSLs, and adjusting an erase voltage to erase the memory block.

According to an embodiment of the inventive concept, a non-volatile memory device comprises a memory cell array comprising memory cells associated with a plurality of string selection lines (SSLs), a voltage generating unit configured to generate an erase voltage for performing an erasing operation to the memory cells associated with the SSLs, the memory cells associated with the plurality of SSLs constituting a memory block, and a control logic configured to verify the erasing operation to second memory cells associated with a second SSL after verifying the erasing operation to first memory cells associated with a first SSL.

The non-volatile memory device may further comprise an address decoder connected to the memory cell array through the SSLs, word lines, and at least one ground selection line (GSL).

The non-volatile memory device may further comprise a read/write circuit connected to the memory cell array through bit lines.

The non-volatile memory device may further comprise a pass/fail check unit for determining whether the verification of the erasing operation to memory cells has failed or passed.

The control logic may comprise an erase control unit, an SSL counter, and an erase counter, the erase control unit receiving a pass/fail data from the pass/fail check unit.

The control logic may comprise an erase control unit, an SSL address latch, and an erase counter, the erase control unit receiving a pass/fail data from the pass/fail check unit.

The non-volatile memory device can be configured to receive a signal from a controller.

The controller may include a RAM, a processing unit, a host interface, and a memory interface.

The non-volatile memory device can be configured to transmit an error signal to an error correction block.

According to an embodiment of the inventive concept, a method of verifying an erasing operation in a non-volatile memory device comprises selecting a first string selection line (SSL) while not selecting a second SSL from a plurality of SSLs constituting a memory block, verifying the erasing operation to memory cells connected to word lines associated with the selected first SSL, selecting the second SSL while not selecting the first SSL, and verifying the erasing operation to memory cells connected to word lines associated with the selected second SSL.

The method may further comprise pre-charging a bit line disposed in the memory block.

A voltage for pre-charging the bit line can comprise a power source voltage (Vcc).

Selecting the first SSL may comprise applying a power source voltage (Vcc) to the first SSL.

Unselecting the second SSL may comprise applying a ground voltage (Vss) to the second SSL.

Verifying the erasing operation to memory cells connected to word lines associated with the selected first SSL may comprise applying the ground voltage (Vss) to the word lines.

The method may further comprise applying a ground voltage (Vss) to a ground selection line (GSL).

The method may further comprise applying a ground voltage (Vss) to a common source line.

BRIEF DESCRIPTION OF THE DRAWINGS

Exemplary embodiments of the present invention can be understood in more detail from the following descriptions taken in conjunction with the accompanying drawings, in which:

FIG. 12 is a table showing voltage conditions which are applied to a memory block in an erasure verification operation;

FIG. 16 is a table showing voltage conditions which are applied to a memory block of FIG. 15 in an erasing operation;

FIG. 19 is a table showing voltage conditions which are applied to the memory block of FIG. 15 in an erasure verification operation;

FIG. 23 is a table showing voltage conditions which are applied to the memory block of FIG. 22 in an erasure verification operation;

FIG. 41 is a table showing voltage conditions in an erasure operation of a memory block of FIGS. 36 and 37 according to an embodiment of the inventive concept;

DETAILED DESCRIPTION OF EXEMPLARY EMBODIMENTS

Exemplary embodiments of the inventive concept will now be described more fully with reference to the accompanying drawings. The inventive concept may, however, embodied in many different forms and should not be construed as limited to only the exemplary embodiments set forth herein.

Figure 1:
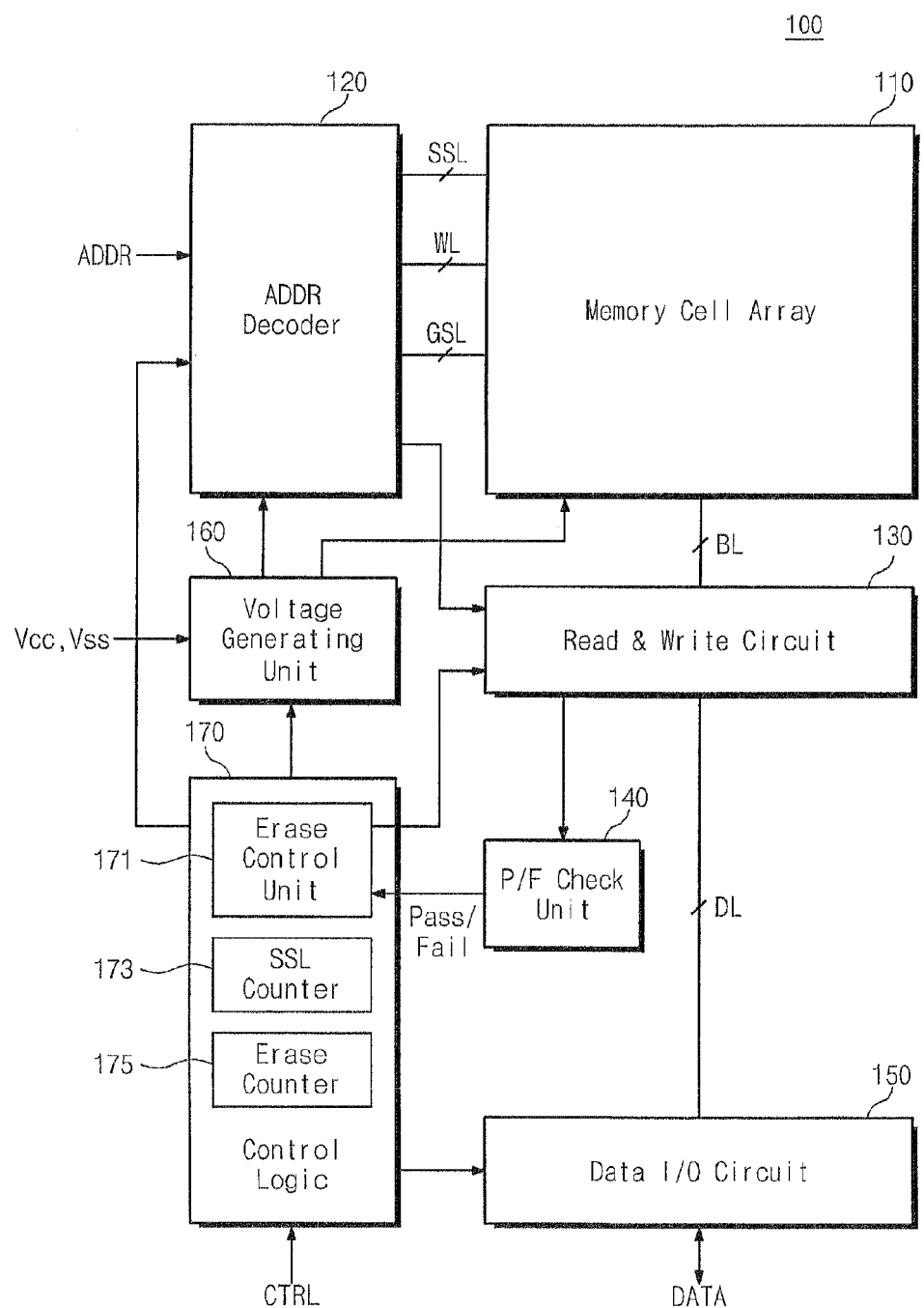
FIG. 1 is a block diagram illustrating a nonvolatile memory device according to an embodiment of the inventive concept.

FIG. 1 is a block diagram illustrating a nonvolatile memory device 100 according to an embodiment of the inventive concept.

Referring to FIG. 1, the nonvolatile memory device 100 includes a memory cell array 110, an address decoder 120, a read and write circuit 130, a pass/fail (P/F) check unit 140, a data input/output (I/O) circuit 150, a voltage generating unit 160, and a control logic 170.

The memory cell array 110 is connected to the address decoder 120 through word lines WL and selection lines. For example, the selection lines include string selection lines SSL and ground selection lines GSL. The memory cell array 110 is connected to the read and write circuit 130 through bit lines BL.

The memory cell array 110 includes a plurality of memory cells. For example, the memory cell array 110 includes a plurality of memory cells which are stacked in the direction crossing with a substrate and has a 3D structure. For example, memory cells are provided along a row and a column on the substrate, and they are stacked in a direction substantially perpendicular with respect to a major axis of the substrate to form a 3D structure. In an embodiment, the memory cell array 110 is configured with a plurality of memory cells for storing one or more bits in each cell.

In an embodiment, the address decoder 120 is connected to the memory cell array 110 through the word lines WL, the string selection lines SSL, and the ground selection lines GSL. The address decoder 120 operates according to the control of the control logic 170. The address decoder 120 receives an address ADDR from the outside.

The address decoder 120 decodes the row address of the received address ADDR. The address decoder 120 selects a word line corresponding to the decoded row address from among the word lines WL. The address decoder 120 selects selection lines, corresponding to the decoded row address, from among selection lines which include the string selection lines SSL and the ground selection lines GSL.

The address decoder 120 transfers various voltages received from the voltage generating unit 160 to a selected word line, an unselected word line, a selected selection line and an unselected selection line.

In an embodiment, when the address decoder 120 is connected to the memory cell array 110 through dummy word lines (DWL), the address decoder selects a dummy word line corresponding to a decoded row address from the dummy word lines (DWL). The address decoder 120 transfers various voltages received from the voltage generating unit 160 to a selected dummy word line (DWL) and an unselected dummy word line (DWL).

The address decoder 120 decodes the column address of the received address ADDR. The address decoder 120 transfers a decoded column address (DCA) to the read and write circuit 130.

In an embodiment, the address decoder 120 may include a row decoder that decodes a row address, a column decoder that decodes a column address, and an address buffer that stores a received address ADDR.

The read and write circuit 130 can be connected to the memory cell array 110 through the bit lines BL and can be connected to the data input/output circuit 150 through data lines DL. The read and write circuit 130 operates according to the control of the control logic 170. The read and write circuit 130 receives the decoded column address (DCA) from the address decoder 120. The read and write circuit 130 selects the bit lines BL by using the decoded column address (DCA).

In an embodiment, the read and write circuit 130 receives data from the data input/output circuit 150 and writes the received data in the memory cell array 110. The read and write circuit 130 reads data from the memory cell array 110 and transfers the read data to the data input/output circuit 150. In an embodiment, the read and writing circuit 130 reads data from a first storage region of the memory cell array 110 and writes the read data in a second storage region of the memory cell array 110. For example, the read and write circuit 130 performs a copy-back operation.

In an embodiment, the read and write circuit 130 includes elements such as a page buffer (or a page register) and a column selection circuit. In an embodiment, the read and write circuit 130 includes a sensing amplifier, a writing driver, and a column selection circuit.

The pass/fail check unit 140 is connected to the read and write circuit 130 and the control logic 170. In an erasure verification operation, the pass/fail check unit 140 receives data sensed by the read and write circuit 130. Based on the received data, the pass/fail check unit 140 determines erasure pass or erasure fail. The pass/fail check unit 140 transmits a pass signal Pass or a fail signal Fail to the control logic 170.

In an embodiment, the data input/output circuit 150 is connected to the read and write circuit 130 through the data lines DL. The data input/output circuit 150 operates according to the control of the control logic 170. The data input/output circuit 150 exchanges data DATA with the outside. The data input/output circuit 150 transfers the data DATA received from the outside to the read and write circuit 130 through the data lines DL. The data input/output circuit 150 outputs the data DATA, which is transferred through the data lines DL from the read and write circuit 130, to the outside. In an embodiment, the data input/output circuit 150 includes a data buffer.

In an embodiment, the voltage generating unit 160 is connected to the memory cell array 110, the address decoder 120, and the control logic 170. The voltage generating unit 160 receives a power source from the outside. For example, the voltage generating unit 160 receives a power source voltage Vcc and a ground voltage Vss from the outside. The voltage generating unit 160 receives the power source voltage Vcc and the ground voltage Vss to generate voltages having various levels according to the control of the control logic 170. For example, the voltage generating unit 160 generates various voltages such as a high voltage Vpp, a program voltage Vpgm, a pass voltage Vpass, a read voltage Vread and an erasure voltage Vers.

The voltages generated by the voltage generating unit 160 are supplied to the address decoder 120 and the memory cell array 110 according to the control of the control logic 170. For example, the program voltage Vpgm and the pass voltage Vpass are supplied to the address decoder 120 in a programming operation. In a reading operation, the read voltage Vread is supplied to the address decoder 120. In the erasure operation of the memory cell array 110, the erasure voltage Vers is supplied to the memory cell array 110.

The voltages generated by the voltage generating unit 160 have been described above. However, the above-described voltages are exemplary voltages that are generated by the voltage generating unit 160. The voltages generated by the voltage generating unit 160 are not limited to the above-described voltages.

In an embodiment, the control logic 170 is connected to the address decoder 120, the read and write circuit 130, the pass/fail check unit 140 and the data input/output circuit 150. The control logic 170 controls the overall operation of the nonvolatile memory device 100. The control logic 170 operates in response to a control signal CTRL transferred from the outside.

In an embodiment, the control logic 170 includes an erase control unit 171, a string selection line counter 173 (hereinafter referred to as an SSL counter), and an erasure counter 175. The erase control unit 171 controls the erasing operation of the nonvolatile memory device 100. For example, the erasing operation of the nonvolatile memory device 100 includes an erasure operation and an erasure verification operation. The erasure and erasure verification operations can be performed in the selected memory block of the memory cell array 110 according to the control of the erase control unit 171.

The erase control unit 171 controls the address decoder 120, the read and write circuit 130, and the voltage generating unit 160 to erase the selected memory block of the memory cell array 110. The erase control unit 171 controls the address decoder 120, the read and write circuit 130, and the voltage generating unit 160 to erasure-verify the selected memory block of the memory cell array 110. For example, the erase control unit 171 controls the erasure on the basis of the information that is stored in the erase counter 175. For example, the erase control unit 171 controls the erasure verification on the basis of the information that is stored in the SSL counter 173.

The erase control unit 171 recognizes the erasure pass or erasure fail based on the output of the pass/fail check unit 140. The erase control unit 171 controls successive erasure or erasure verification according to erasure pass or erasure fail.

In an embodiment, the SSL counter 173 has count values corresponding to the addresses of a string selection line SSL. For example, the count values of the SSL counter 173 correspond to the addresses of the first to third string selection lines SSL1 to SSL3 of a memory block BLKa. A string selection line SSL corresponding to the count value of the SSL counter 173 varies according to whether the SSL counter 173 is counted up or down.

Hereinafter, the count value of the SSL counter 173 is referred to as string selection line count (SSL count). For example, the SSL count corresponds to one of the first to third string selection lines SSL1 to SSL3 of a memory block BLKa. A string selection line SSL corresponding to the SSL count among the first to third string selection lines SSL1 to SSL3 varies as SSL count is counted.

The count value (hereinafter referred to as erasure count) of the erase counter 175 corresponds to the number of times a specific memory block of the memory cell array 110 is erased in an erasing operation. For example, the erasure count corresponds to the number of times the erasure voltage Vers is applied to a specific memory block in an erasing operation. For example, the erasure count corresponds to the number of times an erasure voltage (or an erasure pulse) is applied to a specific memory block in Incremental Step Pulse Erase (ISPE).

Figure 2:
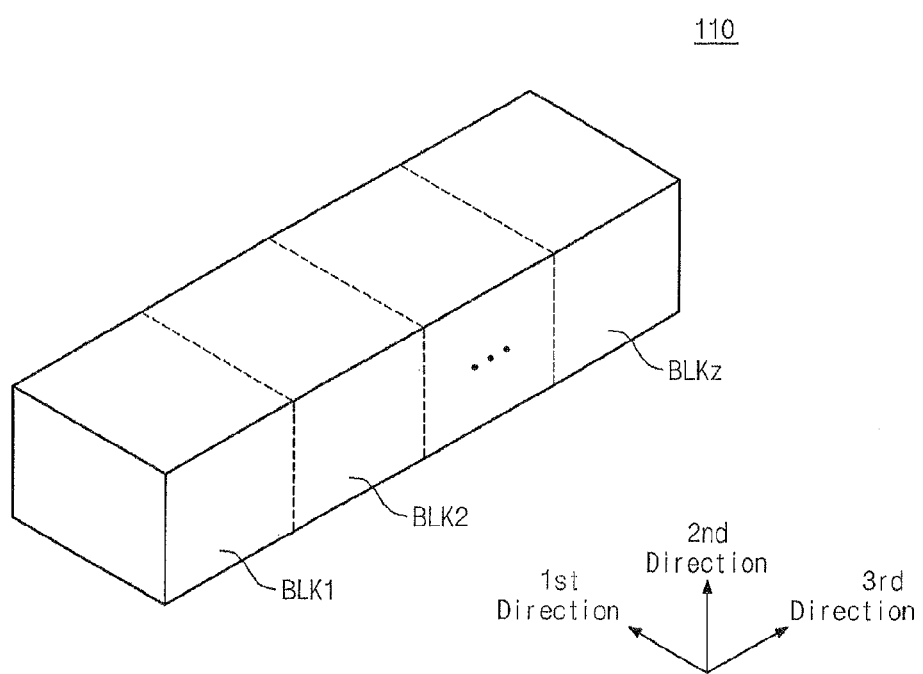
FIG. 2 is a block diagram illustrating a memory cell array according to an embodiment of the inventive concept.

FIG. 2 is a block diagram illustrating the memory cell array 110 of FIG. 1 according to an embodiment of the inventive concept.

Referring to FIG. 2, the memory cell array 110 includes a plurality of memory blocks BLK1 to BLKz. Each memory block BLK has a 3D structure (or a vertical structure). For example, each memory block BLK includes structures extended in first, second and third directions. For example, each memory block BLK includes a plurality of NAND strings NS extended in the second direction. For example, the plurality of NAND strings NS are provided to be spaced a specific distance apart in the first to third directions.

Each NAND string NS is connected to a bit line BL, a string selection line SSL, a plurality of word lines WL, a ground selection line GSL and a common source line CSL according to an embodiment. Each memory block is connected to a plurality of bit lines BL, a plurality of string selection lines SSL, a plurality of word lines WL, a ground selection line GSL and a common source line CSL.

In an embodiment, the memory blocks BLK1 to BLKz are selected by the address decoder 120 of FIG. 1. For example, the address decoder 120 selects a memory block BLK corresponding to a block address from the memory blocks BLK1 to BLKz.

Figure 3:
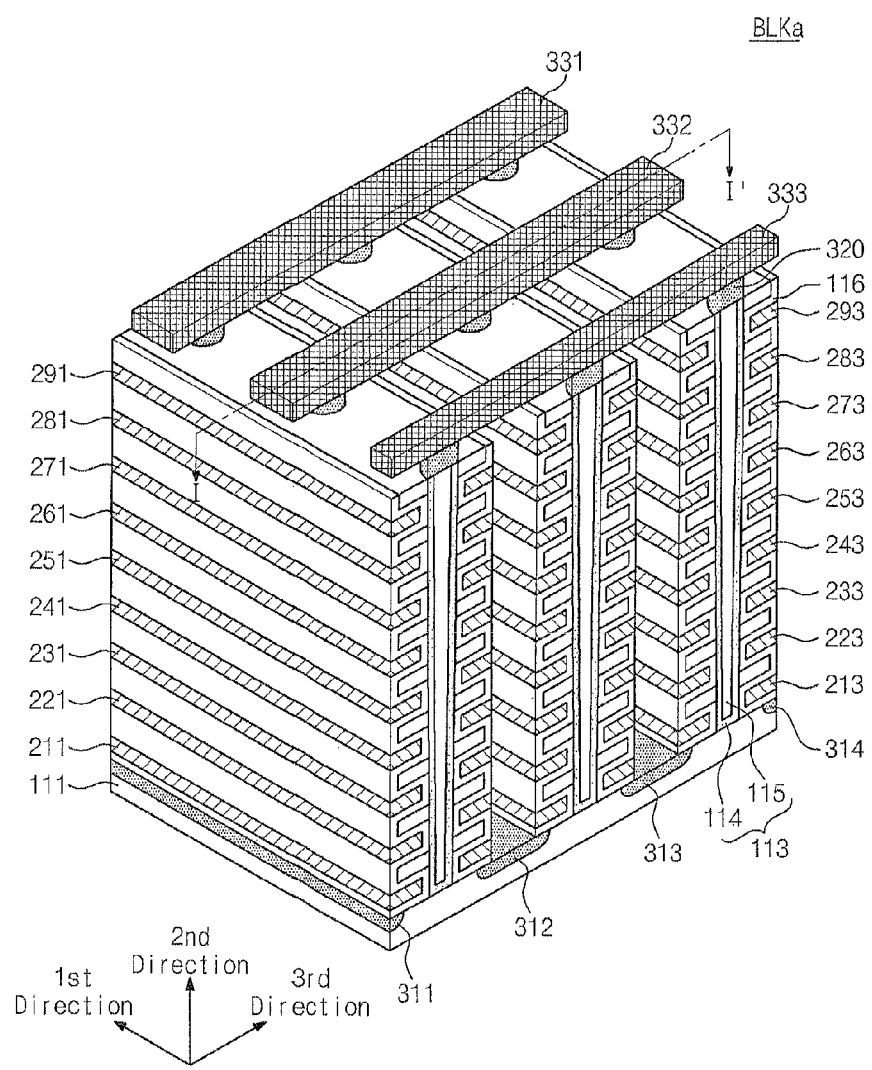
FIG. 3 is a perspective view illustrating a memory block according to an embodiment of the inventive concept.
Figure 4:
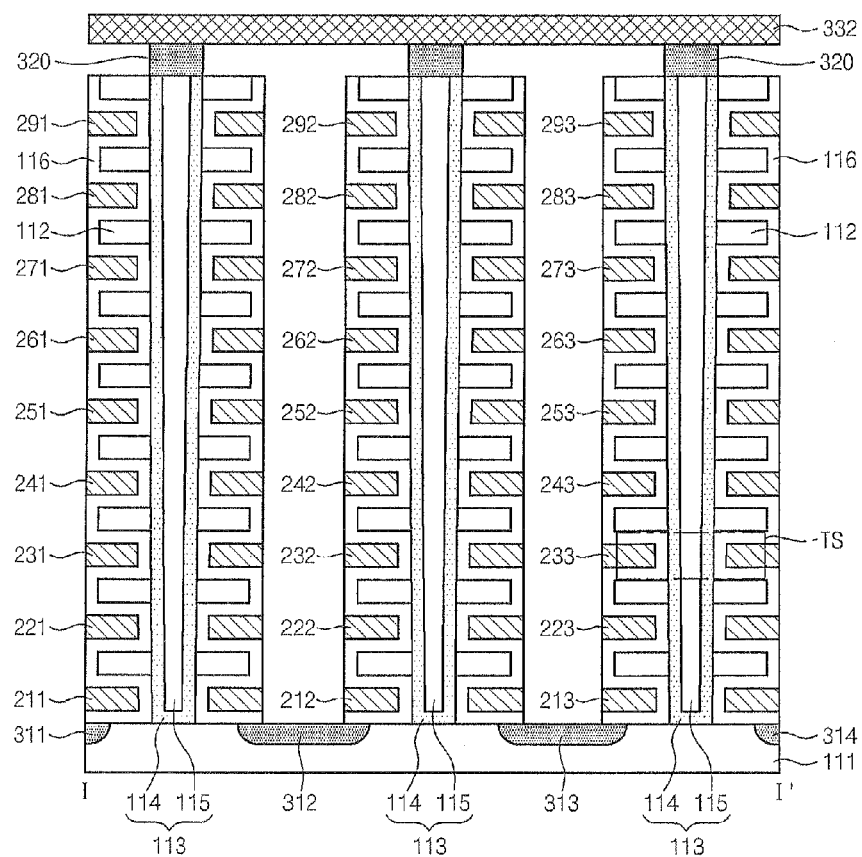
FIG. 4 is a cross-sectional view taken along the line I-I' of FIG. 2 according to an embodiment of the inventive concept.

FIG. 3 is a perspective view illustrating a memory block BLKa of the memory blocks BLK1 to BLKz of FIG. 2, according to an embodiment of the inventive concept. FIG. 4 is a cross-sectional view taken along line the I-I' of the memory block BLKa of FIG. 2.

Referring to FIGS. 3 and 4, a memory block BLKa includes structures extended in the first, second and third directions.

A substrate 111 is provided. In an embodiment, the substrate 111 is a well having a first type (for example, a first conductive type). In an embodiment, the substrate 111 is a p-well that is formed by injecting a group-3 element such as boron (B). In an embodiment, the substrate 111 is a p-well that is provided into an n-well. Hereinafter, embodiments are explained using the substrate 111 having a p-type well (or a p-type pocket well). However, the conductive type of the substrate 111 is not limited to a p-type.

A plurality of doping regions 311, 312, 313 and 314 extended in the first direction is provided onto the substrate 111. For example, the doping regions 311 to 314 may have a second type (for example, a second conductive type) different from the type of the substrate 111. For example, first to fourth doping regions 311 to 314 have an n type. Hereinafter, it is assumed that the doping regions 311 to 314 have an n type. However, the conductive types of the first to fourth doping regions 311 to 314 are not limited to an n type.

A plurality of insulating materials 112 extended in the first direction are sequentially provided in the second direction, on a region of the substrate 111 between the first and second doping regions 311 and 312. For example, the insulating materials 112 are provided to be spaced apart with a specific distance in the second direction. In an embodiment, the insulating materials 112 comprise an insulating material such as silicon oxide.

A plurality of pillars 113, which are sequentially disposed in the first direction and pass through the insulating materials 112 in the second direction, are provided on a region of the substrate 111 between the first and second doping regions 311 and 312. In an embodiment, the pillars 113 contact the substrate 111 through the insulating materials 112.

In an embodiment, each pillar 113 may be formed of a plurality of materials. For example, the surface layer 114 of the each pillar 113 may include a silicon material having the first type. For example, the surface layer 114 of the each pillar 113 may include a silicon material having the same type as that of the substrate 111. Hereinafter, it is assumed that the surface layer 114 of the each pillar 113 includes p-type silicon. However, the surface layer 114 of the each pillar 113 is not limited to that it includes p-type silicon.

An inner layer 115 of the each pillar 113 is formed of an insulating material. For example, the inner layer 115 of the each pillar 113 includes an insulating material such as silicon oxide. For example, the inner layer 115 of the each pillar 113 includes an air gap.

In a region between the first and second doping regions 311 and 312, an insulation layer 116 is provided along the insulating materials 112, the pillars 113 and the exposed surface of the substrate 111. In an embodiment, the insulation layer 116 is not formed on the insulating material 112 positioned on the very top among the insulating materials 112 in the second direction.

In an embodiment, the thickness of the insulation layer 116 may be less than a distance between the insulating materials 112. That is, a region where a material other than the insulating materials 112 and the insulation layer 116 may be disposed is provided between an insulation layer 116 provided to the lower surface of a first insulating material of the insulating materials 112 and an insulation layer 116 that is provided to the upper surface of a second insulating material under the first insulating material.

In a region between the first and second doping regions 311 and 312, first conductive materials 211 to 291 are provided onto the exposed surface of the insulation layer 116. For example, the first conductive material 211 extended in the first direction is provided between the substrate 111 and the insulating material 112 adjacent to the substrate 111. In an embodiment, the first conductive material 211 is provided between the substrate 111 and the insulation layer 116 of the lower surface of the insulating material 112 adjacent to the substrate 111.

A first conductive material extended in the first direction is provided between an insulation layer 116 of the upper surface of a specific insulating material among the insulating materials 112 and an insulation layer 116 of the lower surface of an insulating material disposed in the upper portion of a specific insulating material. In other words, a plurality of first conductive materials 221 to 281 extended in the first direction are provided between the insulating materials 112, in which case it can be understood that the insulation layer 116 is provided between the insulating materials 112 and the first conductive materials 221 to 281. In an embodiment, first conductive materials 211 to 291 may include a metal material. In an embodiment, the first conductive materials 211 to 291 may include a conductive material such as poly silicon.

In a region between the second and third doping regions 312 and 313, the same structure as a structure on the first and second doping regions 311 and 312 are provided. In a region between the second and third doping regions 312 and 313, provided are the insulating materials 112 extended in the first direction, the pillars 113 that are sequentially disposed in the first direction and pass through the insulating materials 112 in the third direction, the insulation layer 116 provided to the exposed surfaces of the pillars 113 and insulating materials 112, and first conductive materials 212 to 292 extended in the first direction according to an embodiment of the inventive concept.

In a region between the third and fourth doping regions 313 and 314, the same structure as a structure on the first and second doping regions 311 and 312 are provided. In a region between the third and, fourth doping regions 313 and 314, provided are the insulating materials 112 extended in the first direction, the pillars 113 that are sequentially disposed in the first direction and pass through the insulating materials 112 in the third direction, the insulation layer 116 provided to the exposed surfaces of the pillars 113 and insulating materials 112, and first conductive materials 213 to 293 extended in the first direction according to an embodiment of the inventive concept.

Drains 320 are provided onto the pillars 113. In an embodiment, the drains 320 may include silicon materials doped in the second type. For example, the drains 320 may include silicon materials doped in an n type. However, the drains 320 are not limited to that they include the n-type silicon materials.

In an embodiment, the width of the each drain 320 may be greater than that of a corresponding pillar 113. For example, the each drain 320 may be provided in a pad shape to the upper portion of a corresponding pillar 113. As an example, the each drain 320 is extended to a portion of the surface layer 114 of a corresponding pillar 113.

On the drains 320, second conductive materials 331 to 333 extended in the third direction are provided. The second conductive materials 331 to 333 are disposed to be spaced a certain distance apart in the first direction. The respective second conductive materials 331 to 333 are connected to the drains 320 of a corresponding region. In an embodiment, the drains 320 and the second conductive material 333 extended in the third direction may be connected through a contact plug, respectively. In an embodiment, the second conductive materials 331 to 333 may include metal materials. In an embodiment, the second conductive materials 331 to 333 may include conductive materials such as poly silicon.

The first conductive materials 211 to 291, 212 to 292 and 213 to 293 have first to ninth heights sequentially from the substrate 111. That is, the first conductive materials 211 to 213 adjacent to the substrate 111 have the first height. The first conductive materials 291 to 293 adjacent to the second conductive materials 331 to 333 have the ninth height. As an order from the substrate 111 of a specific conductive material of the first conductive materials 211 to 291, 212 to 292 and 213 to 293 increases, the height of the first conductive material increases.

In FIGS. 3 and 4, the each pillar 113 forms a string together with the insulation layer 116 and the first conductive materials 211 to 291, 212 to 292 and 213 to 293. For example, the each pillar 113 forms a NAND string NS together with a region adjacent to the insulation layer 116 and an adjacent region among the first conductive materials 211 to 291, 212 to 292 and 213 to 293. The NAND string NS includes a plurality of transistor structures TS. The transistor structures TS are described below in more detail with reference to FIG. 5.

Figure 5:
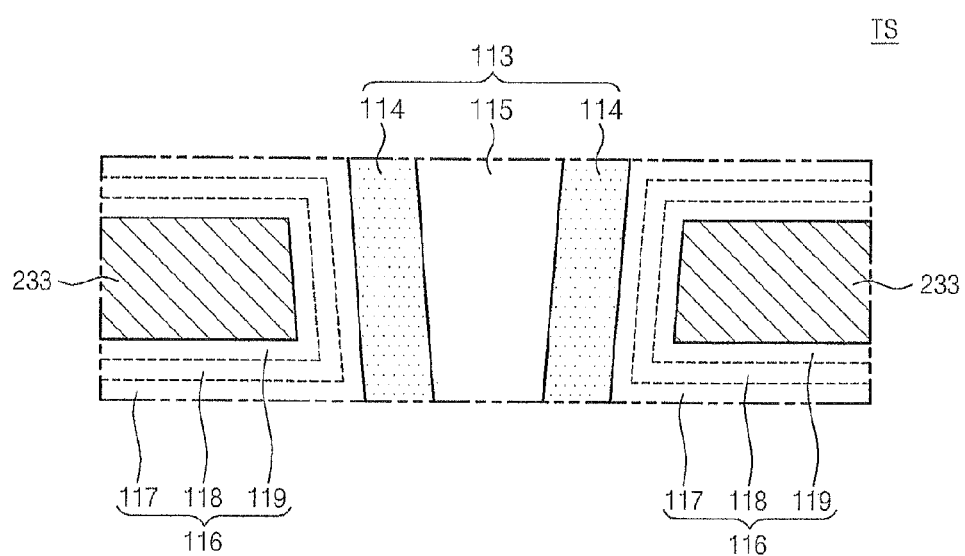
FIG. 5 is a cross-sectional view illustrating a transistor structure of FIG. 4.

FIG. 5 is a cross-sectional view illustrating the transistor structure TS of FIG. 4.

Referring to FIGS. 3 to 5, the insulation layer 116 includes first to third sub-insulation layers 117 to 119.

The surface layer 114 including the p-type silicon of the pillar 113 serves as a body. Hereinafter, the surface layer 114 including the p-type silicon of the pillar 113 is defined as serving as a second-direction body.

The first sub-insulation layer 117 adjacent to the pillar 113 serves as a tunneling insulation layer. For example, the first sub-insulation layer 117 adjacent to the pillar 113 may include a thermal oxide layer.

The second sub-insulation layer 118 serves as a charge storage layer. For example, the second sub-insulation layer 118 serves as a charge trapping layer. For example, the second sub-insulation layer 118 may include a nitride layer or metal oxide layer (for example, an aluminum oxide layer or a hafnium oxide layer).

The third sub-insulation layer 119 adjacent to the first conductive material 233 serves as a blocking insulation layer. In an embodiment, the third sub-insulation layer 119 adjacent to the conductive material 233 extended in the first direction may be formed as a single layer or a multi-layer. The third sub-insulation layer 119 may be a high dielectric layer (for example, an aluminum oxide layer or a hafnium oxide layer) having a higher dielectric constant than the first and second sub-insulation layers 117 and 118.

The first conductive material 233 serves as a gate (or a control gate). That is, the first conductive material 233 serving as the gate (or the control gate), the third sub-insulation layer 119 serving as a blocking insulation layer, the second sub-insulation layer 118 serving as a charge storage layer, the first sub-insulation layer 117 serving as a tunneling insulation layer, and the surface layer 114 serving as a body and including p-type silicon serve as a transistor (or a memory cell transistor structure). For example, the first conductive material 233, the third sub-insulation layer 119, the second sub-insulation layer 118, the first sub-insulation layer 117 and the surface layer 114 serve as a transistor (or a memory cell transistor structure).

In an embodiment, the first to third sub-insulation layers 117 to 119 may form oxide-nitride-oxide (ONO).

In the memory block BLKa, one pillar 113 corresponds to one NAND string NS. For example, one pillar 113 forms one NAND string NS together with an adjacent insulation layer 116 and adjacent first conductive materials.

The memory block BLKa includes the plurality of pillars 113. That is, the memory block BLKa includes a plurality of NAND strings NS. In an embodiment, the memory block BLKa includes a plurality of NAND strings NS that are extended in the second direction (or the direction vertical to the substrate) and provided to be spaced a certain distance apart in the first and third directions.

The each NAND string NS includes a plurality of transistor structures TS that are stacked in the second direction. The transistor structures TS of the each NAND string NS serve as a memory cell MC or a selection transistor. In each NAND string NS, at least one transistor structure TS may serve as a dummy memory cell DMC in an embodiment.

For example, in each NAND string, at least one transistor structure TS between transistor structures TS serving as a memory cell MC and the substrate 111 serves as a ground selection transistor GST. In each NAND string NS, at least one transistor structure TS between transistor structures TS serving as a memory cell MC and the second conductive materials 331 to 333 serves as a string selection transistor SST.

That is, the memory block BLKa is provided along a row (for example, the first direction) and a column (for example, the second direction) on the substrate 111, and includes a plurality of memory cells MC that are stacked in the direction (for example, the third direction) crossing with (i.e., vertical to) the substrate 111. At least one transistor is provided between the memory cells MC and the substrate 111 and to the upper portion of the memory cells MC, respectively.

Gates (or control gates) correspond to the first conductive materials 211 to 291, 212 to 292 and 213 to 293 that are extended in the first direction. That is, the gates (or the control gates) are extended in the first direction and forms word lines WL and at least two selection lines SL (for example, at least one string selection line SSL and at least one ground selection line GSL). In an embodiment, gates provided to a certain height may form a dummy word line DWL.

The second conductive materials 331 to 333 extended in the third direction are connected to the one end of the each NAND string NS. In an embodiment, the second conductive materials 331 to 333 extended in the third direction serve as bit lines BL. That is, in one memory block BLKa, a plurality of NAND strings are connected to one bit line BL.

The second type doping regions 311 to 314 extended in the first direction are provided to the other end of each NAND string. The second type doping regions 311 to 314 extended in the first direction serve as the common source lines CSL.

As such, the memory block BLKa includes a plurality of NAND strings that are extended in the direction (i.e., the second direction) crossing with the substrate 111, and servers as a NAND flash memory block (for example, a charge trapping type) where the plurality of NAND strings NS are connected to one bit line BL.

In FIGS. 3 to 5, it has been described above that the first conductive materials 211 to 291, 212 to 292 and 213 to 293 are provided to nine layers. However, the first conductive materials 211 to 291, 212 to 292 and 213 to 293 are not limited thereto. For example, the first conductive materials may be provided to at least eight layers forming memory cells and at least two layers forming selection transistors. The first conductive materials may be provided to at least sixteen layers forming memory cells and at least two layers forming selection transistors. Also, the first conductive materials may be provided to a plurality of layers forming memory cells and at least two layers forming selection transistors. For example, the first conductive materials may be provided to a layer forming dummy memory cells.

In FIGS. 3 to 5, it has been described above that three NAND strings NS are connected to one bit line BL, but embodiments of the inventive concept are not limited thereto. In an embodiment, in the memory block BLKa, an m number of NAND strings NS may be connected to one bit line BL. In this case, the number of first conductive materials 211 to 291, 212 to 292 and 213 to 293 extended in the first direction and the number of doping regions 311 to 314 serving as the common source line CSL may also be controlled in proportion to the number of NAND strings NS connected to one bit line BL.

In FIGS. 3 to 5, it has been described above that three NAND strings NS are connected to one first conductive material extended in the first direction, but an embodiment of the inventive concept is not limited thereto. For example, an n number of NAND strings NS may be connected to one first conductive material. In this case, the number of bit lines 331 to 333 may be controlled in proportion to the number of NAND strings NS that are connected to one first conductive material.

As illustrated in FIGS. 3 to 5, the closer to the substrate 111, a cross-sectional area base on the first and third directions of the pillar 113 may decrease. For example, the cross-sectional area base on the first and third directions of the pillar 113 may be varied by the characteristic or error of a process.

In an embodiment, the pillar 113 is formed by providing materials such as a silicon material and an insulating material to a hole that is formed by etching. As an etched depth increases, a cross-sectional area based on the first and third directions of a hole formed by etching may decrease. That is, the closer to the substrate 111, the cross-sectional area based on the first and third directions of the pillar 113 may decrease.

Figure 6:
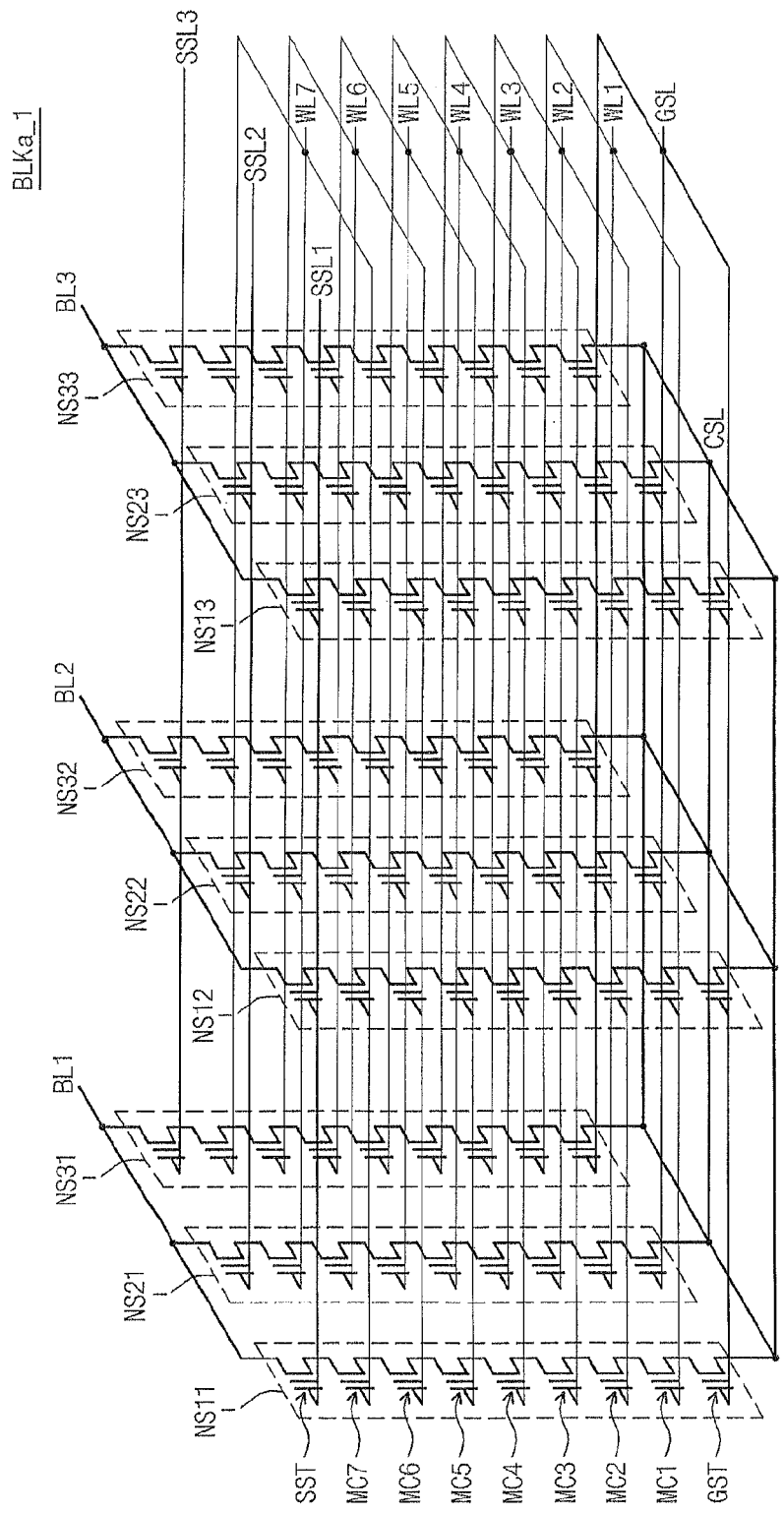
FIG. 6 is a circuit diagram illustrating a memory block according to an embodiment of the inventive concept.

FIG. 6 is a circuit diagram illustrating an equivalent circuit BLKa_1 of the memory block BLKa according to an embodiment of the inventive concept.

Referring to FIGS. 3 to 6, NAND strings NS11 to NS31 are provided between a first bit line BL1 and a common source line CSL. NAND strings NS12, NS22 and NS32 are provided between a second bit line BL2 and the common source line CSL. NAND strings NS13, NS23 and NS33 are provided between a third bit line BL3 and the common source line CSL. The first to third bit lines BL1 to BL3 correspond to the second conductive materials 331 to 333 that are extended in the third direction.

The string selection transistor SST of the each NAND string NS is connected to a corresponding bit line BL. The ground selection transistor GST of the each NAND string NS is connected to the common source line CSL. Memory cells MC are provided between the string selection transistor SST and common source line CSL of the each NAND string NS.

The NAND strings NS, which are connected to one bit line in common, form one column. For example, the NAND strings NS11 to NS31 connected to the first bit line BL1 may correspond to a first column. The NAND strings NS12 to NS32 connected to the second bit line BL2 may correspond to a second column. The NAND strings NS13 to NS33 connected to the third bit line BL3 may correspond to a third column. The NAND strings connected to one string selection line SSL form one row. For example, the NAND strings NS11 to NS13 connected to a first string selection line SSL1 may form a first row. The NAND strings NS21 to NS23 connected to a second string selection line SSL2 may form a second row.

The NAND strings NS31 to NS33 connected to a third string selection line SSL3 may form a third row.

In each NAND string NS, the height of the ground selection transistor GST is defined as 1. The height of a memory cell MC1 adjacent to the ground selection transistor GST is defined as 2. The height of the string selection transistor SST is defined as 9. The height of a memory cell MC7 adjacent to the string selection transistor SST is defined as 8. As a distance between the memory cell MC and the ground selection transistor GST increases, the height of the memory cell MC increases. That is, the first to seventh memory cells MC1 to MC7 are defined as having second to eighth heights, respectively.

The NAND strings NS of the same row share the ground selection line GSL. The NAND strings NS of different rows share the ground selection line GSL. The first conductive lines 211 to 213 having a first height are connected and thereby forms the ground selection line GSL. The memory cells MC having the same height in the NAND strings NS of the same row shares a word line WL. The word lines WL of NAND strings NS that have the same height and correspond to different rows are connected in common. That is, memory cells having the same height share the word line WL.

The first conductive lines 221 to 223 having a second height are connected in common and thereby form a first word line WL1. The first conductive materials 231 to 233 having a third height are connected in common and thereby form a second word line WL2. The first conductive materials 241 to 243 having a fourth height are connected in common and thereby form a third word line WL3. The first conductive materials 251 to 253 having a fifth height are connected in common and thereby form a fourth word line WL4. The first conductive lines 261 to 263 having a sixth height are connected in common and thereby form a fifth word line WL5. The first conductive materials 271 to 273 having a seventh height are connected in common and thereby form a sixth word line WL6. The first conductive materials 281 to 283 having an eighth height are connected in common and thereby form a seventh word line WL7.

The NAND strings NS of the same row share the string selection line SSL. The NAND strings NS of different rows are connected to string selection lines SSL1 to SSL3, respectively. The first to third string selection lines SSL1 to SSL3 correspond to the first conductive lines 291 to 293 having a ninth height, respectively.

Hereinafter, string selection transistors SST connected to the first string selection line SSL1 are defined as first string selection transistors SST1. String selection transistors SST connected to the second string selection line SSL2 are defined as second string selection transistors SST2. String selection transistors SST connected to the third string selection line SSL3 are defined as third string selection transistors SST3.

The common source line CSL is connected to the NAND strings NS in common. For example, the first to fourth doping regions 311 to 314 may be connected and thereby form the common source line CSL.

As illustrated in FIG. 6, the word lines WL having the same depth are connected in common. Accordingly, when a specific word line WL is selected, all NAND strings NS connected to the specific word line WL are selected.

The NAND strings NS of different rows are connected to different string selection lines SSL. Therefore, by selecting and unselecting the string selection lines SSL1 to SSL3, the NAND strings NS of an unselected row among NAND strings NS connected to the same word line WL may be electrically disconnected from a corresponding bit line, and the NAND strings of an unselected row may be electrically connected a corresponding bit line.

That is, by selecting and unselecting the string selection lines SSL1 to SSL3, the row of the NAND strings NS may be selected. Furthermore, by selecting the bit lines BL1 to BL3, the NAND strings NS of a selected row may be selected in column units.

In an embodiment, one of the string selection lines SSL1 and SSL2 may be selected in a programming and reading operation. That is, the programming and reading operation is performed in the row units of the NAND strings NS11 to NS13, NS21 to NS23 and NS31 to NS33.

In an embodiment, in a programming and reading operation, a selection voltage may be applied to the selected word line of a selected row and a non-selection voltage may be applied to unselected word lines. For example, a selection voltage may be a program voltage Vpgm or a selection read voltage Vr. As an example, a non-selection voltage may be a pass voltage Vpass or a non-selection read voltage Vread.

That is, the programming and reading operation may be performed in word line units of the selected row of the NAND strings NS11 to NS13, NS21 to NS23 and NS31 to NS33.

In an embodiment, the thicknesses of the insulating materials 112, which are provided between first conductive materials (for example, 211, 221, 231, 291, 292 and 293) serving as selection lines and first conductive materials (for example, 221 to 281, 222 to 282 and 223 to 283) serving as word lines among the first conductive materials 211 to 291, 212 to 292 and 213 to 293, may be greater than the thicknesses of other insulating materials 112.

In FIGS. 3 to 6, the first conductive materials 211 to 213 having the first height serve as the ground selection line GSL, and the first conductive materials 291 to 293 having the ninth height serve as string selection lines SSL1 to SSL3.

Herein, the thicknesses of insulating materials 112, which are provided between the first conductive materials 211 to 213 having the first height and the second conductive materials 221 to 223 having the second height, may be greater than the thicknesses of insulating materials 112 which are provided between the first conductive materials 221 to 223 having the second height and the first conductive materials 281 to 283 having the eighth height.

In an embodiment, the thicknesses of insulating materials 112, which are provided between the first conductive materials 281 to 283 having the eighth height and the first conductive materials 291 to 293 having the ninth height, may be greater than the thicknesses of insulating materials 112 which are provided between the second conductive materials 221 to 223 having the second height and the first conductive materials 281 to 283 having the eighth height.

Figure 7:
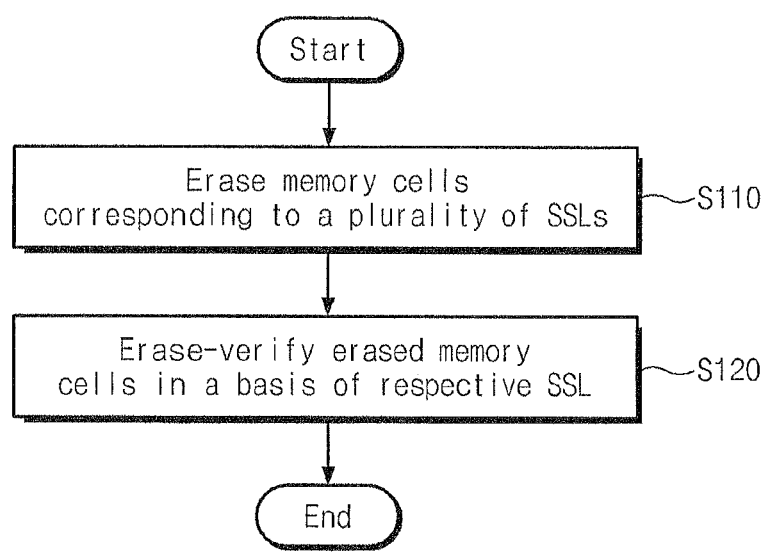
FIG. 7 is a flowchart illustrating an operating method of a nonvolatile memory device according to an embodiment of the inventive concept.

FIG. 7 is a flowchart illustrating an operating method of the nonvolatile memory device 100 according to an embodiment of the inventive concept. For example, the flow of the erasing operation of the nonvolatile memory device 100 is illustrated. Referring to FIGS. 1, 6 and 7, memory cells corresponding to a plurality of string selection lines SSL1 to SSL3 are erased in operation S110. Three string selection lines (SSL1 to SSL3) are described here for the convenience of explanation. However, more than three SSLs (e.g., SSL1 to SSLn, wherein n is an integer) can be used according to embodiments of the inventive concept. Operation S110 illustrates the block erasure of the nonvolatile memory device 100. That is, as illustrated in FIG. 6, when one memory block BLKa includes the first to third string selection lines SSL1 to SSL3, memory cells MC1 to MC7 corresponding to the first to third string selection lines SSL1 to SSL3 are erased.

Memory cells erased by string selection line SSL units are erasure-verified. For example, memory cells corresponding to the first string selection line SSL1, memory cells corresponding to the second string selection line SSL2 and memory cells corresponding to the third string selection line SSL3 are erasure-verified one by one. In an embodiment, memory cells associated with the first string selection line SSL1 are erasure-verified. Then, memory cells associated with the second string selection line SSL2 are erasure-verified. Then, memory cells associated with the third string selection line SSL3 are erasure-verified.

Figure 8:
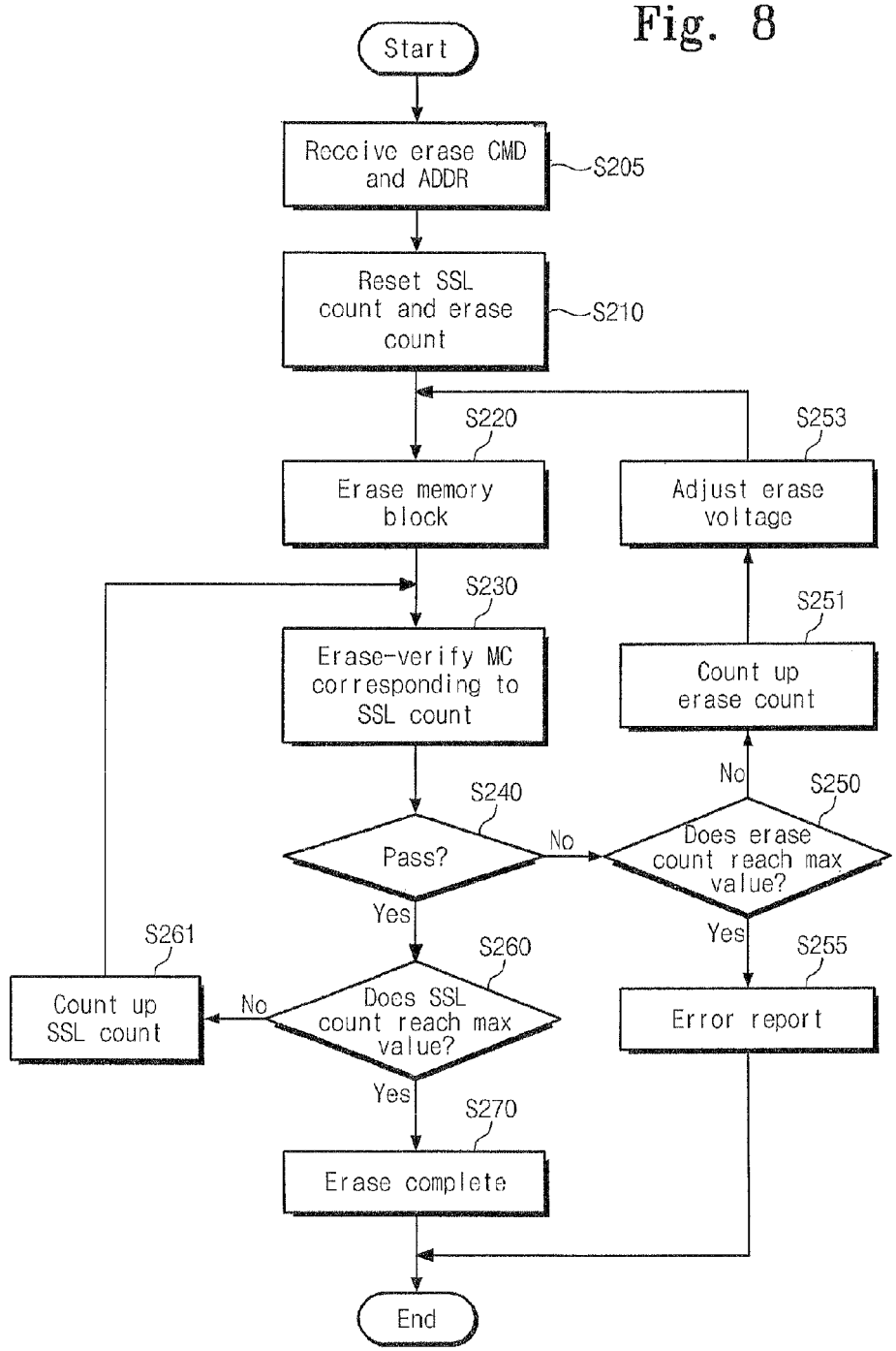
FIG. 8 is a flowchart illustrating an operating method of a nonvolatile memory device according to an embodiment of the inventive concept.

FIG. 8 is a flowchart illustrating an operating method of the nonvolatile memory device 100 of FIG. 1 according to an embodiment. FIG. 8 shows the flow of the erasing operation of the nonvolatile memory device 100. Referring to FIGS. 1, 6 and 8, an erasure command and an address are received in operation S205. For example, the received address corresponds to at least two string selection lines SSL.

The SSL count and the erasure count are reset in operation S210. For example, the erasure control unit 171 resets SSL count by resetting the SSL counter 173. For example, the erasure control unit 171 resets erasure count by resetting the erasure counter 175.

For example, the reset SSL count corresponds to the first string selection line (for example, SSL1) of a memory block (for example, BLKa) corresponding to the received address. For example, the reset erasure count may have a logical value of 1.

Memory cells MC corresponding to the received address are erased in operation S220. For example, the memory block BLKa is erased. For example, the memory cells MC1 to MC7 corresponding to the string selection lines SSL1 to SSL3 of the memory block BLKa are erased.

Memory cells MC corresponding to the SSL count are erasure-verified in operation S230. In an embodiment, when the SSL count indicates the first string selection line SSL1, the memory cells MC1 to MC7 of the NAND strings NS11 to NS13 of a first row corresponding to the first string selection line SSL1 are erasure-verified. When the SSL count indicates a $k^{th}$ string selection line SSLk, the memory cells MC1 to MC7 of the NAND strings NSk1 to NSk3 of a $k^{th}$ row corresponding to the first string selection line SSLk are erasure-verified.

Whether the erasure-verified result is the erasure pass is determined in operation S240. For example, the erasure pass or erasure fail is determined by the pass/fail check unit 140. When the erasure-verified result is determined as erasure fail, operation S250 is performed.

Whether erasure count reaches the maximum value is determined in operation S250. In an embodiment, the maximum value of the erasure count corresponds to the maximum number of times an erasure pulse is applied in the ISPE. When the erasure pulse does not reach the maximum value, the erasure count is counted up in operation S251. An erasure voltage Vers is adjusted in operation S253. For example, the level of the erasure voltage Vers increases. Subsequently, erasure and erasure verification are again performed in operations S220 to S240.

When the erasure count reaches the maximum value in operation S250, an error report is performed in operation S255. An error message is transferred to a host of the nonvolatile memory device 100. In an embodiment, when the error message is transferred, a memory block BLKa is processed as a bad block.

When the erasure-verified result is determined as erasure pass in operation S240, operation S260 is performed. Whether the SSL count reaches the maximum value is determined in operation S260. The maximum value of the SSL count corresponds to the final string selection line address of the memory block BLKa.

When the SSL count does not reach the maximum value, i.e., erasure verification is not performed for all SSL counts, the SSL count is counted up in operation S261. Subsequently, memory cells corresponding to the counted-up SSL count are erasure-verified in operations S230 and S240.

When the SSL count reaches the maximum value, i.e., erasure verification is performed for all the SSL counts, an erasing operation is completed in operation S270.

That is, the memory block BLKa is erased, and thereafter erased memory cells MC1 to MC7 are erasure-verified by string selection line SSL units according to an embodiment of the inventive concept. The erasure of the memory block BLKa and the erasure verification of memory cells corresponding to a selected string selection line SSL are repeated until the memory cells corresponding to the selected string selection line SSL are erasure-passed. At this point, when the number of erasure times reaches the maximum value, erasure is ended and the memory block BLKa is processed as an error.

When the memory cells corresponding to the selected string selection line SSL are erasure-passed, a next string selection line SSL is selected. Subsequently, memory cells corresponding to a newly-selected string selection line SSL are erasure-verified.

The erasure of a memory block BLKa unit and the erasure verification of a string selection line SSL unit are repeated until the memory cells MC1 to MC7 of the memory block BLKa are erasure-passed or the erasure of the memory block BLKa is processed as an error.

In an embodiment, the reference of erasure pass and erasure fail may vary with electronic devices that are used together with the nonvolatile memory device 100. For example, when a device having an n-bit error correction function is used together with the nonvolatile memory device 100, fail bits less than (or equal to) n bits generated in erasure verification may be ignored. That is, even when fail bits less than (or equal to) n bits are detected in erasure verification, erasure pass is determined.

Figures 9, 10:
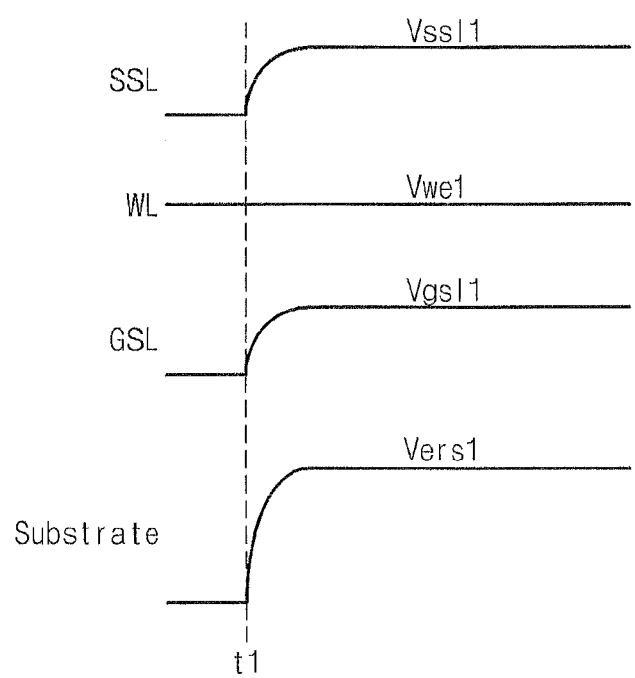
FIG. 9 is a table showing voltage conditions which are applied to a memory block in an erasing operation.
FIG. 10 is a timing diagram showing the voltage shift of a memory block based on the voltage conditions of FIG. 9.

FIG. 9 is a table showing voltage conditions which are applied to the memory block BLKa_1 of FIG. 6 in an erasing operation.

Referring to FIGS. 3, 6 and 9, the string selection lines SSL1 to SSL3 are floated. A first word line erasure voltage Vwe1 is applied to word lines WL1 to WL7.

The ground selection line GSL is floated. A first erasure voltage Vers1 is applied to the substrate 111.

Figure 11:
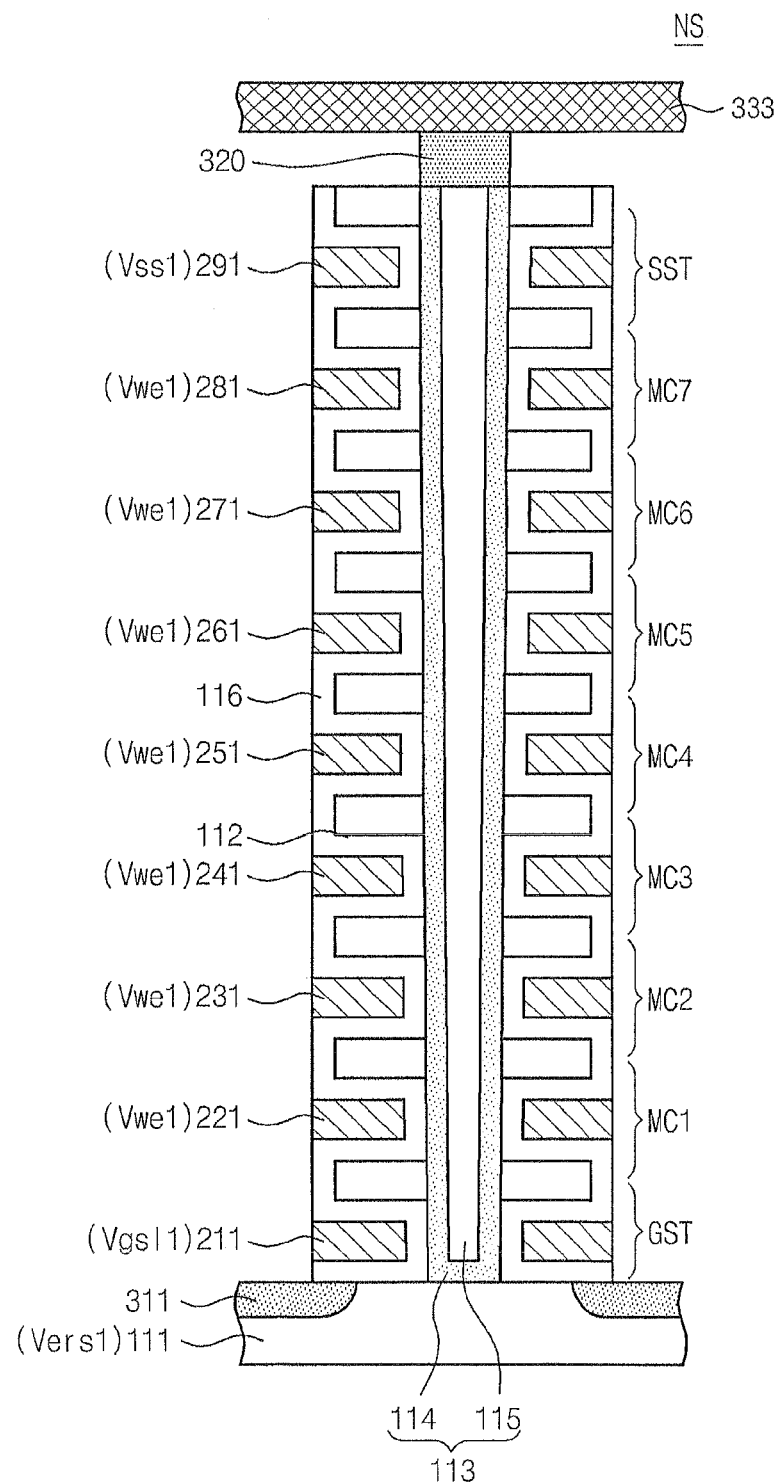
FIG. 11 is a cross-sectional view illustrating a NAND string of a memory block based on the voltage shift of FIG. 10.

FIG. 10 is a timing diagram showing the voltage shift of the memory block BLKa_1 based on the voltage conditions of FIG. 9. FIG. 11 is a cross-sectional view illustrating a NAND string NS of the memory block BLKa_1 based on the voltage shift of FIG. 10. Exemplarily, a cross-sectional view corresponding to the NAND string NS13 of the first row, third column of the memory block BLKa_1 is illustrated.

Referring to FIGS. 8 to 11, a first erasure voltage Vers1 is applied to the substrate 111 at a first time t1. In an embodiment, the first erasure voltage Vers1 may be a high voltage.

The substrate 111 is doped in the same type as that of the surface layer 114 serving as a second-direction body. Accordingly, the first erasure voltage Vers1 is transferred to the surface layer 114 of a NAND string NS.

The first conductive material 211 having the first height serves as the ground selection line GSL and the gate (or control gate) of the ground selection transistor GST. The ground selection line GSL is floated at the first time t1. The first conductive material 211 is affected by coupling from the surface layer 114. Accordingly, as the voltage of the surface layer 114 increases to the first erasure voltage Vers1, the voltage of the first conductive material 211 serving as the ground selection line GSL increases. In an embodiment, the voltage of the ground selection line GSL may increase to a first ground selection line voltage Vgsl1.

The voltage of the surface layer 114 serving as a second-direction body is the first erasure voltage Vers1, and the voltage of the first conductive material 211 serving as the gate (or control gate) of the ground selection transistor GST is the first ground selection line voltage Vgsl1. In an embodiment, a difference between the first erasure voltage Vers1 and the first ground selection line voltage Vgsl1 is not large by the degree where it causes Fowler-Nordheim (F-N) tunneling. Therefore, the ground selection transistor GST is erasure-prohibited.

The first conductive materials 221 to 281 having the second to eighth heights serve as the first to seventh word lines WL1 to WL7 and the gates (or control gates) of the first to seventh memory cells MC1 to MC7, respectively. A first word line erasure voltage Vwe1 is applied to the word lines WL1 to WL7 at the first time t1. In an embodiment, the first word line erasure voltage Vwe1 may be a low voltage. For example, the first word line erasure voltage Vwe1 is the ground voltage Vss.

The voltage of the surface layer 114 serving as the second-direction body is the first erasure voltage Vers1, and the voltages of the first conductive materials 221 to 241 serving as the gate (or control gate) of the first to seventh memory cells MC1 to MC7 are the first word line erasure voltage Vwe1. A difference between the first erasure voltage Vers1 and the first word line erasure voltage Vwe1 may cause Fowler-Nordheim tunneling. For example, the level of the first erasure voltage Vers1 and the level of the first word line erasure voltage Vwe1 are set so as to cause Fowler-Nordheim tunneling. Therefore, the first to seventh memory cells MC1 to MC7 of the memory block BLKa are erased.

In an embodiment, the first conductive material 291 having the ninth height serves as the string selection line SSL and the gate (or control gate) of the string selection transistor SST. The string selection line SSL is floated at the first time t1. The first conductive material 291 is affected by coupling from the surface layer 114. Accordingly, as the voltage of the surface layer 114 increases to the first erasure voltage Vers1, the voltage of the first conductive material 291 serving as the string selection line SSL increases. The voltage of the string selection line SSL may increase to a first string selection line voltage Vssl1.

The voltage of the surface layer 114 serving as the second-direction body is the first erasure voltage Vers1, and the voltage of the first conductive material 291 serving as the gate (or control gate) of the string selection transistor SST is the first string selection line voltage Vssl1. In an embodiment, a difference between the first erasure voltage Vers1 and the first string selection line voltage Vssl1 is not large by the degree where it causes Fowler-Nordheim tunneling. Therefore, the string selection transistor SST is erasure-prohibited.

An operation that has been described above with reference to the cross-sectional view of FIG. 11 can be performed in all of the NAND strings NS11 to NS13, NS21 to NS23 and NS31 to NS33 of the memory block BLKa_1. Therefore, in the memory cells MC1 to MC7 corresponding to the string selection lines SSL1 to SSL3, for example, all the memory cells of the memory block BLKa_1 are erased.

FIG. 12 is a table showing voltage conditions which are applied to the memory block BLKa_1 of FIG. 6 in erasure verification.

Referring to FIGS. 3, 6 and 12, a pre-charge voltage Vpre is applied to the bit lines BL1 to BL3. For example, the pre-charge voltage Vpre may be a power source voltage Vcc.

As described above with reference to FIGS. 7 and 8, the erasure verification is performed by the unit of respective string selection line SSL. Therefore, one of the string selection lines SSL1 to SSL3 is selected, and the other lines are not selected.

A second string selection line voltage Vssl2 is applied to the selected string selection line SSL. For example, the second string selection line voltage Vssl2 is a voltage that turns on the string selection transistors SST. For example, the second string selection line voltage Vssl2 is the power source voltage Vcc.

A third string selection line voltage Vssl3 is applied to the unselected string selection lines SSL. For example, the third string selection line voltage Vssl3 is a voltage that turns off the string selection transistors SST. For example, the third string selection line voltage Vssl3 is the ground voltage Vss.

An erasure verification voltage Vvfy is applied to the word lines WL1 to WL7. For example, the erasure verification voltage Vvfy may be set as the upper limits of threshold voltages required by the memory cells of an erasing state. For example, the erasure verification voltage Vvfy may be the ground voltage Vss.

A second ground selection line voltage Vgsl2 is applied to the ground selection line GSL. For example, the second ground selection line voltage Vgsl2 is a voltage that turns on the ground selection transistors GST. For example, the second ground selection line voltage Vgsl2 may be the ground voltage Vss.

A common source line voltage Vcsl is applied to the common source line CSL. For example, the common source line voltage Vcsl may have a lower level than the pre-charge voltage Vpre. For example, the common source line voltage Vcsl may be the ground voltage Vss.

Figure 13:
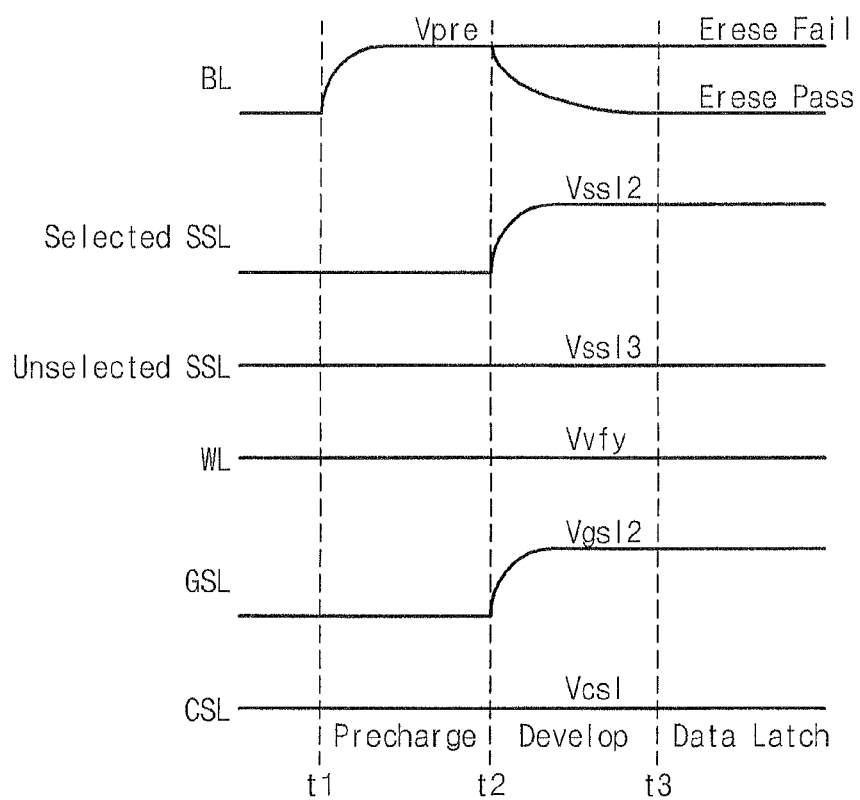
FIG. 13 is a timing diagram showing the voltage shift of a memory block based on the voltage conditions of FIG. 12.
Figure 14:
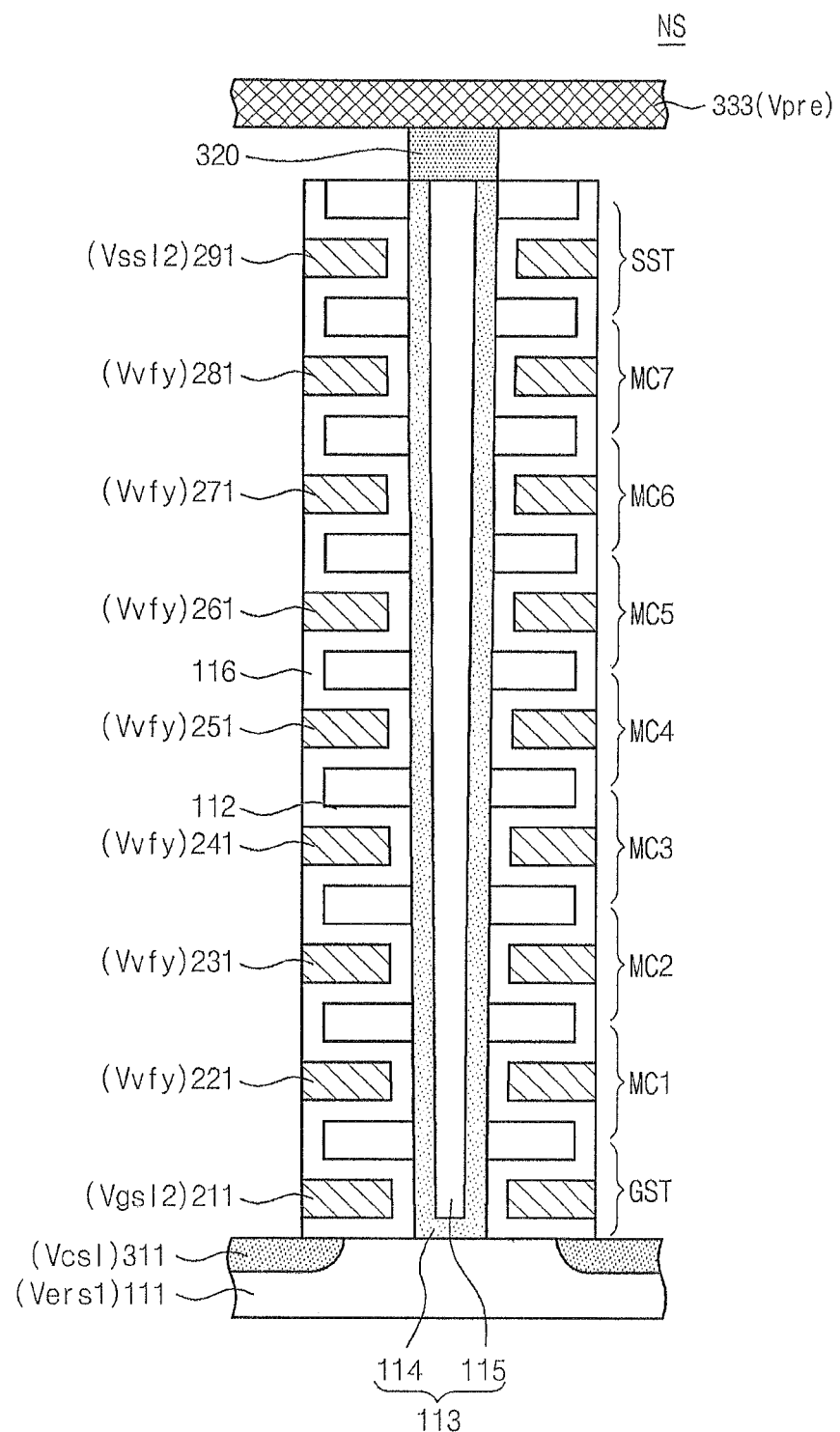
FIG. 14 is a cross-sectional view illustrating a NAND string of a memory block based on the voltage shift of FIG. 13.

FIG. 13 is a timing diagram showing the voltage shift of the memory block BLKa_1 based on the voltage conditions of FIG. 12. FIG. 14 is a cross-sectional view illustrating a NAND string NS of the memory block BLKa_1 based on the voltage shift of FIG. 13. A cross-sectional view corresponding to the NAND string NS13 of the first row, third column of the memory block BLKa_1 is illustrated.

Referring to FIGS. 8, 12, 13 and 14, pre-charge is performed at a first time t1. A pre-charge voltage Vpre is applied to the bit lines BL1 to BL3. That is, the pre-charge voltage Vpre is applied to the second conductive material 333 serving as the third bit line BL3.

Development is performed at a second time t2. The bit lines BL1 to BL3 charged with the pre-charge voltage are floated.

The second string selection line voltage Vssl2 is applied to a selected string selection line (for example, SSL1). That is, string selection transistors SST1 corresponding to the selected string selection line SSL1 are turned on. Therefore, the NAND strings NS11 to NS13 of a first row are electrically connected to the bit lines BL1 to BL3.

A third string selection line voltage Vssl3 is applied to unselected string selection lines (for example, SSL2 and SSL3). That is, string selection transistors SST2 and SST3 corresponding to the unselected string selection lines SSL2 and SSL3 are turned off. Therefore, the NAND strings NS21 to NS23 and NS31 to NS33 of second and third rows are electrically disconnected from the bit lines BL1 to BL3.

The erasure verification voltage Vvfy is applied to the word lines WL1 to WL7. Among the memory cells MC1 to MC7 of the NAND strings NS11 to NS13 of the first row, memory cells having a higher threshold voltage than the erasure verification voltage Vvfy are turned off. Among the memory cells MC1 to MC7 of the NAND strings NS11 to NS13 of the first row, memory cells having a lower threshold voltage than the erasure verification voltage Vvfy are turned on.

The second ground selection line voltage Vgsl2 is applied to the ground selection line GSL. Therefore, ground selection transistors SST are turned on, and the NAND strings NS11 to NS13, NS21 to NS23 and NS31 to NS33 are electrically connected to the common source line CSL.

When all the memory cells MC1 to MC7 of a specific NAND string among the NAND strings NS11 to NS13 of the first row are turned on, a channel is formed between a corresponding bit line BL and the common source line CSL. Therefore, a current flows from a corresponding bit line BL to the common source line CSL. As such, the voltage of the corresponding bit line BL decreases from the pre-charge voltage Vpre.

When at least one of the memory cells MC1 to MC7 of a specific NAND string among the NAND strings NS11 to NS13 of the first row are turned off, a channel is not formed between a corresponding bit line BL and the common source line CSL. Therefore, a current does not flow from a corresponding bit line BL to the common source line CSL, the voltage of the corresponding bit line BL is maintained as the pre-charge voltage Vpre.

Data latch is performed at a third time t3. For example, the erasure pass and erasure fail are determined with the voltages of the bit lines BL1 to BL3.

For example, when the voltages of the first to third bit lines BL1 to BL3 are lower than the pre-charge voltage Vpre, i.e., the threshold voltages of the memory cells MC1 to MC7 of the selected first row of the memory block BLKa_1 are lower than the erasure verification voltage Vvfy, erasure pass is determined.

When the voltage of at least one of the first to third bit lines BL1 to BL3 is the pre-charge voltage Vpre, i.e., the threshold voltage of at least one of the memory cells MC1 to MC7 of the selected first row of the memory block BLKa_1 is higher than the erasure verification voltage Vvfy, erasure fail is determined.

As described above with reference to FIG. 8, when erasure fail is detected from at least one of the NAND strings NS11 to NS13 of the first row, erasure that has been described above with reference to FIGS. 9 to 11 is again performed. When the NAND strings NS11 to NS13 of the first row are erasure-passed, a next string selection line (for example, SSL2) is selected, and the memory cells MC1 to MC7 of the NAND strings NS21 to NS23 connected to a selected string selection line SSL2 are erasure-verified.

Figure 15:
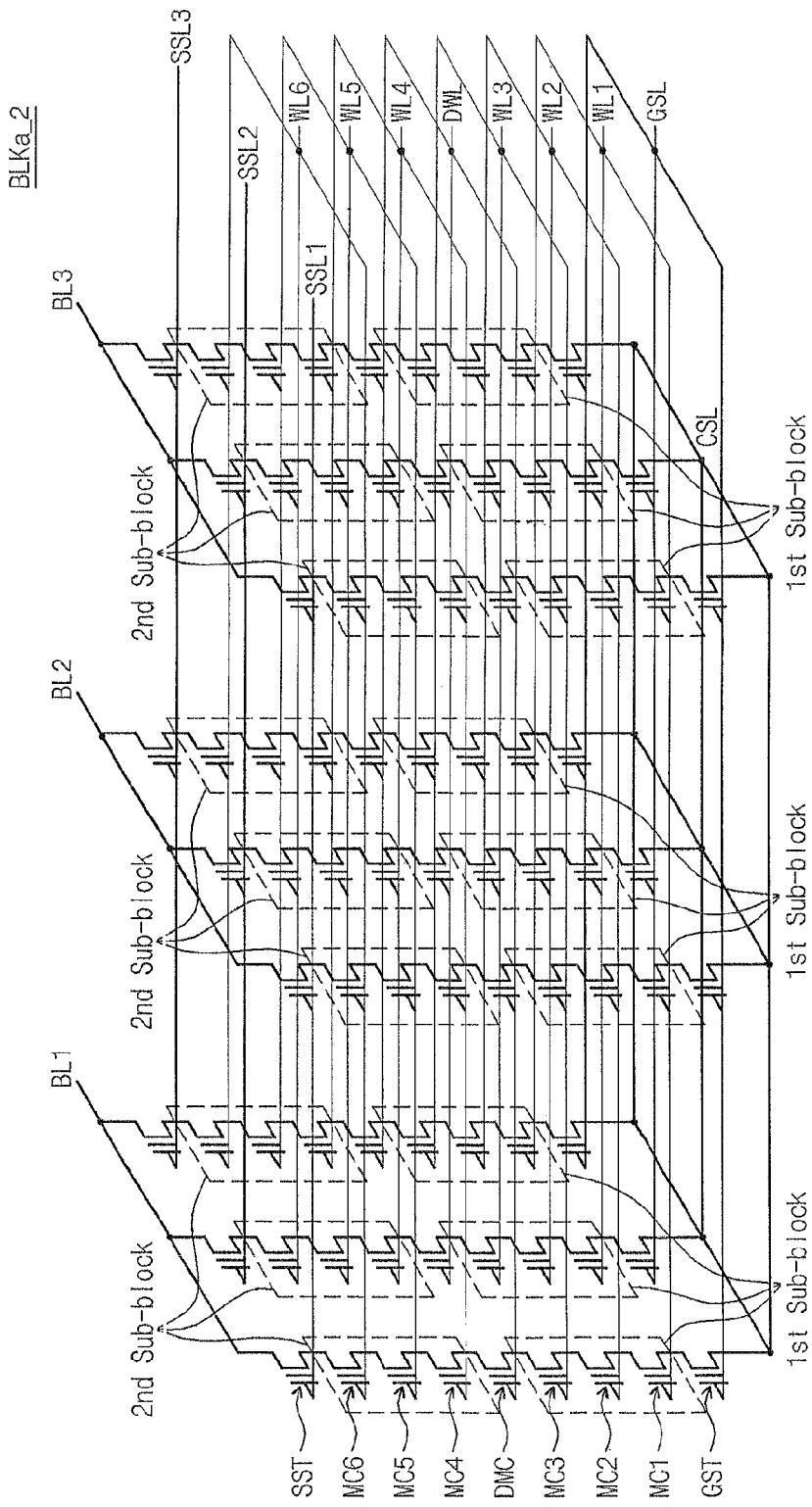
FIG. 15 is a circuit diagram illustrating a memory block according to an embodiment of the inventive concept.

FIG. 15 is a circuit diagram illustrating an equivalent circuit BLKa_2 according to an embodiment of the inventive concept.

Referring to FIGS. 3, 4 and 15, a memory block BLKa_2 is divided into a plurality of sub-blocks in the second direction. Dummy memory cells DMC and a dummy word line DWL connected to the dummy memory cells DMC are provided between the sub-blocks.

First conductive lines 221 to 241, 222 to 242 and 223 to 243 having the second to fourth heights form the first to third memory cells MC1 to MC3 and constitute a first sub-block. First conductive lines 251, 252 and 253 having the fifth height form the dummy memory cells DMC. First conductive lines 261 to 281, 262 to 282 and 263 to 283 having the sixth to eighth heights form the fourth to sixth memory cells MC4 to MC6 and constitute a second sub-block.

The memory block BLKa_2 is erased by sub-block unit. That is, each sub-block is independently erased according to an embodiment of the inventive concept.

Except for that the memory block BLKa_2 is erased by sub-block unit, the memory block BLKa_2 is erased and erasure-verified as described above with reference to FIG. 8. For example, the memory cells MC of the sub-block of the memory block BLKa_2 are erased, and thereafter the erased memory cells MC are erasure-verified by unit of string selection line SSL.

In an embodiment, the memory block BLKa_2 is described as being divided into two sub-blocks. However, the number of sub-blocks is not limited. Also, one dummy word line DWL is provided between the sub-blocks of the memory block BLKa_2 according to an embodiment. However, the number of dummy word lines DWL provided between the sub-blocks is not limited.

FIG. 16 is a table showing voltage conditions which are applied to the memory block BLKa_2 of FIG. 15 in erasing.

Referring to FIGS. 15 and 16, the string selection lines SSL1 to SSL3 are floated in erasing. The word lines WL of an unselected sub-block are floated. The first word line erasure voltage Vwe1 is applied to the word lines WL of a selected sub-block. A first dummy word line voltage Vdwl1 is applied to the dummy word line DWL. The ground selection line GSL is floated. The first erasure voltage Vers1 is applied to the substrate 111.

When a first sub-block is selected, the first word line erasure voltage Vwe1 is applied to the word lines WL1 to WL3 of a selected first sub-block in erasing. In erasing, the word lines WL4 to WL6 of an unselected second sub-block are floated.

Figure 17:
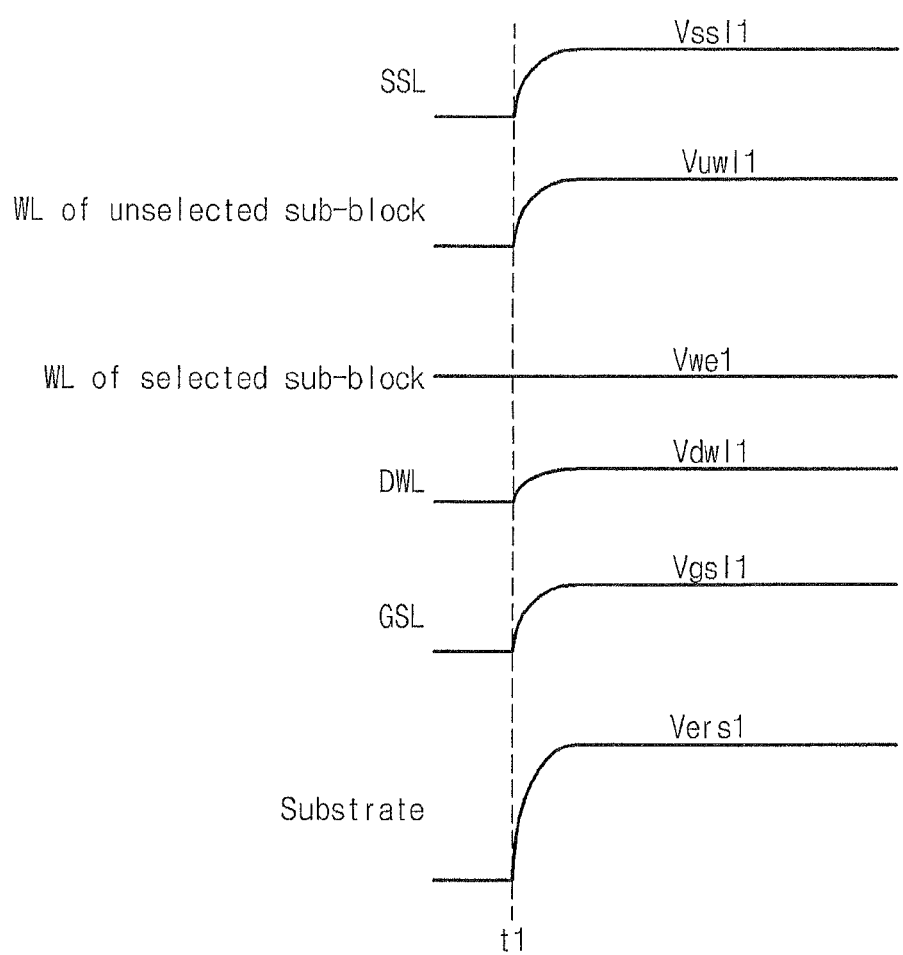
FIG. 17 is a timing diagram showing the voltage shift of a memory block based on the voltage conditions of FIG. 16.
Figure 18:
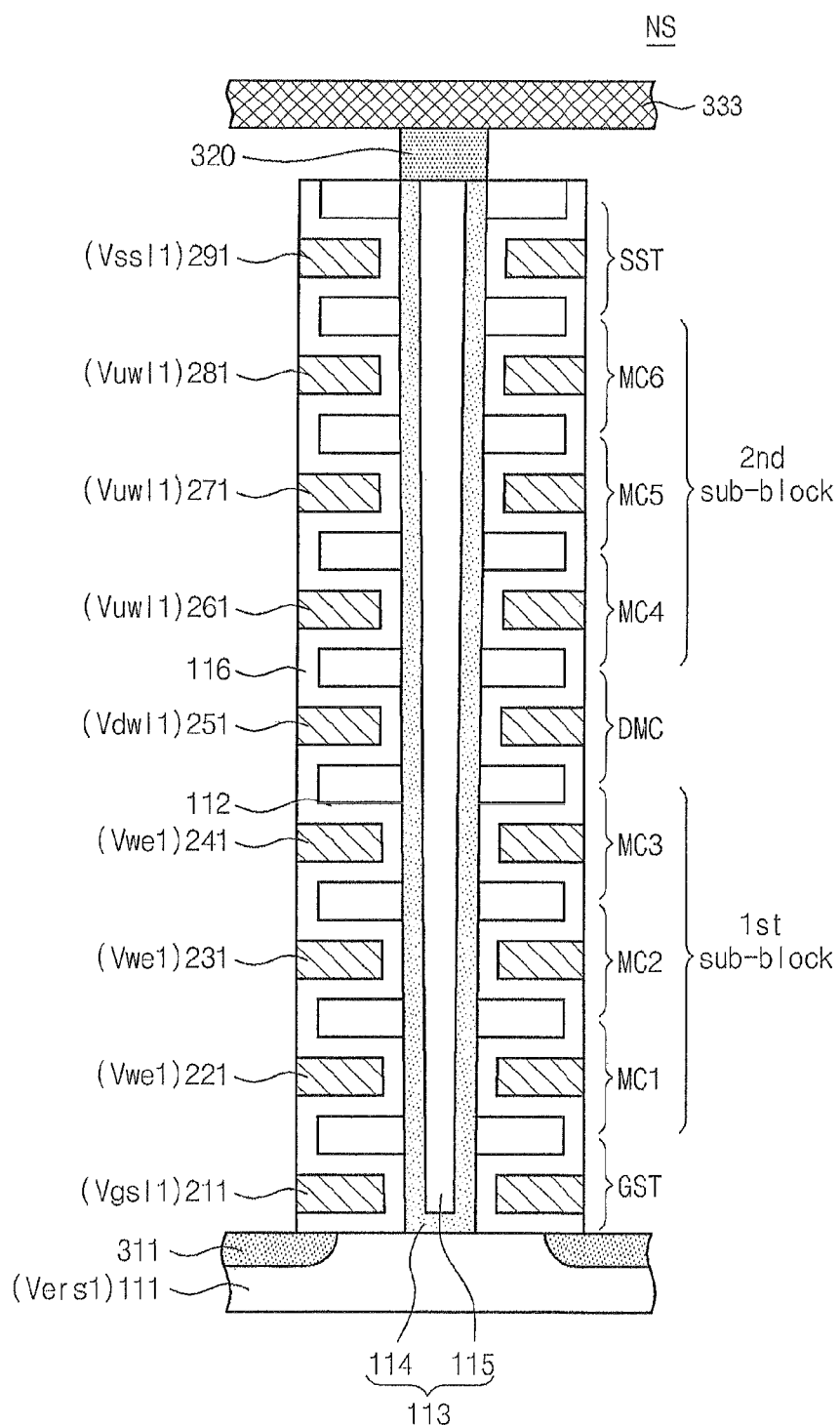
FIG. 18 is a cross-sectional view illustrating a NAND string of the memory block of FIG. 17.

FIG. 17 is a timing diagram showing the voltage shift of the memory block BLKa 2 based on the voltage conditions of FIG. 16. FIG. 18 is a cross-sectional view illustrating a NAND string NS of the memory block BLKa_2. As an example, a cross-sectional view corresponding to the NAND string NS13 of the first row, third column of the memory block BLKa_2 is illustrated. As an example, it is assumed that the first sub-block is erased and the second sub-block is erasure-prohibited.

Referring to FIGS. 15 to 18, the first erasure voltage Vers1 is applied to the substrate 111 at a first time t1. As an example, the first erasure voltage Vers1 may be a high voltage. The first erasure voltage Vers1 is transferred to the surface layer 114 of a NAND string NS.

The ground selection line GSL is floated. The voltage of the first conductive material 211 serving as the ground selection line GSL increases by coupling from the surface layer 114. As an example, the voltage of the ground selection line GSL increases to the first ground selection line voltage Vgsl1. Therefore, the ground selection transistor GST is erasure-prohibited.

The first word line erasure voltage Vwe1 is applied to word lines selected. That is, the first word line erasure voltage Vwe1 is applied to the first to third word lines WL1 to WL3. As an example, the first word line erasure voltage Vwe1 may be a low voltage. For example, the first word line erasure voltage Vwe1 may be the ground voltage Vss. Therefore, the selected first to third memory cells MC1 to MC3 of the first sub-block are erased.

Unselected word lines are floated. The voltages of the first conductive materials 261 to 281 serving as the fourth to sixth word lines WL4 to WL6 increase by coupling from the surface layer 114. As an example, the voltages of the fourth to sixth word lines WL4 to WL6 increase to a first non-selection word line voltage Vuwl1. As an example, a difference between the second erasure voltage Vers2 and the first non-selection word line voltage Vuwl1 is not large by the degree where it causes Fowler-Nordheim tunneling. Therefore, the unselected fourth to sixth memory cells MC4 to MC6 of the second sub-block are erasure-prohibited.

The string selection line SSL is floated. The voltage of the first conductive material 211 serving as the string selection line SSL increases by coupling from the surface layer 114. As an example, the voltage of the string selection line SSL increases to the first string selection line voltage Vssl1. Therefore, the string selection transistor SST is erasure-prohibited.

The first conductive material 251 having the fifth height serves as the dummy word line DWL and the gate (or control gate) of the dummy memory cell DMC. The first dummy word line voltage Vdwl1 is applied to the dummy word line DWL. As an example, the level of the first dummy word line voltage Vdwl1 is set so that Fowler-Nordheim tunneling does not occur by a voltage difference between the surface layer 114 and the gate (or control gate) of the dummy memory cell DMC. That is, the dummy memory cell DMC is erasure-prohibited.

As an example, the first dummy word line voltage Vdwl1 has a level between the first word line erasure voltage Vwe1 and the first erasure voltage Vers1. For example, the first dummy word line voltage Vdwl1 has a level between the first word line erasure voltage Vwe1 and the first non-selection word line voltage Vuwl1. The dummy memory cells DMC, the dummy word line DWL and the first dummy word line voltage Vdwl1 decrease coupling between sub-blocks.

As an example, the dummy word line DWL may be floated in erasing. The voltage of the dummy word line DWL increases by coupling due to the voltage increase of the surface layer 114. Therefore, the dummy word line DWL is floated, and the dummy memory cells DMC are erasure-prohibited.

As an example, it has been described above that the word lines WL4 to WL6 of an unselected sub-block are floated. However, in erasing, an erasure prohibition voltage may be applied to the word lines WL4 to WL6 of the unselected sub-block. The erasure prohibition voltage is set so that Fowler-Nordheim tunneling does not occur by a voltage difference with first erasure voltage Vers1. For example, the erasure prohibition voltage may be a high voltage.

FIG. 19 is a table showing voltage conditions which are applied to the memory block BLKa_2 of FIG. 15 in erasure verification.

Referring to FIGS. 3, 15 and 19, the pre-charge voltage Vpre is applied to the bit lines BL1 to BL3. For example, the pre-charge voltage Vpre may be the power source voltage Vcc.

As described above with reference to FIGS. 7 and 8, erasure verification is performed by the unit of respective string selection line SSL. Therefore, one of the string selection lines SSL1 to SSL3 is selected, and the other lines are not selected.

The second string selection line voltage Vssl2 is applied to the selected string selection line SSL. For example, the second string selection line voltage Vssl2 is a voltage that turns on the string selection transistors SST. For example, the second string selection line voltage Vssl2 is the power source voltage Vcc.

The third string selection line voltage Vssl3 is applied to the unselected string selection lines SSL. For example, the third string selection line voltage Vssl3 is a voltage that turns off the string selection transistors SST. For example, the third string selection line voltage Vssl3 is the ground voltage Vss.

The erasure verification voltage Vvfy is applied to the word lines of a selected sub-block. For example, the erasure verification voltage Vvfy may be set as the upper limits of threshold voltages required by the memory cells of an erasing state. For example, the erasure verification voltage Vvfy may be the ground voltage Vss.

A first read voltage Vread1 is applied to the word lines of an unselected sub-block. For example, the first read voltage Vread1 is a voltage that turns on the memory cells MC irrespective of the logical states of the memory cells MC. For example, the first read voltage Vread1 is a high voltage.

A second read voltage Vread2 is applied to a dummy word line DWL2. For example, the second read voltage Vread2 is a voltage that turns on the dummy memory cells DMC. For example, the second read voltage Vread2 is a high voltage. For example, the second read voltage Vread2 may have a level equal to or higher than the first read voltage Vread1.

The second ground selection line voltage Vgsl2 is applied to the ground selection line GSL. For example, the second ground selection line voltage Vgsl2 is a voltage that turns on the ground selection transistors GST. For example, the second ground selection line voltage Vgsl2 may be the ground voltage Vss.

The common source line voltage Vcsl is applied to the common source line CSL. For example, the common source line voltage Vcsl may be the ground voltage Vss.

Figure 20:
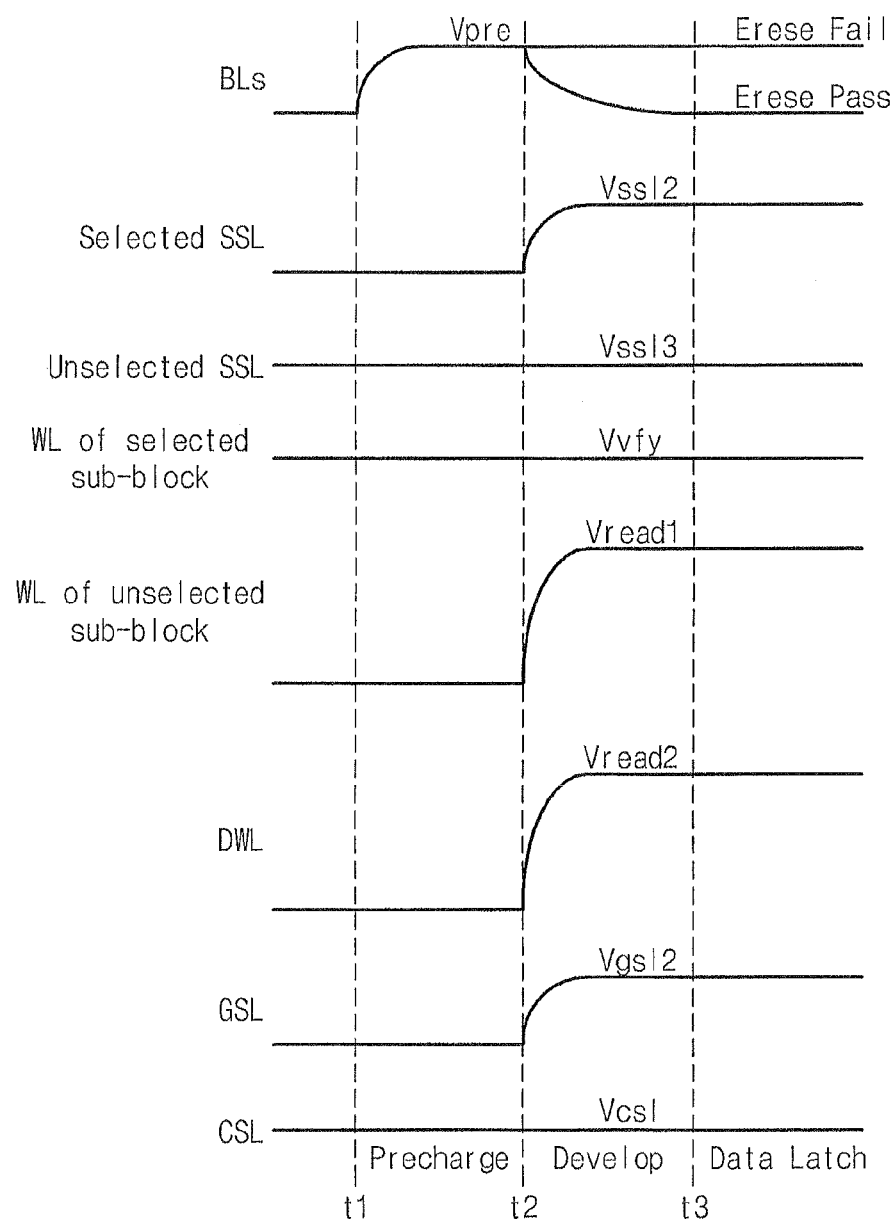
FIG. 20 is a timing diagram showing the voltage shift of a memory block based on the voltage conditions of FIG. 19.
Figure 21:
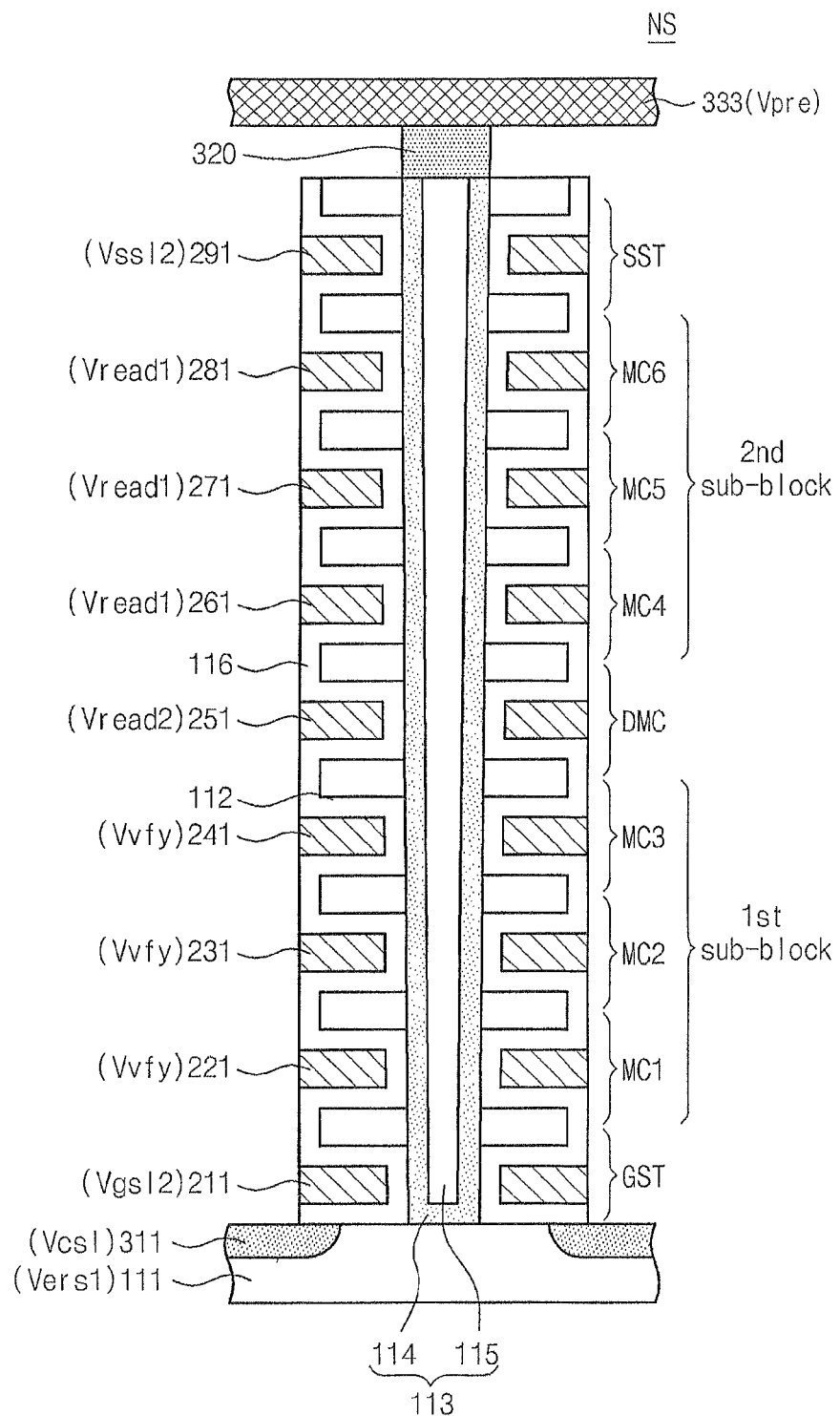
FIG. 21 is a cross-sectional view illustrating a NAND string of a memory block based on the voltage shift of FIG. 20.

FIG. 20 is a timing diagram showing the voltage shift of the memory block BLKa 2 based on the voltage conditions of FIG. 19. FIG. 21 is a cross-sectional view illustrating a NAND string NS of the memory block BLKa_2 based on the voltage shift of FIG. 20. As an example, a cross-sectional view corresponding to the NAND string NS13 of the first row, third column of the memory block BLKa_2 is illustrated.

Referring to FIGS. 15, 19 to 21, pre-charge is performed at a first time t1. The pre-charge voltage Vpre is applied to the bit lines BL1 to BL3. That is, the pre-charge voltage Vpre is applied to the second conductive material 333 serving as the third bit line BL3.

Development is performed at a second time t2. The bit lines BL1 to BL3 charged with the pre-charge voltage are floated.

The second string selection line voltage Vssl2 is applied to a selected string selection line (for example, SSL1). That is, string selection transistors SST1 corresponding to the selected string selection line SSL1 are turned on. Therefore, the selected NAND strings NS11 to NS13 of the first row are electrically connected to the bit lines BL1 to BL3.

The third string selection line voltage Vssl3 is applied to unselected string selection lines (for example, SSL2 and SSL3). That is, string selection transistors SST2 and SST3 corresponding to the unselected string selection lines SSL2 and SSL3 are turned off. Therefore, the NAND strings NS21 to NS23 and NS31 to NS33 of second and third rows are electrically disconnected from the bit lines BL1 to BL3.

The erasure verification voltage Vvfy is applied to the word lines WL1 to WL3 of a first sub-block selected. Among the memory cells MC1 to MC3 of the first row of the first sub-block, memory cells having a higher threshold voltage than the erasure verification voltage Vvfy are turned off. Among the memory cells MC1 to MC3 of the first row of the first sub-block, memory cells having a lower threshold voltage than the erasure verification voltage Vvfy are turned on.

The first read voltage Vread1 is applied to the word lines WL4 to WL6 of a second sub-block unselected. Therefore, the word lines WL4 to WL6 of the unselected second sub-block are turned on.

The second read voltage Vread2 is applied to a dummy word line DWL. Therefore, the dummy memory cells DMC are turned on.

When all the memory cells MC1 to MC3 corresponding to a specific NAND string of the first row among the memory cells MC1 to MC3 of the first sub-block are turned on, a channel is formed between a corresponding bit line BL and the common source line CSL. Therefore, a current flows from a corresponding bit line BL to the common source line CSL, the voltage of the corresponding bit line BL decreases from the pre-charge voltage Vpre.

When at least one of memory cells MC1 to MC3 corresponding to a specific NAND string of the first row among the memory cells MC1 to MC3 of the first sub-block are turned off, a channel is not formed between a corresponding bit line BL and the common source line CSL. Therefore, a current does not flow from a corresponding bit line BL to the common source line CSL, the voltage of the corresponding bit line BL is maintained as the pre-charge voltage Vpre.

Data latch is performed at a third time t3. For example, erasure pass and erasure fail are determined with the voltages of the bit lines BL1 to BL3.

For example, when the voltages of the first to third bit lines BL1 to BL3 are lower than the pre-charge voltage Vpre, i.e., the threshold voltages of the memory cells MC1 to MC3 of the selected first row of the selected first sub-block of the memory block BLKa_2 are lower than the erasure verification voltage Vvfy, erasure pass is determined.

When the voltage of at least one of the first to third bit lines BL1 to BL3 is the pre-charge voltage Vpre, i.e., the threshold voltage of at least one of the memory cells MC1 to MC3 of the selected first row of the selected first sub-block of the memory block BLKa_2 is higher than the erasure verification voltage Vvfy, erasure fail is determined.

As described above with reference to FIG. 8, when erasure fail is detected from at least one of the NAND strings NS11 to NS13 of the first row, erasure that has been described above with reference to FIGS. 9 to 11 is again performed. That is, when erasure fail is detected from the memory cells MC1 to MC3 of the first row of the first sub-block, the memory cells MC1 to MC3 of the first sub-block are again erased.

When the NAND strings NS11 to NS13 of the first row are erasure-passed, a next string selection line (for example, SSL2) is selected, and the memory cells MC1 to MC7 of the NAND strings NS21 to NS23 connected to a selected string selection line SSL2 are erasure-verified. That is, when the memory cells MC1 to MC3 of the first row of the first sub-block are erasure-passed, the memory cells MC1 to MC3 of the other row (for example, second row) of the first sub-block are erasure-verified.

Figure 22:
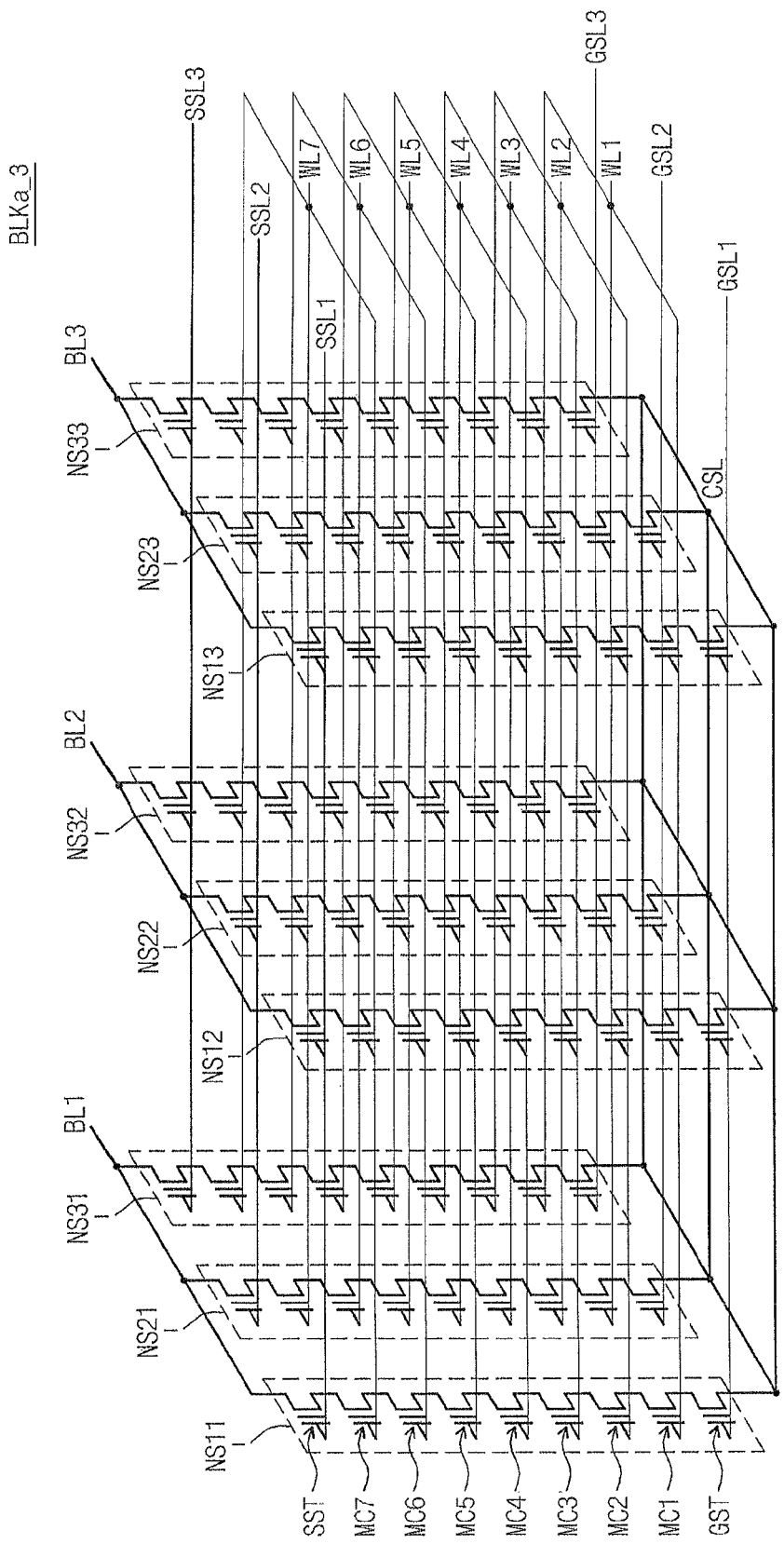
FIG. 22 is a circuit diagram illustrating a memory block according to an embodiment of the inventive concept.

FIG. 22 is a circuit diagram BLKa_3 of the memory block BLKa of FIG. 3 according to an embodiment of the inventive concept.

Referring to FIGS. 3 and 22, the NAND strings NS of the same row share a ground selection line GSL1, GSL2 or GSL3. The NAND strings NS of different rows are connected to the different ground selection line GSL1, GSL2 and GSL3, respectively.

Memory cells MC having the same height share a word line. Memory cells MC having different heights are connected to different word lines, respectively. That is, the first to seventh memory cells MC1 to MC7 are connected to the first to seventh word lines WL1 to WL7, respectively.

Except that the ground selection lines GSL1 to GSL3 are provided, the memory block BLKa_3 is erased and erasure-verified as described above with reference to FIGS. 7 and 8. For example, the memory cells MC1 to MC7 of the memory block BLKa_3 are erased, and thereafter the erased memory cells MC1 to MC7 are erasure-verified by unit of string selection line SSL.

Except that the ground selection lines GSL1 to GSL3 are provided, the memory block BLKa_3 is erased as described above with reference to FIGS. 9 to 11. For example, the string selection lines SSL1 to SSL3 and the ground selection lines GSL1 to GSL3 are floated, the first word line erasure voltage Vwe1 is applied to the word lines WL1 to WL7, and the first erasure voltage Vers1 is applied to the substrate 111.

FIG. 23 is a table showing voltage conditions which are applied to the memory block BLKa_3 of FIG. 22 in erasure verification. The voltage conditions in erasure verification are the same as the voltage conditions of FIG. 12, except that the second ground selection line voltage Vgsl2 is applied to a selected ground selection line and the third ground selection line voltage Vgsl3 is applied to an unselected ground selection line.

As an example, the second ground selection line voltage Vgsl2 is a voltage that turns on the ground selection transistor GST. For example, the second ground selection line voltage Vgsl2 may be the power source voltage Vcc.

As an example, the third ground selection line voltage Vgsl3 is a voltage that turns of the ground selection transistor GST. For example, the third ground selection line voltage Vgsl3 may be the ground voltage Vss.

Figure 24:
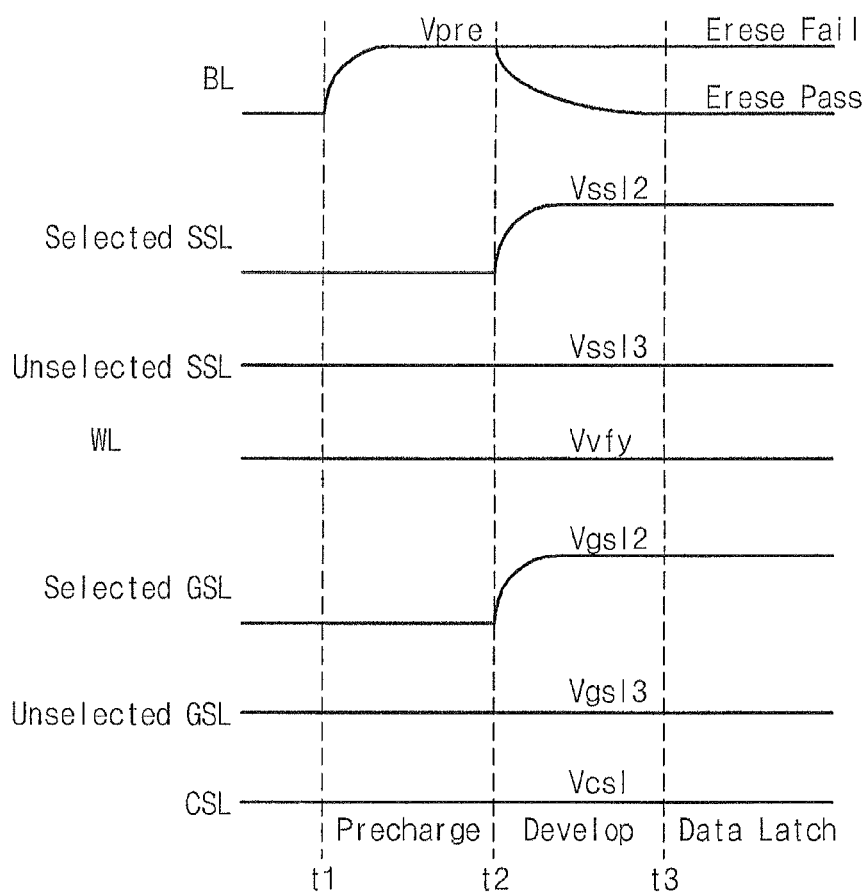
FIG. 24 is a timing diagram showing the voltage shift of a memory block based on the voltage conditions of FIG. 23.

FIG. 24 is a timing diagram showing the voltage shift of the memory block BLKa_3 based on the voltage conditions of FIG. 23.

Referring to FIGS. 3, 22 to 24, pre-charge is performed at a first time t1. The pre-charge voltage Vpre is applied to the bit lines BL1 to BL3.

Development is performed at a second time t2. The bit lines BL1 to BL3 are floated. The second string selection line voltage Vssl2 is applied to a selected string selection line (for example, SSL1), and the third string selection line voltage Vssl3 is applied to an unselected string selection lines (for example, SSL2 and SSL3).

The erasure verification voltage Vvfy is applied to the word lines WL1 to WL7.

The ground string selection line voltage Vgsl2 is applied to a selected string selection line (for example, SSL1), and the third ground selection line voltage Vgsl3 is applied to an unselected string selection lines (for example, SSL2 and SSL3).

The common source line voltage Vcsl is applied to the common source line CSL.

When the threshold voltage of the memory cells MC1 to MC7 of a specific NAND string of the selected first row is lower than the erasure verification voltage Vvfy, a corresponding bit line BL decreases from the pre-charge voltage Vpre. When the threshold voltage of at least one memory cell MC of a specific NAND string of the selected first row is higher than the erasure verification voltage Vvfy, a corresponding bit line BL maintains the pre-charge voltage Vpre.

Data latch is performed at a third time t3. For example, erasure pass and erasure fail are determined with the voltages of the bit lines BL1 to BL3.

For example, when the voltages of the first to third bit lines BL1 to BL3 are lower than the pre-charge voltage Vpre, i.e., the threshold voltages of the memory cells MC1 to MC7 of the selected first row of the memory block BLKa_3 are lower than the erasure verification voltage Vvfy, erasure pass is determined.

When the voltage of at least one of the first to third bit lines BL1 to BL3 is the pre-charge voltage Vpre, i.e., the threshold voltage of at least one of the memory cells MC1 to MC7 of the selected first row of the memory block BLKa_3 is higher than the erasure verification voltage Vvfy, erasure fail is determined.

As described above with reference to FIG. 8, when erasure fail is detected from at least one of the NAND strings NS11 to NS13 of the first row, erasure that has been described above with reference to FIGS. 9 to 11 is again performed. That is, when the NAND strings NS11 to NS13 of the first row are erasure-passed, a next string selection line (for example, SSL2) is selected, and the memory cells MC1 to MC7 of the NAND strings NS21 to NS23 connected to a selected string selection line SSL2 are erasure-verified.

As an example, as described above with reference to FIGS. 15 to 21, the memory block BLKa_2 may be divided into a plurality of sub-blocks in the second direction. The dummy memory cells DMC and the dummy word line DWL may be provided between the sub-blocks. In erasing, the voltage conditions and voltage shift of selected word lines, the voltage conditions and voltage shift of unselected word lines and the voltage conditions and voltage shift of the dummy word line DWL are controlled as described above with reference to FIGS. 16 to 18. In erasure verification, the voltage conditions and voltage shift of selected word lines, the voltage conditions and voltage shift of unselected word lines and the voltage conditions and voltage shift of the dummy word line DWL are controlled as described above with reference to FIGS. 19 to 21.

Figure 25:
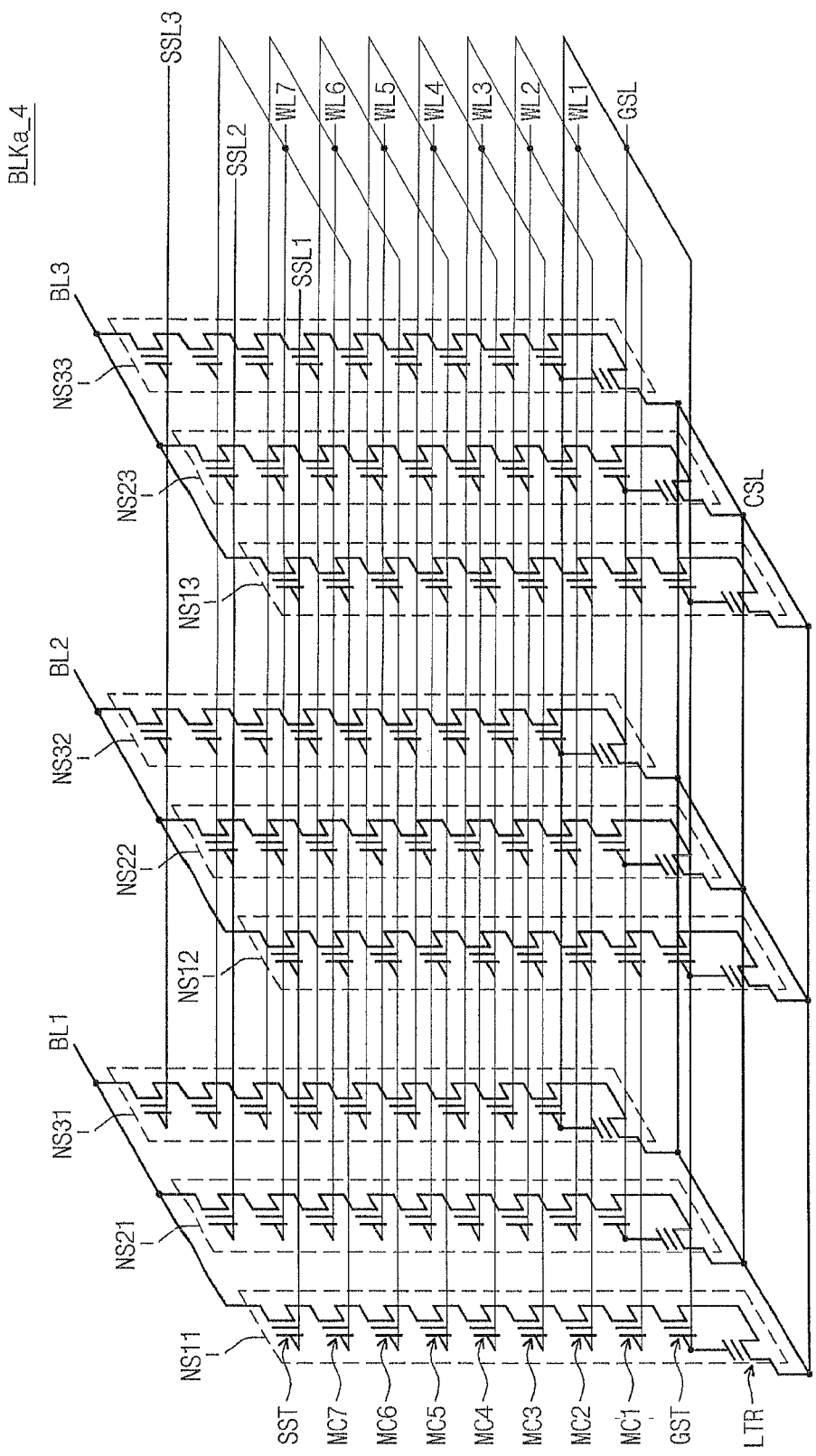
FIG. 25 is a circuit diagram illustrating a memory block according to an embodiment of the inventive concept.

FIG. 25 is a circuit diagram BLKa_4 of the memory block BLKa of FIG. 3 according to an embodiment of the inventive concept. Comparing with the equivalent circuit BLKa_1 of FIG. 6, a lateral transistor LTR is additionally provided to each NAND string NS of a memory block BLKa_4.

In each NAND string NS, the lateral transistor LTR is connected between the ground selection transistor GST and the common source line CSL. The gate (or control gate) of the lateral transistor LTR is connected to the ground selection line GSL together with the gate (or control gate) of the ground selection transistor GST.

As described above with reference to FIGS. 3 to 6, the first conductive materials 211 to 213 having the first height correspond to the first to third ground selection lines GSL1 to GSL3, respectively.

When a certain voltage is applied to the first conductive materials 211 to 213 having the first height, a channel is formed in the region of the surface layer 114 adjacent to the first conductive materials 211 to 213. That is, a channel is formed in the ground selection transistors GST. Also, when a certain voltage is applied to the first conductive materials 211 to 213, a channel is formed in the region of the surface layer 114 adjacent to the first conductive materials 211 to 213.

The first doping region 311 is connected to a channel that is formed in the substrate 111 by the voltage of the first conductive material 211. The channel, which is formed in the substrate 111 by the voltage of the first conductive material 211, is connected to a channel that is formed in the surface layer 114 by the voltage of the first conductive material 211.

Likewise, channels are formed in the substrate 111 by the voltages of the first conductive materials 211 to 213. The first to fourth doping regions 311 to 314 are connected to channels that are formed in the surface layers 114 through the channels that are formed in the substrate 111 by the voltages of the first conductive materials 211 to 213.

As described above with reference to FIGS. 3 to 6, the first to fourth doping regions 311 to 314 are connected in common to form the common source line CSL. The channels of the memory cells MC1 to MC7 and the common source line CSL are electrically connected through a channel (for example, a horizontal channel) that is formed in the substrate 111 by the voltage of the ground selection line GSL and a channel (for example, a vertical channel) that is formed in the surface layer 114.

That is, in an embodiment, a transistor which is driven by a ground selection line GSL and is vertical to the substrate 111 and a transistor which is driven by the ground selection line GSL and is parallel to the substrate 111 are provided between the common source line CSL and the first memory cells MC1. In an embodiment, the transistor vertical to the substrate 111 is a ground selection transistor and the transistor parallel to the substrate 111 is a lateral transistor LTR.

As an example, as described above with reference to FIGS. 7 and 8, the memory block BLKa_4 is erased by units of the string selection lines SSL1 to SSL3, and it is erasure-verified by unit of respective string selection line SSL.

As an example, as described above with reference to FIGS. 15 to 21, the memory block BLKa_4 may be divided into a plurality of sub-blocks in the second direction. The dummy memory cells DMC and the dummy word line DWL may be provided between the sub-blocks. In erasure verification and erasure, the voltages of selected word lines, the voltages of unselected word lines and the voltages of the dummy word line DWL are controlled as described above with reference to FIGS. 15 to 21.

As an example, as described above with reference to FIGS. 22 to 24, the ground selection transistors GST of different rows may be respectively connected to different ground selection lines GSL1 to GSL3, in the memory block BLKa_4. In erasure verification and erasure, the voltages of ground selection lines GSL1 to GSL3 are controlled as described above with reference to FIGS. 22 to 24.

Figure 26:
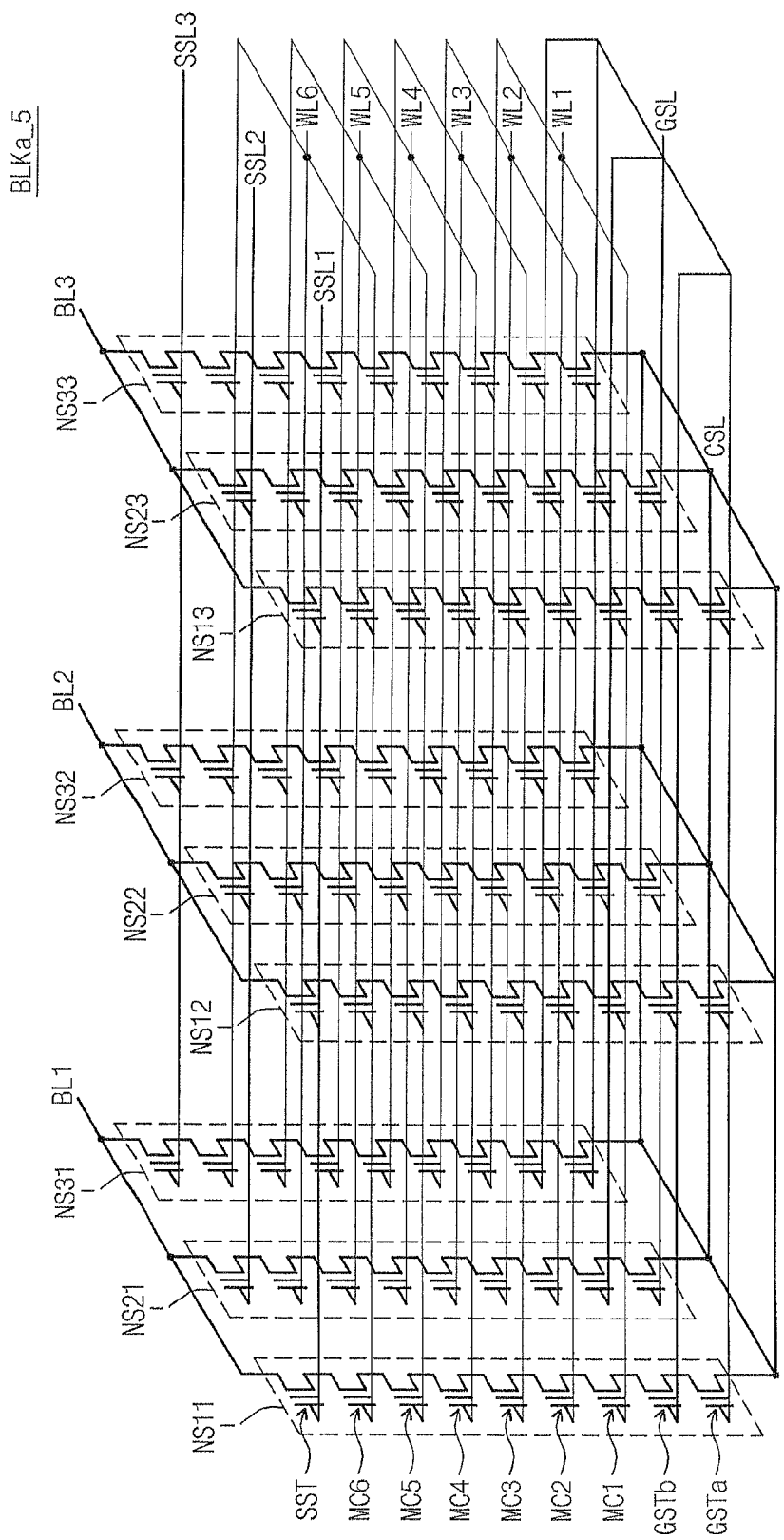
FIG. 26 is a circuit diagram illustrating a memory block according to an embodiment of the inventive concept.

FIG. 26 is a circuit diagram BLKa_5 of the memory block BLKa of FIG. 3 according to an embodiment of the inventive concept. Comparing with the circuit BLKa_1 of FIG. 6, two ground selection transistors GSTa and GSTb are provided between the memory cells MC1 to MC6 and the common source line CSL, in each NAND string NS.

The first conductive lines 211 to 213 having the first height form ath ground selection transistors GSTa, and the first conductive lines 221 to 223 having the second height form bth ground selection transistors GSTb.

In the NAND strings of the same row, the ground selection transistors GSTa and GSTb share one ground selection line GSL. In the NAND strings of different rows, the ground selection transistors GSTa and GSTb share one ground selection line GSL. That is, the ground selection transistors GSTa and GSTb are connected to one ground selection line GSL in common.

As an example, it has been described above that the two ground selection transistors GSTa and GSTb are provided in each NAND string NS. That is, the first conductive materials of two layers (for example, first and second heights) among the first conductive materials 211 to 291, 212 to 292 and 213 to 293 form the ground selection transistors GSTa and GSTb. However, the number of ground selection transistors provided to the each NAND string NS is not limited. For example, three or more ground selection transistors may be provided in the each NAND string NS.

As an example, as described above with reference to FIGS. 7 and 8, the memory block BLKa_5 is erased by units of the string selection lines SSL1 to SSL3, and it is erasure-verified by unit of respective string selection line SSL.

In an embodiment, as described above with reference to FIGS. 15 to 21, the memory block BLKa_5 may be divided into a plurality of sub-blocks in the second direction. The dummy memory cells DMC and the dummy word line DWL may be provided between the sub-blocks. In erasure verification and erasure, the voltages of selected word lines, the voltages of unselected word lines and the voltages of the dummy word line DWL are controlled as described above with reference to FIGS. 15 to 21.

In an embodiment, as described above with reference to FIGS. 22 to 24, the ground selection transistors GST of different rows may be respectively connected to different ground selection lines GSL1 to GSL3, in the memory block BLKa_5. In erasure verification and erasure, the voltages of the ground selection lines GSL1 to GSL3 are controlled as described above with reference to FIGS. 22 to 24.

Figure 27:
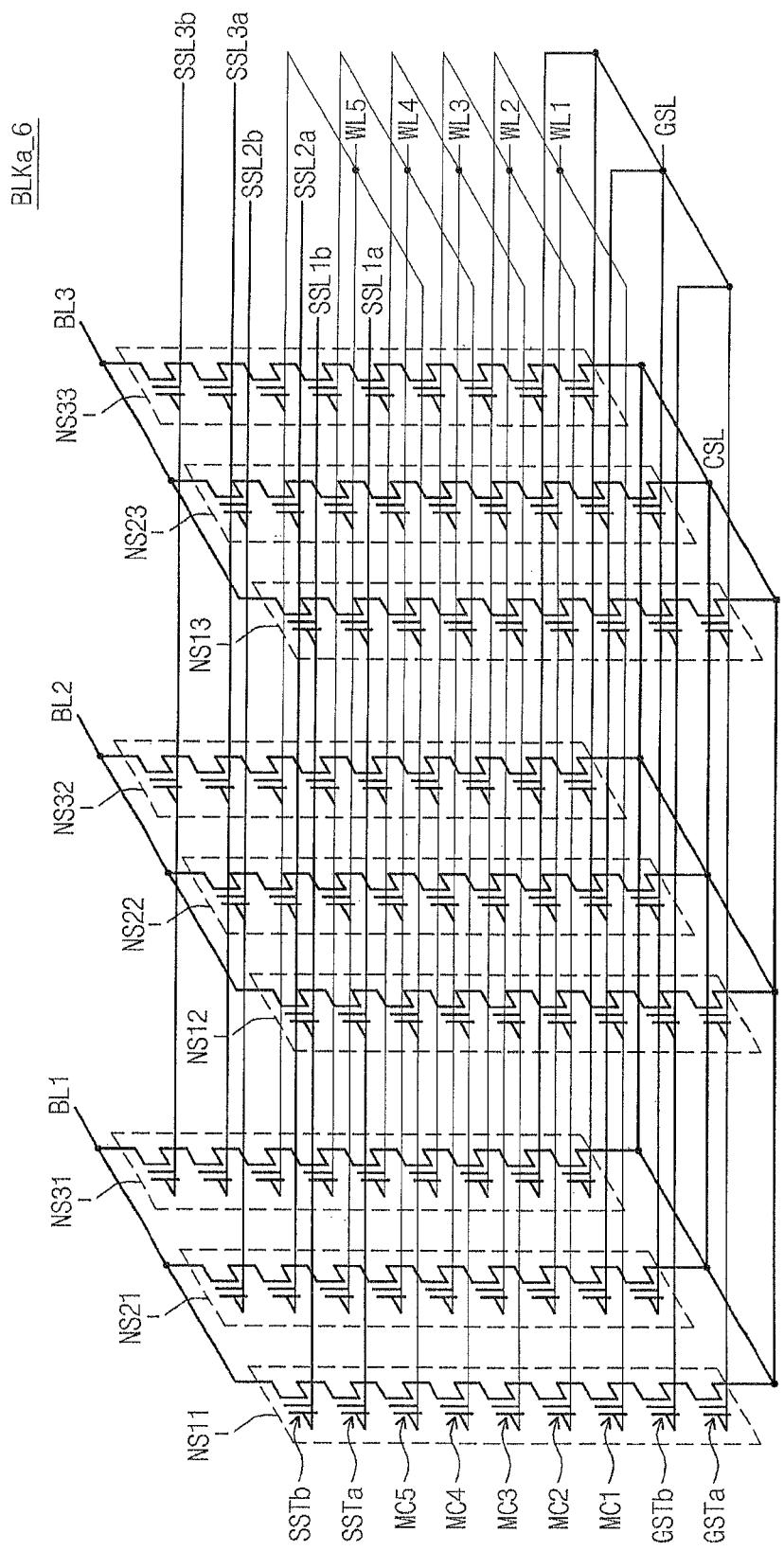
FIG. 27 is a circuit diagram illustrating a memory block according to an embodiment of the inventive concept.

FIG. 27 is a circuit diagram BLKa_6 of the memory block BLKa of FIG. 3 according to an embodiment of the inventive concept. Comparing with the circuit BLKa_5 of FIG. 26, two string selection transistors SSTa and SSTb are provided between the memory cells MC1 to MC5 and the bit line BL, in each NAND string NS.

The first conductive lines 281 to 283 having the eighth height form ath string selection transistors SSTa, and the first conductive lines 291 to 293 having the ninth height form bth string selection transistors SSTb.

In the NAND strings of the same row, the string selection transistors SSTa or SSTb having the same height share one ground selection line GSL. The string selection transistors SSTa and SSTb having different heights are connected to different string selection lines, respectively.

In the NAND strings NS11 to NS13 of the first row, the ath string selection transistors SSTa share a 1ath string selection line SSL1a. The bth string selection transistors SSTb share a 1bth string selection line SSL1b.

In the NAND strings NS21 to NS23 of the second row, the ath string selection transistors SSTa share a 2ath string selection line SSL2a. The bth string selection transistors SSTb share a 2bth string selection line SSL2b.

In the NAND strings NS31 to NS33 of the third row, the ath string selection transistors SSTa share a 3ath string selection line SSL3a. The bth string selection transistors SSTb share a 3bth string selection line SSL3b.

As an example, the two string selection transistors SSTa and SSTb are provided in each NAND string NS. That is, the first conductive materials of two layers (for example, eighth and ninth heights) among the first conductive materials 211 to 291, 212 to 292 and 213 to 293 form the string selection transistors SSTa and SSTb. However, the number of string selection transistors provided to the each NAND string NS is not limited. For example, three or more string selection transistors may be provided in the each NAND string NS.

As an example, as described above with reference to FIGS. 7 and 8, the memory block BLKa_6 is erased by units of string selection lines SSL1a, SSL1b, SSL2a, SSL2b, SSL3a and SSL3b, and the memory block BLKa_6 is erasure-verified by unit of respective string selection line SSL.

In an embodiment, as described above with reference to FIGS. 15 to 21, the memory block BLKa_6 may be divided into a plurality of sub-blocks in the second direction. The dummy memory cells DMC and the dummy word line DWL may be provided between the sub-blocks. In erasure verification and erasure, the voltages of selected word lines, the voltages of unselected word lines and the voltages of the dummy word line DWL are controlled as described above with reference to FIGS. 15 to 21.

In an embodiment, as described above with reference to FIGS. 22 to 24, the ground selection transistors GSTa and GSTb of different rows may be respectively connected to different ground selection lines GSL1 to GSL3, in the memory block BLKa_6. In erasure verification and erasure, the voltages of the ground selection lines GSL1 to GSL3 are controlled as described above with reference to FIGS. 22 to 24.

Figure 28:
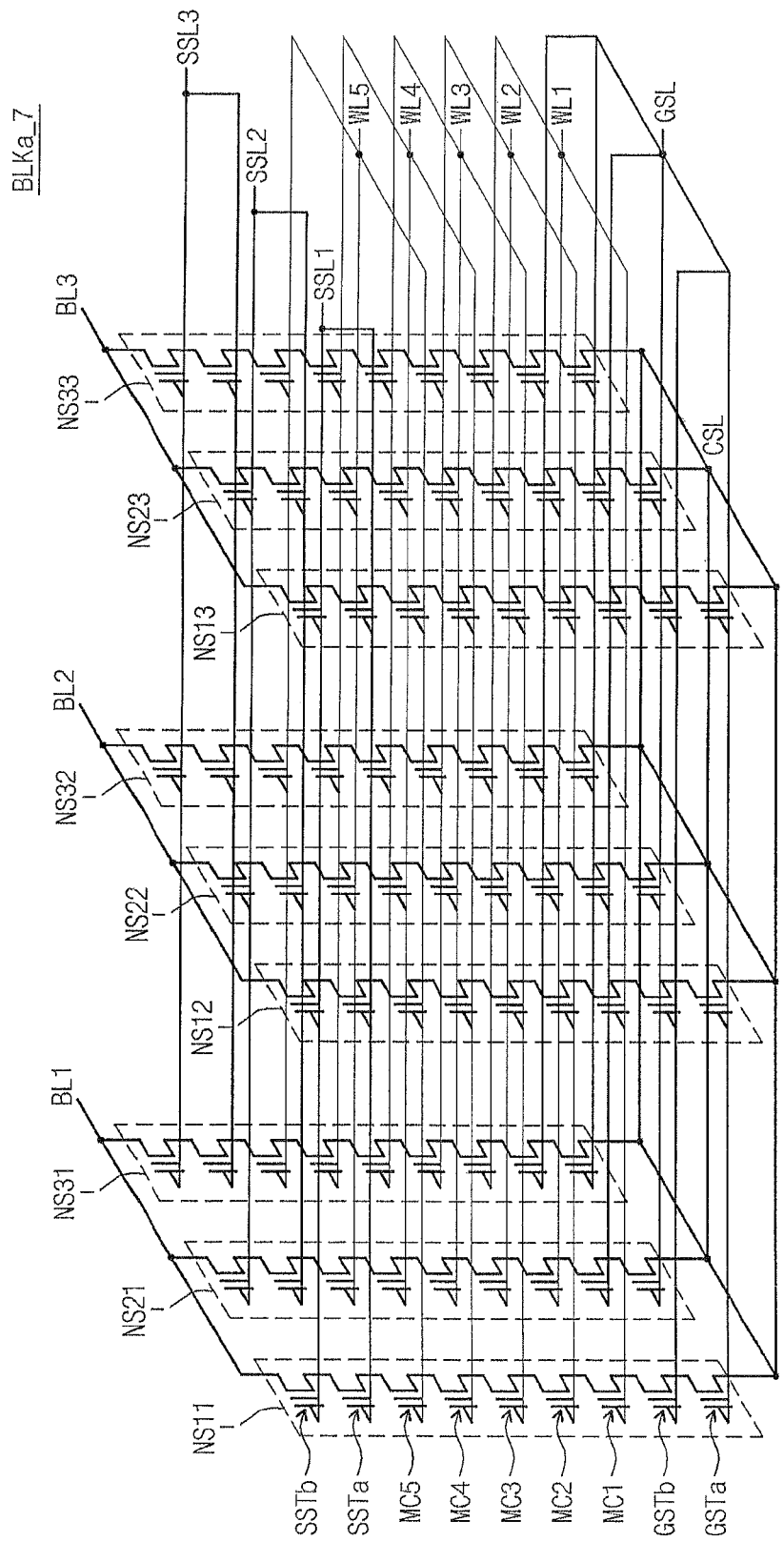
FIG. 28 is a circuit diagram illustrating a memory block according to an embodiment of the inventive concept.

FIG. 28 is a circuit diagram BLKa_7 of the memory block BLKa of FIG. 3 according to an embodiment of the inventive concept. Comparing with the equivalent circuit BLKa_6 of FIG. 27, the string selection transistors SSTa and SSTb of the NAND strings NS of the same row share a string selection line SSL.

As described above with reference to FIG. 27, the number of string selection transistors provided in the each NAND string NS is not limited.

In an embodiment, as described above with reference to FIGS. 7 and 8, the memory block BLKa_7 is erased by units of string selection lines SSL1 to SSL3, and the memory block BLKa_7 is erasure-verified by unit of respective string selection line SSL.

In an embodiment, as described above with reference to FIGS. 15 to 21, the memory block BLKa_7 may be divided into a plurality of sub-blocks in the second direction. The dummy memory cells DMC and the dummy word line DWL may be provided between the sub-blocks. In erasure verification and erasure, the voltages of selected word lines, the voltages of unselected word lines and the voltages of the dummy word line DWL are controlled as described above with reference to FIGS. 15 to 21.

In an embodiment, as described above with reference to FIGS. 22 to 24, the ground selection transistors GST of different rows may be respectively connected to different ground selection lines GSL1 to GSL3, in the memory block BLKa_7. In erasure verification and erasure, the voltages of the ground selection lines GSL1 to GSL3 are controlled as described above with reference to FIGS. 22 to 24.

As described above with reference to FIGS. 26 to 28, the numbers of string selection transistors SST and ground selection transistors GST of each NAND string NS may vary. That is, the number of first conductive materials that are used as the string selection transistors SST and the ground selection transistors GST among the first conductive materials 211 to 291, 212 to 292 and 213 to 293 may vary.

Figure 29:
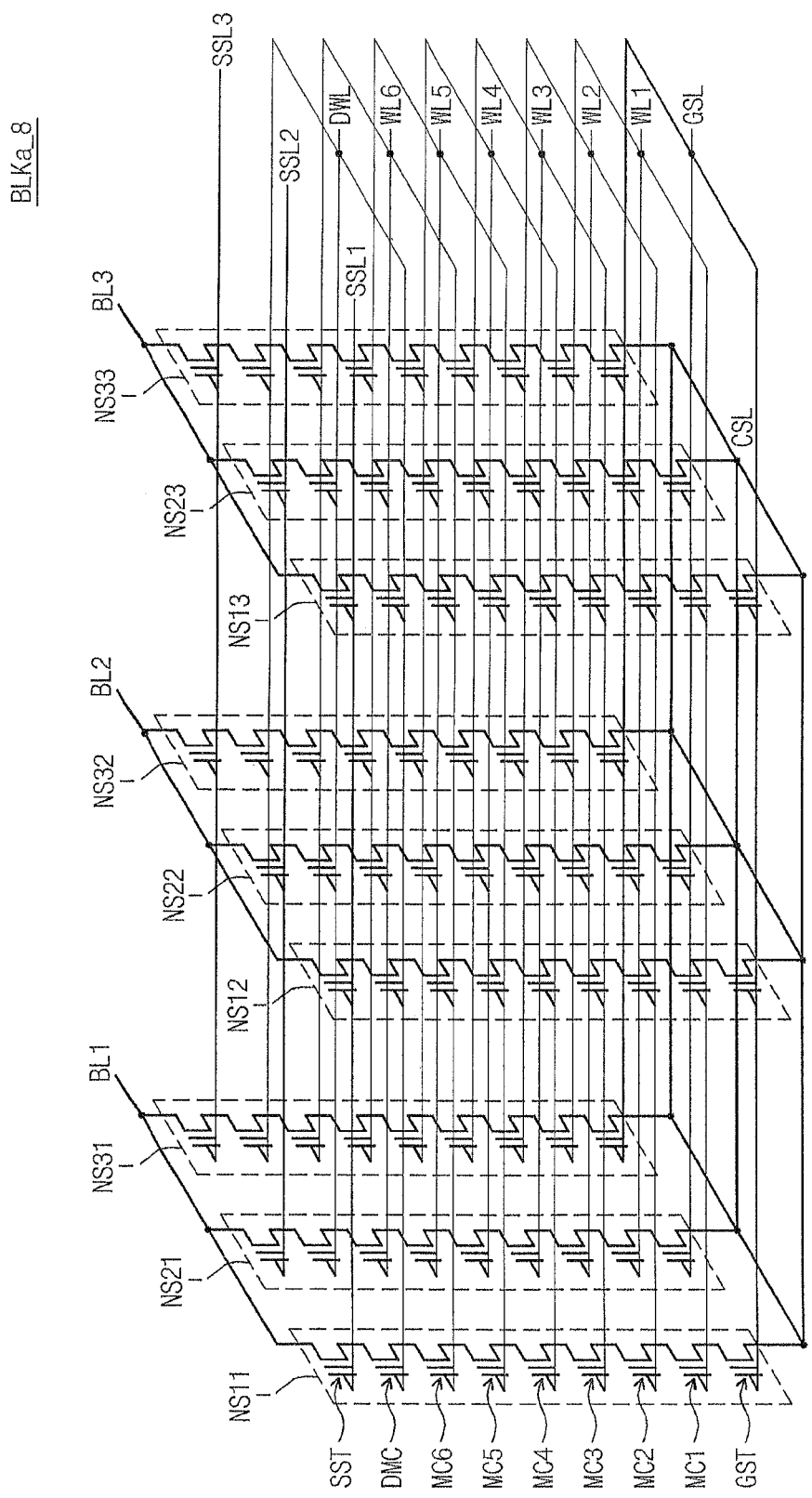
FIG. 29 is a circuit diagram illustrating a memory block according to an embodiment of the inventive concept.

FIG. 29 is a circuit diagram BLKa_8 of the memory block BLKa of FIG. 3 according to an embodiment of the inventive concept. Comparing with the equivalent circuit BLKa_1 of FIG. 6, a dummy memory cell DMC is provided between the string selection transistors SST and the memory cells MC1 to MC6 in each NAND string NS.

The first conductive lines 281 to 283 having the eighth height form the dummy memory cell DMC.

The first conductive lines 281 to 283 having the eighth height form the dummy memory cells DMC. The dummy memory cells DMC are connected to the dummy word line DWL in common. That is, the dummy word line DWL is provided between the string selection lines SSL1 to SSL3 and the word lines WL1 to WL6.

As an example, it has been described above that one dummy memory cell DMC is provided between the memory cells MC1 to MC6 and the string selection transistor SST in the each NAND string NS. However, the number of dummy memory cells DMC provided between the memory cells MC1 to MC6 and the string selection transistor SST is not limited, in the each NAND string NS. For example, two or more dummy memory cells may be provided between the memory cells MC1 to MC6 and the string selection transistor SST, in the each NAND string NS.

In erasure and erasure verification, the voltage of the dummy word line DWL is controlled as described above with reference to FIGS. 15 to 21 according to an embodiment. In erasing, the first dummy word line voltage Vdwl1 is applied to the dummy word line DWL. Therefore, the dummy memory cell DMC is erasure-prohibited. In erasure verification, the second read voltage Vread2 is applied to the dummy word line DWL. Accordingly, the dummy memory cell DMC is turned on.

In an embodiment, as described above with reference to FIGS. 7 and 8, the memory block BLKa_8 is erased by units of the string selection lines SSL1 to SSL3, and the memory block BLK_8 is erasure-verified by unit of respective string selection line SSL.

In an embodiment, as described above with reference to FIGS. 15 to 21, the memory block BLKa_8 may be divided into a plurality of sub-blocks in the second direction. The dummy memory cells DMC and the dummy word line DWL may be provided between the sub-blocks. In erasure verification and erasure, the voltages of selected word lines, the voltages of unselected word lines and the voltages of the dummy word line DWL are controlled as described above with reference to FIGS. 15 to 21.

In an embodiment, as described above with reference to FIGS. 22 to 24, the ground selection transistors GST of different rows may be respectively connected to different ground selection lines GSL1 to GSL3, in the memory block BLKa_8. In erasure verification and erasure, the voltages of the ground selection lines GSL1 to GSL3 are controlled as described above with reference to FIGS. 22 to 24.

As described above with reference to FIGS. 26 to 28, the number of string selection transistors SST and the number of ground selection transistors GST may vary.

Figure 30:
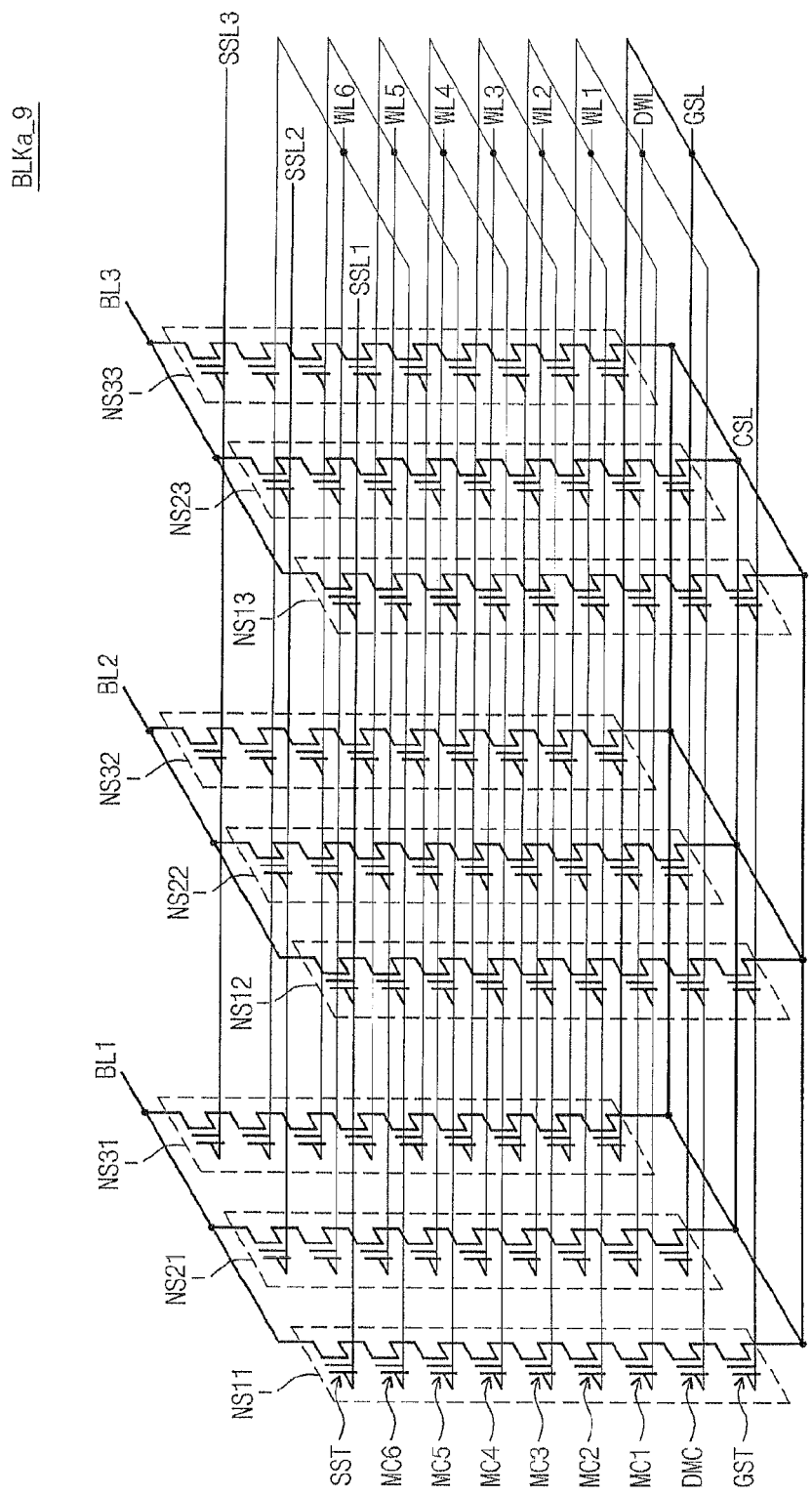
FIG. 30 is a circuit diagram illustrating a memory block according to an embodiment of the inventive concept.

FIG. 30 is a circuit diagram BLKa_9 of the memory block BLKa of FIG. 3 according to an embodiment of the inventive concept. Comparing with the equivalent circuit BLKa_1 of FIG. 6, a dummy memory cell DMC is provided between the ground selection transistors GST and the memory cells MC1 to MC6 in each NAND string NS.

The first conductive lines 221 to 223 having the second height form the dummy memory cells DMC. The dummy memory cells DMC are connected to the dummy word line DWL in common. That is, the dummy word line DWL is provided between the ground selection line GSL and the word lines WL1 to WL6.

In an embodiment, it has been described above that one dummy memory cell DMC is provided between the memory cells MC1 to MC6 and the ground selection transistor GST in the each NAND string NS. However, the number of dummy memory cells DMC provided between the memory cells MC1 to MC6 and the ground selection transistor GST is not limited, in the each NAND string NS. For example, two or more dummy memory cells may be provided between the memory cells MC1 to MC6 and the ground selection transistor GST, in the each NAND string NS.

In erasure and erasure verification, exemplarily, the voltage of the dummy word line DWL is controlled as described above with reference to FIGS. 15 to 21. In erasing, the first dummy word line voltage Vdwl1 is applied to the dummy word line DWL. Therefore, the dummy memory cell DMC is erasure-prohibited. In erasure verification, the second read voltage Vread2 is applied to the dummy word line DWL. Accordingly, the dummy memory cell DMC is turned on.

In an embodiment, as described above with reference to FIGS. 7 and 8, the memory block BLKa_9 is erased by units of the string selection lines SSL1 to SSL3, and the memory block BLKa_9 is erasure-verified by unit of respective string selection line SSL.

In an embodiment, as described above with reference to FIGS. 15 to 21, the memory block BLKa_9 may be divided into a plurality of sub-blocks in the second direction. The dummy memory cells DMC and the dummy word line DWL may be provided between the sub-blocks. In erasure verification and erasure, the voltages of selected word lines, the voltages of unselected word lines and the voltages of the dummy word line DWL are controlled as described above with reference to FIGS. 15 to 21.

In an embodiment, as described above with reference to FIGS. 22 to 24, the ground selection transistors GST of different rows may be respectively connected to different ground selection lines GSL1 to GSL3, in the memory block BLKa_9. In erasure verification and erasure, the voltages of the ground selection lines GSL1 to GSL3 are controlled as described above with reference to FIGS. 22 to 24.

As described above with reference to FIGS. 26 to 28, the number of string selection transistors SST and the number of ground selection transistors GST may vary.

Figure 31:
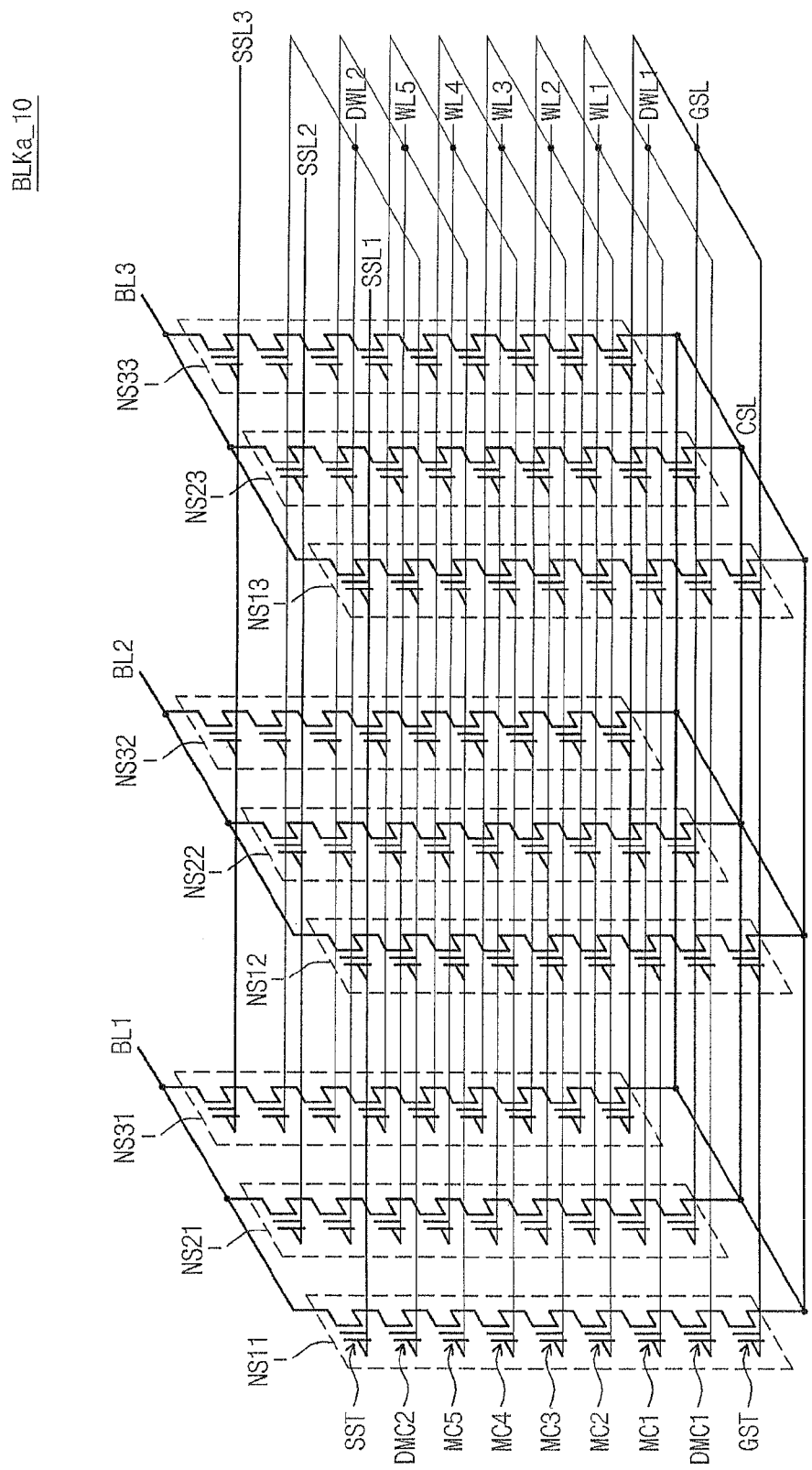
FIG. 31 is a circuit diagram illustrating a memory block of FIG. 3.

FIG. 31 is a circuit diagram BLKa_10 of the memory block BLKa of FIG. 3 according to an embodiment of the inventive concept. Comparing with the equivalent circuit BLKa_1 of FIG. 6, a first dummy memory cell DMC1 is provided between the ground selection transistors GST and the memory cells MC1 to MC5 in each NAND string NS.

The first conductive lines 221 to 223 having the second height form the first dummy memory cells DMC1. The first dummy memory cells DMC1 are connected to the first dummy word line DWL1 in common. That is, the first dummy word line DWL1 is provided between the ground selection line GSL and the word lines WL1 to WL5.

A second dummy memory cell DMC2 is provided between the string selection transistor SST and the memory cells MC1 to MC5, in the each NAND string NS.

The first conductive lines 281 to 283 having the eighth height form the second dummy memory cells DMC2. The second dummy memory cells DMC2 are connected to the second dummy word line DWL2 in common. That is, the first dummy word line DWL1 is provided between the string selection lines SSL1 to SSL3 and the word lines WL1 to WL5.

In an embodiment, it has been described above that one dummy memory cell DMC is provided between the memory cells MC1 to MC5 and the ground selection transistor GST and one dummy memory cell DMC is provided between the memory cells MC1 to MC5 and the string selection transistor SST, in the each NAND string NS. However, the number of dummy memory cells DMC provided between the memory cells MC1 to MC5 and the ground selection transistor GST is not limited, in the each NAND string NS. The number of dummy memory cells DMC provided between the memory cells MC1 to MC6 and the string selection transistor SST is not limited, in the each NAND string NS.

For example, two or more dummy memory cells may be provided between the memory cells MC1 to MC5 and the ground selection transistor GST, in the each NAND string NS. Two or more dummy memory cells may be provided between the memory cells MC1 to MC5 and the string selection transistor SST, in the each NAND string NS.

In erasure and erasure verification, the voltages of the first and second dummy word lines DWL1 and DWL2 are controlled as described above with reference to FIGS. 15 to 21 according to an embodiment. In erasing, the first dummy word line voltage Vdwl1 is applied to the first and second dummy word lines DWL1 and DWL2. Therefore, the first and second dummy memory cells DMC1 and DMC2 are erasure-prohibited. In erasure verification, the second read voltage Vread2 is applied to the first and second dummy word lines DWL1 and DWL2. Accordingly, the first and second dummy memory cells DMC 1 and DMC2 are turned on.

In an embodiment, as described above with reference to FIGS. 7 and 8, the memory block BLKa_10 is erased by units of the string selection lines SSL1 to SSL3, and the memory block BLKa_10 is erasure-verified by unit of respective string selection line SSL.

In an embodiment, as described above with reference to FIGS. 15 to 21, the memory block BLKa_10 may be divided into a plurality of sub-blocks in the second direction. The dummy memory cells DMC and the dummy word line DWL may be provided between the sub-blocks. In erasure verification and erasure, the voltages of selected word lines, the voltages of unselected word lines and the voltages of the dummy word line DWL are controlled as described above with reference to FIGS. 15 to 21.

In an embodiment, as described above with reference to FIGS. 22 to 24, the ground selection transistors GST of different rows may be respectively connected to different ground selection lines GSL1 to GSL3, in the memory block BLKa_10. In erasure verification and erasure, the voltages of the ground selection lines GSL1 to GSL3 are controlled as described above with reference to FIGS. 22 to 24.

As described above with reference to FIGS. 26 to 28, the number of string selection transistors SST and the number of ground selection transistors GST may vary.

Figure 32:
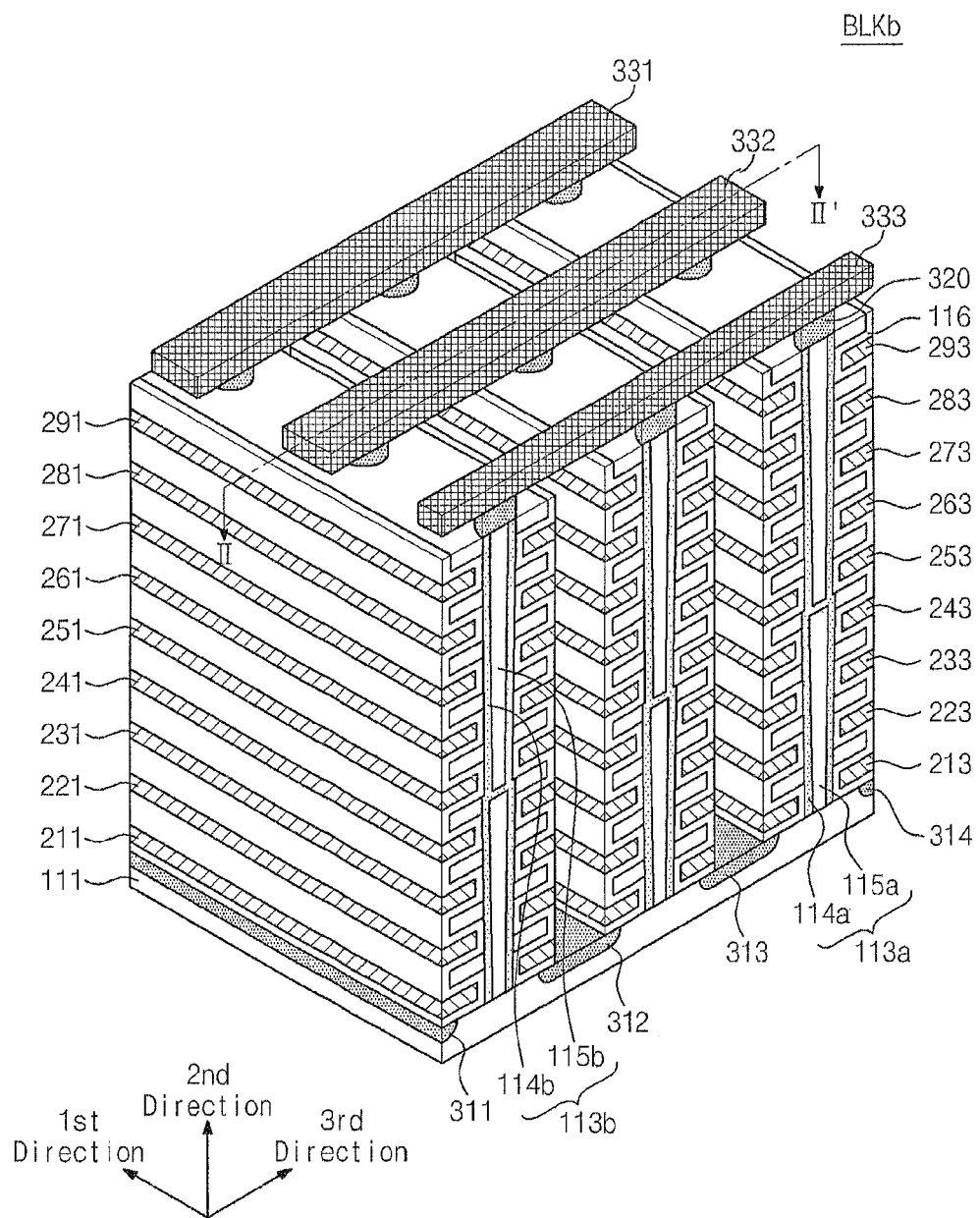
FIG. 32 is a perspective view illustrating a memory block according to an embodiment of the inventive concept.
Figure 33:
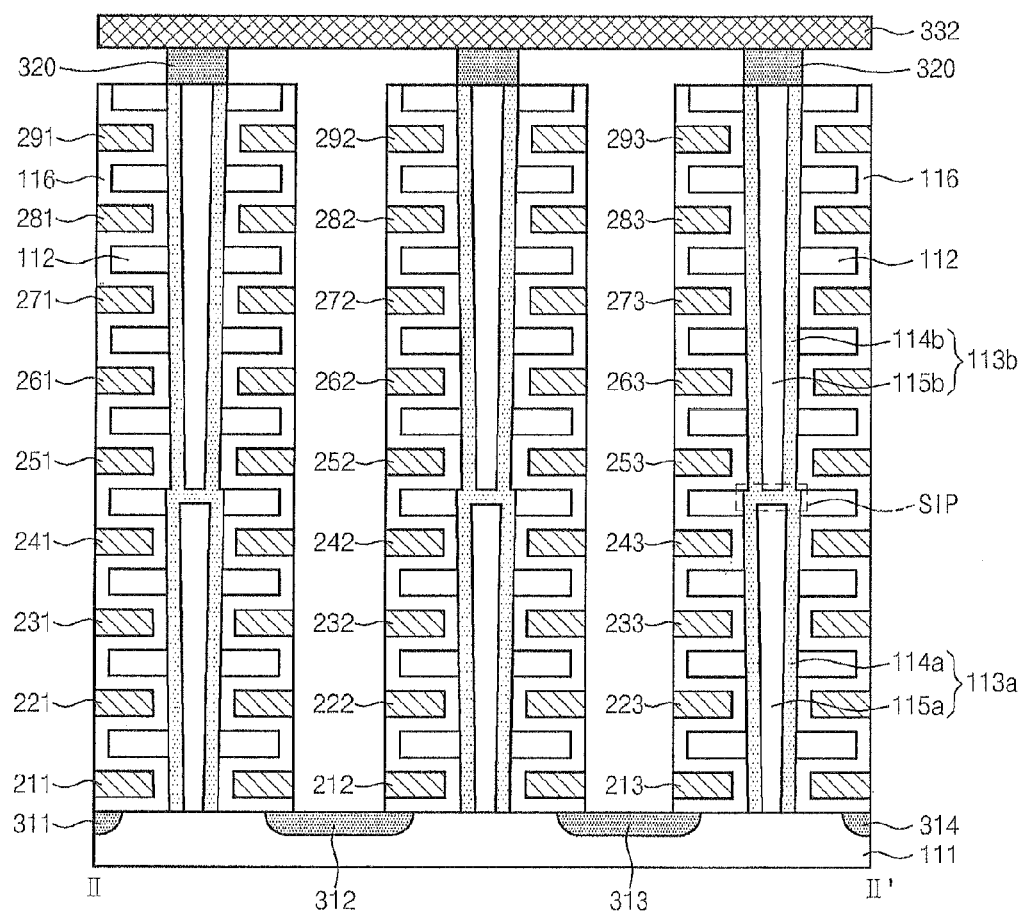
FIG. 33 is a cross-sectional view taken along the line II-II' of FIG. 32.

FIG. 32 is a perspective view illustrating a memory block BLKb according to an embodiment of the inventive concept. FIG. 33 is a cross-sectional view taken along line II-II' of the memory block BLKb of FIG. 32.

Comparing with the memory block BLKa that has been described above with reference to FIGS. 3 and 4, one pillar includes a first sub-pillar 113*a* and a second sub-pillars 113*b*, in the memory block BLKb. The memory block BLKb has substantially the same structure as that of the memory block BLKa, except for that pillar 113 of the memory block BLKa is replaced by the first and second sub-pillars 113*a* and 113*b*.

Referring to FIGS. 32 and 33, the first sub-pillar 113*a* is provided onto the substrate 111. In an embodiment, a surface layer 114*a* of the first sub-pillar 113*a* includes a silicon material having a p type. The surface layer 114*a* of the first sub-pillar 113*a* serves as a second-direction body. An inner layer 115*a* of the first sub-pillar 113*a* comprises an insulating material.

The second sub-pillar 113*b* is provided onto the first sub-pillar 113*a*. In an embodiment, a surface layer 114*b* of the second sub-pillar 113*b* includes a silicon material having a p type. The surface layer 114*b* of the second sub-pillar 113*b* serves as the second-direction body. An inner layer 115*b* of the second sub-pillar 113*b* comprises an insulating material.

In an embodiment, the surface layer 114*a* of the first sub-pillar 113*a* and the surface layer 114*b* of the second sub-pillar 113*b* are connected. For example, as described above with reference to FIGS. 32 and 33, the surface layer 114*a* of the first sub-pillar 113*a* and the surface layer 114*b* of the second sub-pillar 113*b* are connected through a silicon pad SIP having a p type.

In an embodiment, the first conductive materials 251 to 253 having a height (i.e., the fifth height) corresponding to the silicon pad SIP form the dummy word line DWL and the dummy memory cell DMC. For example, when the memory block BLKb is divided into a plurality of sub-blocks in the second direction, it may be divided into sub-blocks with respect to the height corresponding to the silicon pad SIP.

In an embodiment, an equivalent circuit of the memory block BLKb may correspond to one of the equivalent circuits BLKa_1, BLKa_2 and BLKa_3 that have respectively been described above with reference to FIGS. 6, 15 and 22. In an embodiment, an equivalent circuit of the memory block BLKb may correspond to one of the equivalent circuits BLKa_4 to BLKa_10 that have respectively been described above with reference to FIGS. 25 to 31.

As described above with reference to FIGS. 7 and 8, the memory block BLKb is erased, and thereafter erased memory cells MC may be erasure-verified by unit of respective string selection line SSL.

In an embodiment, it has been described above that a pillar includes the first and second sub-blocks 113a and 113b. However, the pillar may include three or more sub-pillars.

Figure 34:
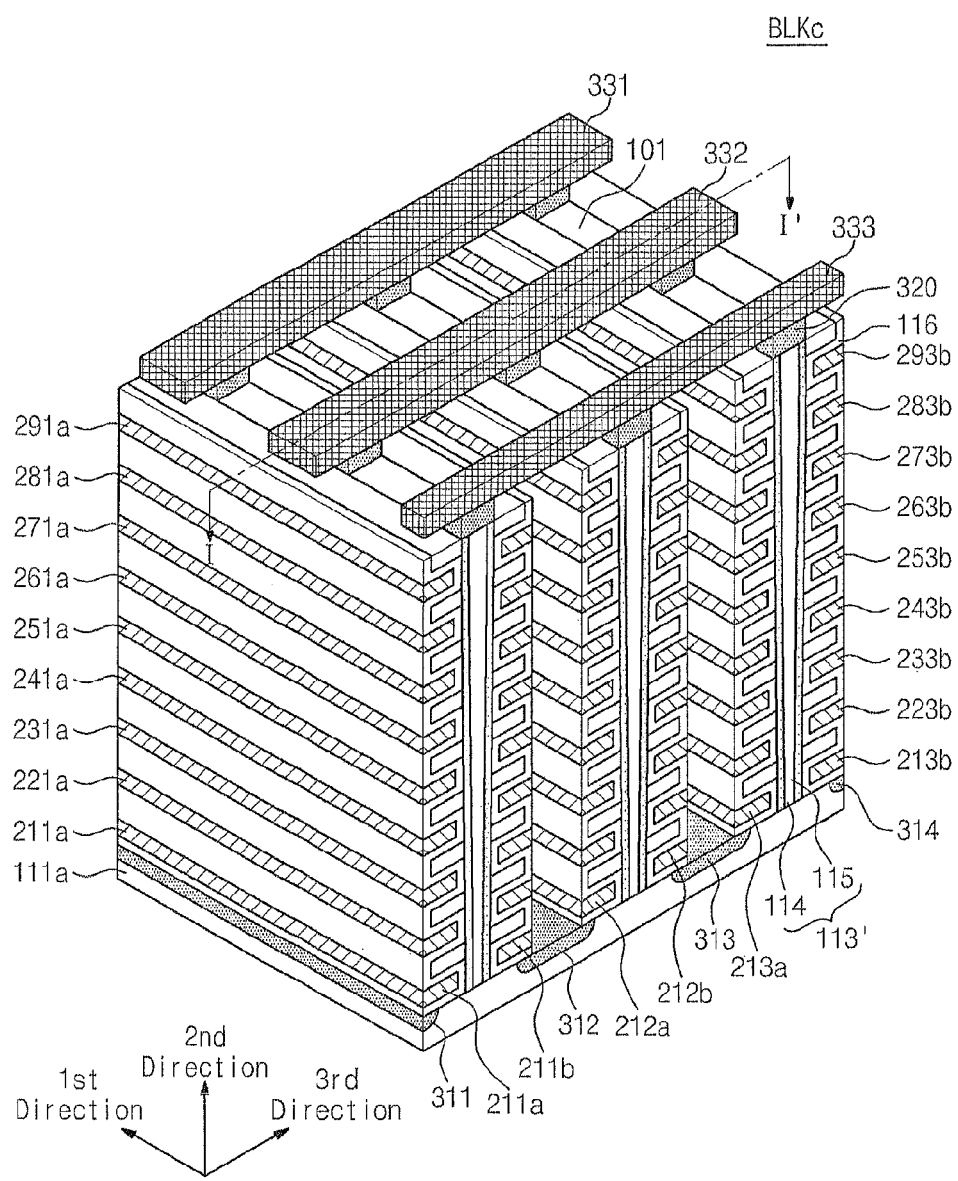
FIG. 34 is a perspective view illustrating a memory block according to an embodiment of the inventive concept.

FIG. 34 is a perspective view illustrating a memory block BLKc according to an embodiment of the inventive concept. A cross-sectional view taken along line I-I' of the memory block BLKc is the same as the cross-sectional view of FIG. 4.

Comparing with the memory block BLKa that has been described above with reference to FIGS. 3 and 4, pillars 113' are provided in the shape of a tetragonal pillar. Also, insulating materials 101 are provided between the pillars 113' that are disposed to be spaced a certain distance apart in the first direction. In an embodiment, the insulating materials 101 may be extended in the second direction and contact the substrate 111.

The first conductive materials 211 to 291, 212 to 292 and 213 to 293 that have been described above with reference to FIG. 3 may be divided into first portions 211a to 291a, 212a to 292a and 213a to 293a and second portions 211b to 291b, 212b to 292b and 213b to 293b in a region where the insulating materials 101 are provided, respectively.

In a region on the first and second doping regions 311 and 312, each of the pillars 113', the first portions 211a to 291a of first conductive materials and the insulation layer 116 may form one NAND string NS, and each of the pillars 113', the second portions 211b to 291b of the first conductive materials and the insulation layer 116 may form another NAND string NS.

In a region on the second and third doping regions 312 and 313, each of the pillars 113', the first portions 212a to 292a of first conductive materials and the insulation layer 116 may form one NAND string NS, and each of the pillars 113', the second portions 212b to 292b of the first conductive materials and the insulation layer 116 may form another NAND string NS.

In a region on the third and fourth doping regions 313 and 314, each of the pillars 113', the first portions 213a to 293a of first conductive materials and the insulation layer 116 may form one NAND string NS, and each of the pillars 113', the second portions 213b to 293b of the first conductive materials and the insulation layer 116 may form another NAND string NS.

That is, by dividing the first and second portions 211a to 291a and 211b to 291b of the first conductive materials that are provided to the both-side surfaces of the each pillar 113' with the insulating material 101, the each pillar 113' may form two NAND strings NS.

As described above with reference to FIGS. 3 to 6, the first portions 211a to 291a and second portions 211b to 291b, 212b to 292b and 213b to 293b of the first conductive materials correspond to the ground word lines GSL, the word lines WL and the string selection lines SSL, respectively. Word lines WL having the same height are connected in common.

In an embodiment, an equivalent circuit of the memory block BLKc may correspond to one of the equivalent circuits BLKa_1, BLKa_2 and BLKa_3 that have respectively been described above with reference to FIGS. 6, 15 and 22, except for the number of rows of NAND strings NS. For example, the number of rows of NAND strings NS in the equivalent circuit of the memory block BLKc may be two times the number of rows of NAND strings NS in the equivalent circuits BLKa_1, BLKa_2 and BLKa_3 that have respectively been described above with reference to FIGS. 6, 15 and 22.

In an embodiment, the equivalent circuit of the memory block BLKc may correspond to one of the equivalent circuits BLKa_4 to BLKa_10 that have respectively been described above with reference to FIGS. 25 to 31, except for the number of rows of NAND strings NS. For example, the number of rows of NAND strings NS in the equivalent circuit of the memory block BLKc may be two times the number of rows of NAND strings NS in the equivalent circuits BLKa_4 to BLKa_10 that have respectively been described above with reference to FIGS. 25 to 31.

As described above with reference to FIGS. 7 and 8, the memory block BLKc is erased, and thereafter erased memory cells MC may be erasure-verified by unit of respective string selection line SSL.

Figure 35:
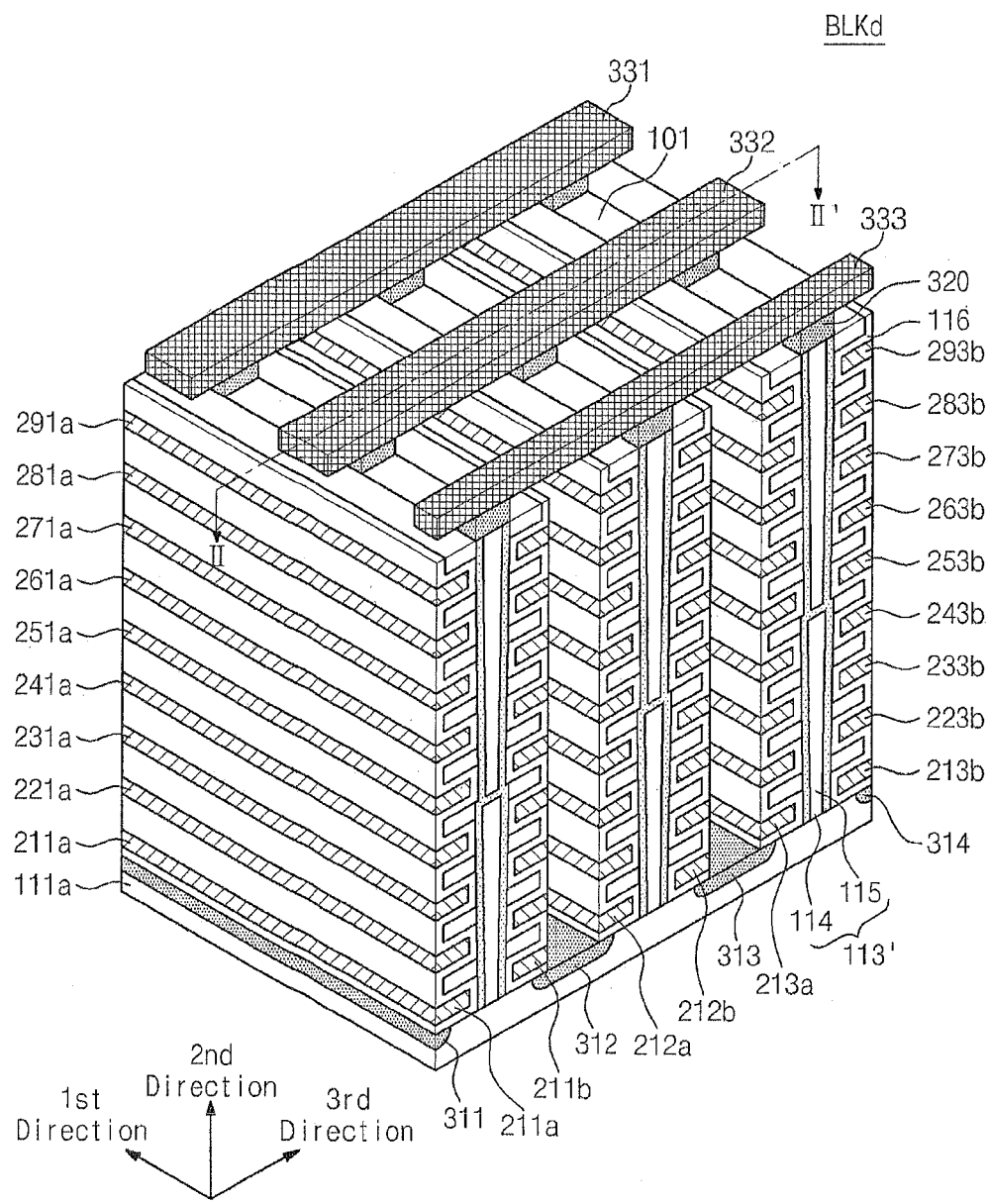
FIG. 35 is a perspective view illustrating a memory block according to an embodiment of the inventive concept.

FIG. 35 is a perspective view illustrating a memory block BLKd according to an embodiment of the inventive concept. A cross-sectional view taken along line II-II' of a memory block BLKd is the same as the cross-sectional view of FIG. 33. Except for that a pillar of the memory block BLKd includes the first and second sub-pillars 113a and 113b, the memory block BLKd is substantially the same as the memory block BLKc that has been described above with reference to FIG. 34.

As described above with reference to FIGS. 32 and 33, one pillar includes first and second pillars 113a and 113b, in the memory block BLKd. Except for having the structure of a tetragonal pillar shape, the first and second pillars 113a and 113b have substantially the same structures as those of the first and second pillars 113a and 113b that have been described above with reference to FIGS. 32 and 33, respectively.

As described above with reference to FIGS. 34, one pillar 113' forms two NAND strings NS. The first portions 211a to 291a and second portions 211b to 291b, 212b to 292b and 213b to 293b of the first conductive materials correspond to the ground word lines GSL, the word lines WL and the string selection lines SSL, respectively. Word lines WL having the same height are connected in common.

In an embodiment, an equivalent circuit of the memory block BLKd may correspond to one of the equivalent circuits BLKa_1, BLKa_2 and BLKa_3 that have respectively been described above with reference to FIGS. 6, 15 and 22, except for the number of rows of NAND strings NS. For example, the number of rows of NAND strings NS in the equivalent circuit of the memory block BLKd may be two times the number of rows of NAND strings NS in the equivalent circuits BLKa_1, BLKa_2 and BLKa_3 that have respectively been described above with reference to FIGS. 6, 15 and 22.

In an embodiment, the equivalent circuit of the memory block BLKd may correspond to one of the equivalent circuits BLKa_4 to BLKa_10 that have respectively been described above with reference to FIGS. 25 to 31, except for the number of rows of NAND strings NS. For example, the number of rows of NAND strings NS in the equivalent circuit of the memory block BLKd may be two times the number of rows of NAND strings NS in the equivalent circuits BLKa_4 to BLKa_10 that have respectively been described above with reference to FIGS. 25 to 31.

As described above with reference to FIGS. 7 and 8, the memory block BLKc is erased, and thereafter erased memory cells MC may be erasure-verified by unit of respective string selection line SSL.

In an embodiment, it has been described above that the pillar includes the first and second pillars 113a and 113b. However, the pillar may include three or more sub-pillars.

Figure 36:
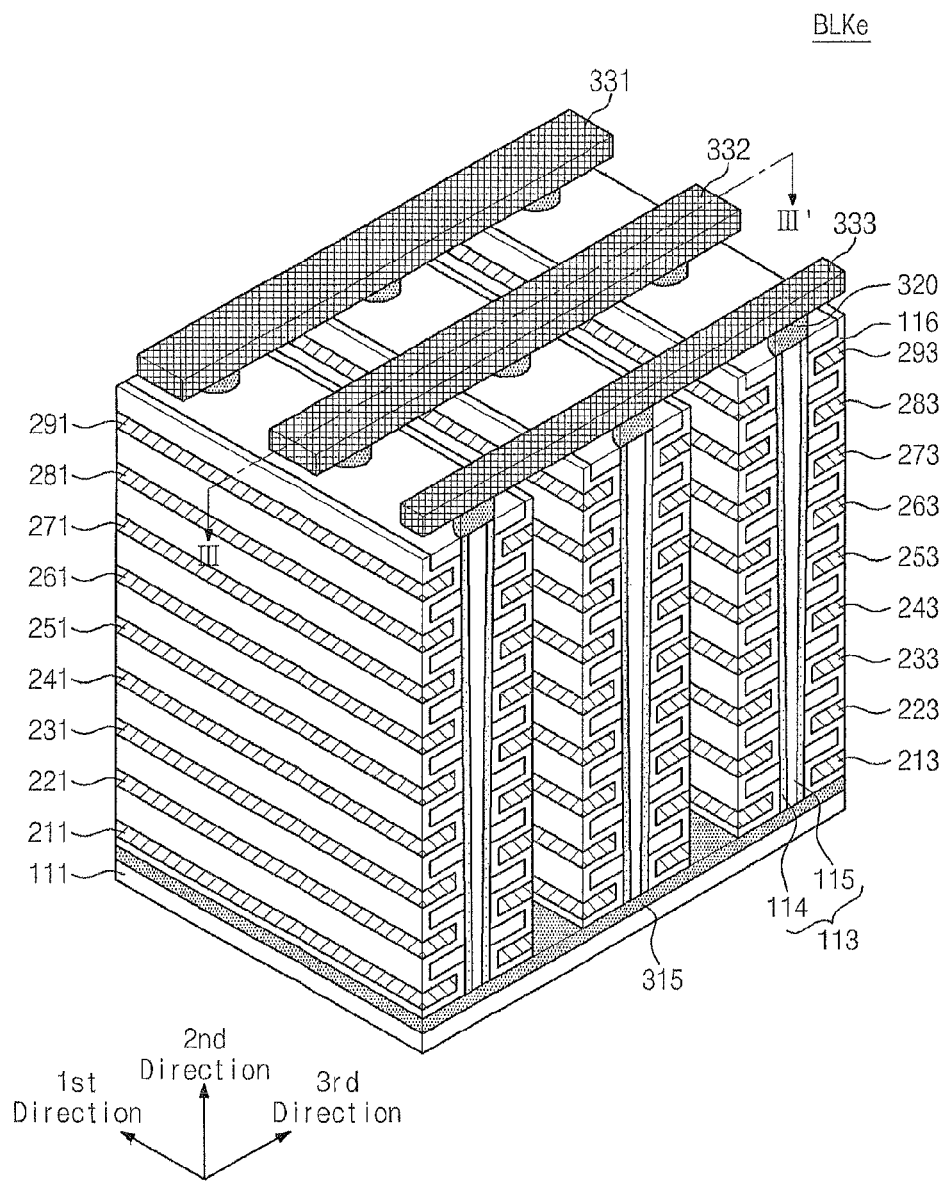
FIG. 36 is a perspective view illustrating a memory block according to an embodiment of the inventive concept.
Figure 37:
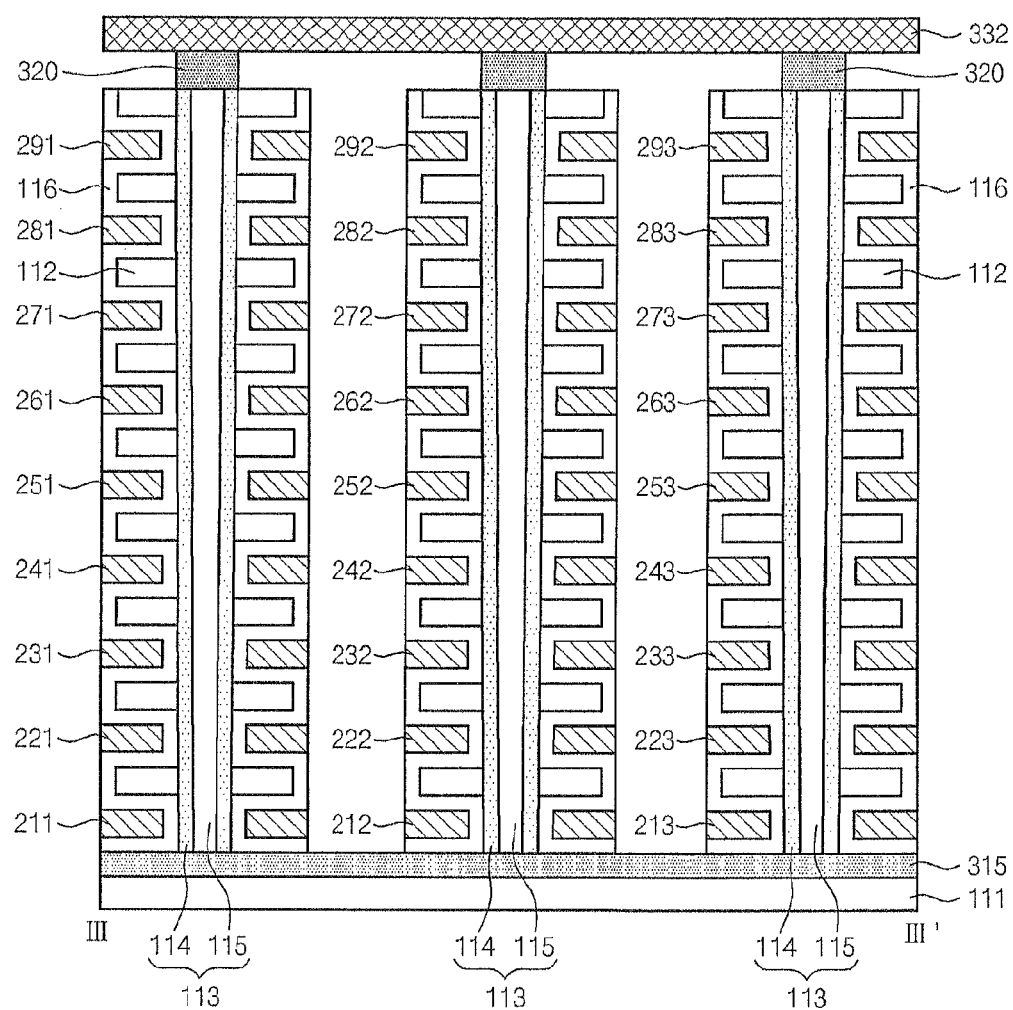
FIG. 37 is a cross-sectional view taken along the line III-III' of FIG. 36.

FIG. 36 is a perspective view illustrating a memory block BLKe according to an embodiment of the inventive concept. FIG. 37 is a cross-sectional view taken along line III-III' of FIG. 36.

Referring to FIGS. 33 and 34, a memory block BLKe has substantially the same structure as that of the memory block BLKa that has been described above with reference to FIGS. 3 and 4, except that the n-type doping region 315 forming the common source line CSL is provided in a plate shape. In an embodiment, the n-type doping region 315 may be provided as an n-type well.

As described above with reference to FIGS. 3 to 6, the first conductive materials 211 to 291, 212 to 292 and 213 to 293 correspond to the ground word lines GSL, the word lines WL and the string selection lines SSL, respectively. Word lines WL having the same height are connected in common.

In an embodiment, an equivalent circuit of the memory block BLKe may correspond to one of the equivalent circuits BLKa_1, BLKa_2 and BLKa_3 that have respectively been described above with reference to FIGS. 6, 15 and 22. For example, the equivalent circuit of the memory block BLKe may correspond to one of the equivalent circuits BLKa_4 to BLKa_10 that have respectively been described above with reference to FIGS. 25 to 31.

As described above with reference to FIGS. 7 and 8, the memory block BLKe is erased, and thereafter erased memory cells MC may be erasure-verified by unit of respective string selection line SSL.

Figures 38, 39:
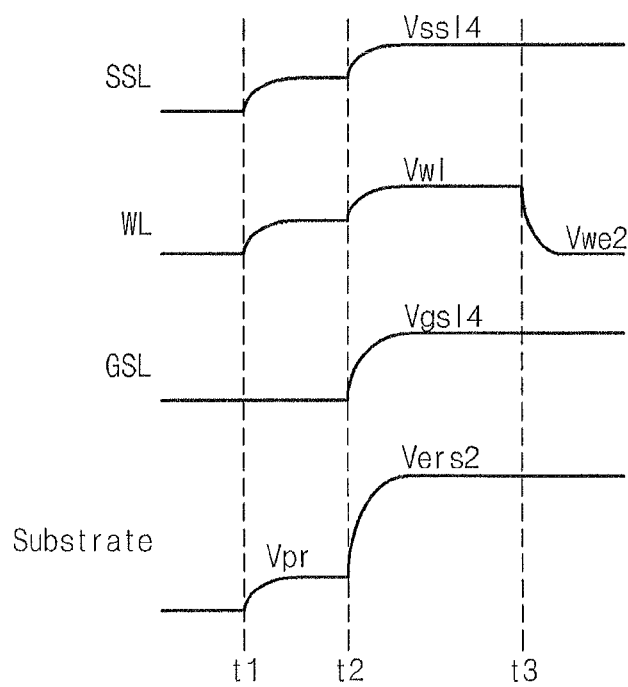
FIG. 38 is a table showing voltage conditions in an erasure operation of a memory block of FIGS. 36 and 37 according to an embodiment of the inventive concept.
FIG. 39 is a timing diagram showing the voltage shift of a memory block of FIGS. 36 and 37 based on the voltage conditions of FIG. 38.

FIG. 38 is a table showing voltage conditions in the erasure of the memory block BLKe of FIGS. 36 and 37 according to an embodiment of the inventive concept.

FIG. 38 shows voltage conditions when the equivalent circuit of the memory block BLKe corresponds to the equivalent circuit BLKa_1 that has been described above with reference to FIG. 6.

Referring to FIGS. 6 and 36 to 38, the string selection transistors SSL1 to SSL3 are floated in erasure. The word lines WL1 to WL7 are floated, and thereafter they are driven to a second word line voltage Vwe2. The ground selection line GSL is driven to the ground voltage Vss and floated. Furthermore, the substrate 111 is driven to a pre-voltage Vpr and driven to the second erasure voltage Vers2.

Figure 40:
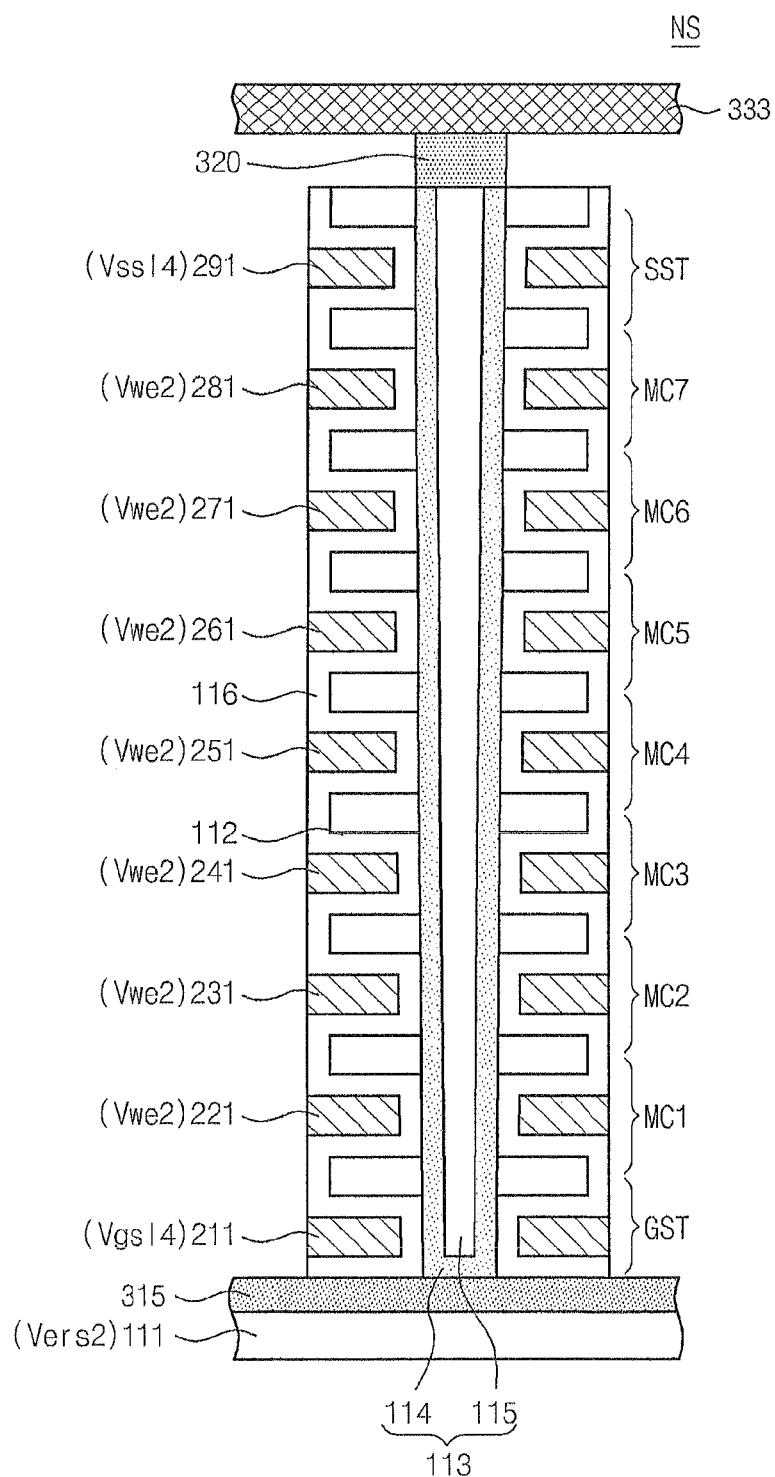
FIG. 40 is a cross-sectional view illustrating one NAND string of a memory block based on the voltage shift of FIG. 39.

FIG. 39 is a timing diagram showing the voltage shift of the memory block BLKe of FIGS. 36 and 37 based on the voltage conditions of FIG. 38. FIG. 40 is a cross-sectional view illustrating one NAND string NS of the memory block BLKe based on the voltage shift of FIG. 39. FIG. 40 is a cross-sectional view corresponding to the NAND string NS13 of the first row, third column of the memory block BLKa_1 according to an embodiment.

Referring to FIGS. 6 and 36 to 40, the pre-voltage Vpr is applied to the substrate 111 at a first time t1. In an embodiment, the substrate 111 includes a p-type silicon material, and the doping region 315 includes an n-type silicon material. The substrate 111 and the doping region 315 form a forward bias condition, and thus the pre-voltage Vpr is transferred to the doping region 315 through the substrate 111. For example, the pre-voltage Vpr may be a high voltage.

The ground voltage Vss is applied to the ground selection line GSL. The ground voltage Vss is applied to the gate (or control gate) of the ground selection transistor GST, and the pre-voltage Vpr is applied to a source. Since the pre-voltage Vpr is a high voltage, thermal electrons are generated in the ground selection transistor GST. For example, the thermal electrons may be generated by Gate Induced Drain Leakage (GIDL) in the ground selection transistor GST. The generated thermal electrons are transferred from the doping region 315 to the surface layer 114 serving as a second-direction body. Therefore, the voltage of the surface layer 114 increases.

The word lines WL1 to WL7 are floated. Therefore, the voltages of the word lines WL1 to WL7 increase by coupling due to the voltage increase of the surface layer 114.

The string selection lines SSL1 to SSL3 are floated. Therefore, the voltages of the string selection lines SSL1 to SSL3 increase by coupling due to the voltage increase of the surface layer 114.

The second erasure voltage Vers2 is applied to the substrate 111 at a second time t2. The second erasure voltage Vers2 is transferred to the doping region 315.

The ground selection line GSL is floated. Therefore, the voltage of the ground selection line GSL increases by coupling due to the voltage increase of the surface layer 114. For example, the voltage of the ground selection line GSL may increase by a fourth ground selection line voltage Vgsl4.

Thermal electrons are generated in the ground selection transistor GST by a difference between the second erasure voltage Vers2 and the fourth ground selection line voltage Vgsl4. For example, the thermal electrons may be generated by GIDL in the ground selection transistor GST. The generated thermal electrons are injected into the surface layer 114, and thereby the voltage of the surface layer 114 increases.

The word lines WL1 to WL7 are floated. Therefore, the voltages of the word lines WL1 to WL7 increase by coupling due to the voltage increase of the surface layer 114. For example, the voltages of the word lines WL1 to WL7 increase to a word line voltage Vwl.

The string selection lines SSL1 to SSL3 are floated. Therefore, the voltages of the string selection lines SSL1 to SSL3 increase by coupling due to the voltage increase of the surface layer 114. For example, the voltages of the string selection lines SSL1 to SSL3 increase a fourth string selection line voltage Vssl4.

A second word line erasure voltage Vew2 is applied to the word lines WL1 to WL7 at a third time t3. For example, the second word line erasure voltage Vew2 is a low voltage. For example, the second word line erasure voltage Vew2 is the ground voltage Vss. In this case, the voltage of the surface layer 114 is a high voltage. Therefore, F-N tunneling occurs in the memory cells of a selected sub-block. The memory cells MC1 to MC7 of the memory block BLKe are erased by F-N tunneling.

The voltage of the ground selection line GSL has the level of a fourth ground selection line voltage Vgsl4. In an embodiment, the fourth ground selection line voltage Vgsl4 may be a voltage that is generated by coupling due to the voltage increase of the surface layer 114. For example, the fourth ground selection line voltage Vgsl4 may be a high voltage. In an embodiment, the level of the second ground selection line voltage Vgsl2 is set so that F-N tunneling does not occur in the ground selection transistor GST. For example, by controlling a time when the ground selection line GSL is floated, the level of the fourth ground selection line voltage Vgsl4 may be adjusted. Therefore, the ground selection transistor GST is erasure-prohibited.

The voltages of the string selection lines SSL1 to SSL3 have the level of the fourth string selection line voltage Vssl4. In an embodiment, the fourth string selection line voltage Vssl4 may be a voltage that is generated by coupling due to the voltage increase of the surface layer 114. For example, the fourth string selection line voltage Vssl4 may be a high voltage. In an embodiment, the fourth string selection line voltage Vssl4 may prevent F-N tunneling from occurring in the string selection transistor SST. Therefore, the string selection transistors SST are erasure-prohibited.

When the equivalent circuit of the memory block BLKe corresponds to the equivalent circuit BLKa_1 that has been described above with reference to FIG. 6, the erasure verification of the memory block BLKe is performed in the same scheme as erasure verification that has been described above with reference to FIGS. 12 to 14.

FIG. 41 is a table showing a second embodiment of voltage conditions in erasure of the memory block BLKe of FIGS. 36 and 37. FIG. 41 shows voltage conditions when the equivalent circuit of the memory block BLKe corresponds to the equivalent circuit BLKa_2 that has been described above with reference to FIG. 15. Exemplarily, it is assumed that a first sub-block is selected and a second sub-block is not selected.

Referring to FIGS. 15, 36, 37 and 41, the string selection lines SSL1 to SSL3 are floated in an erasing operation. The word lines WL4 to WL6 of an unselected sub-block are floated. The word lines WL1 to WL3 of a selected sub-block are floated and driven to the second word line erasure voltage Vwe2. A second dummy word line voltage Vdwl2 is applied to the dummy word line DWL. The ground selection line GSL is driven to the ground voltage Vss and floated. Furthermore, the substrate 111 is driven to the pre-voltage Vpr and driven to the second erasure voltage Vers2.

Figure 42:
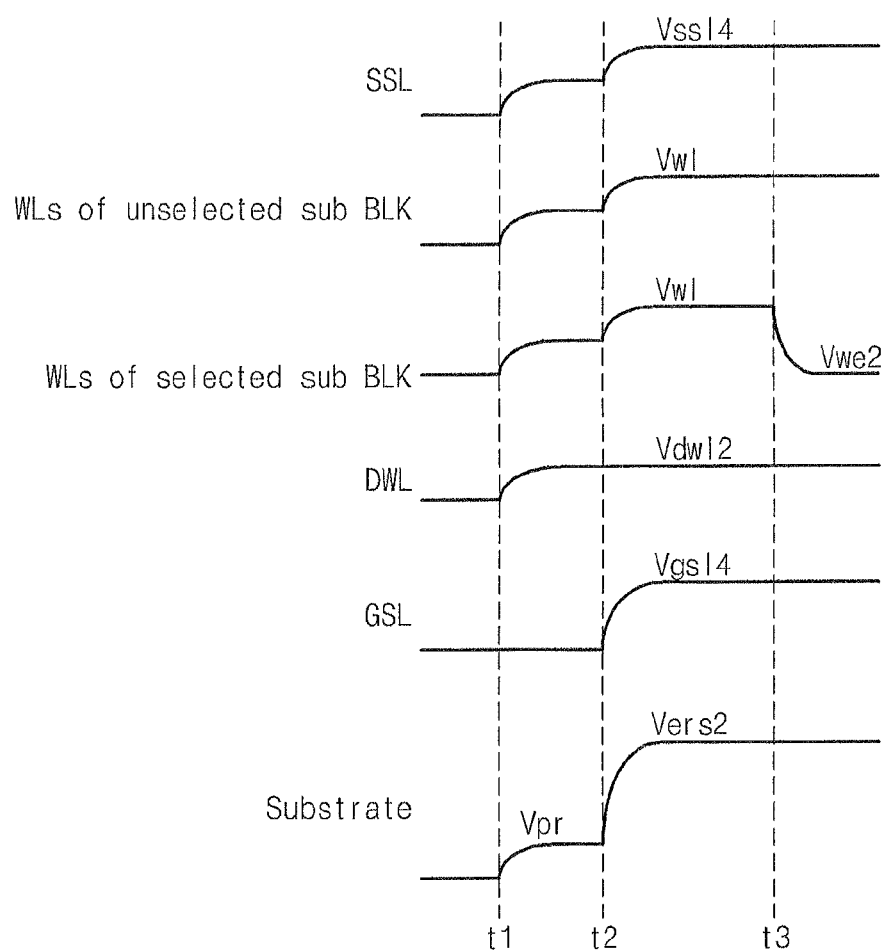
FIG. 42 is a timing diagram showing the voltage shift of a memory block of FIGS. 36 and 37 based on the voltage conditions of FIG. 41.
Figure 43:
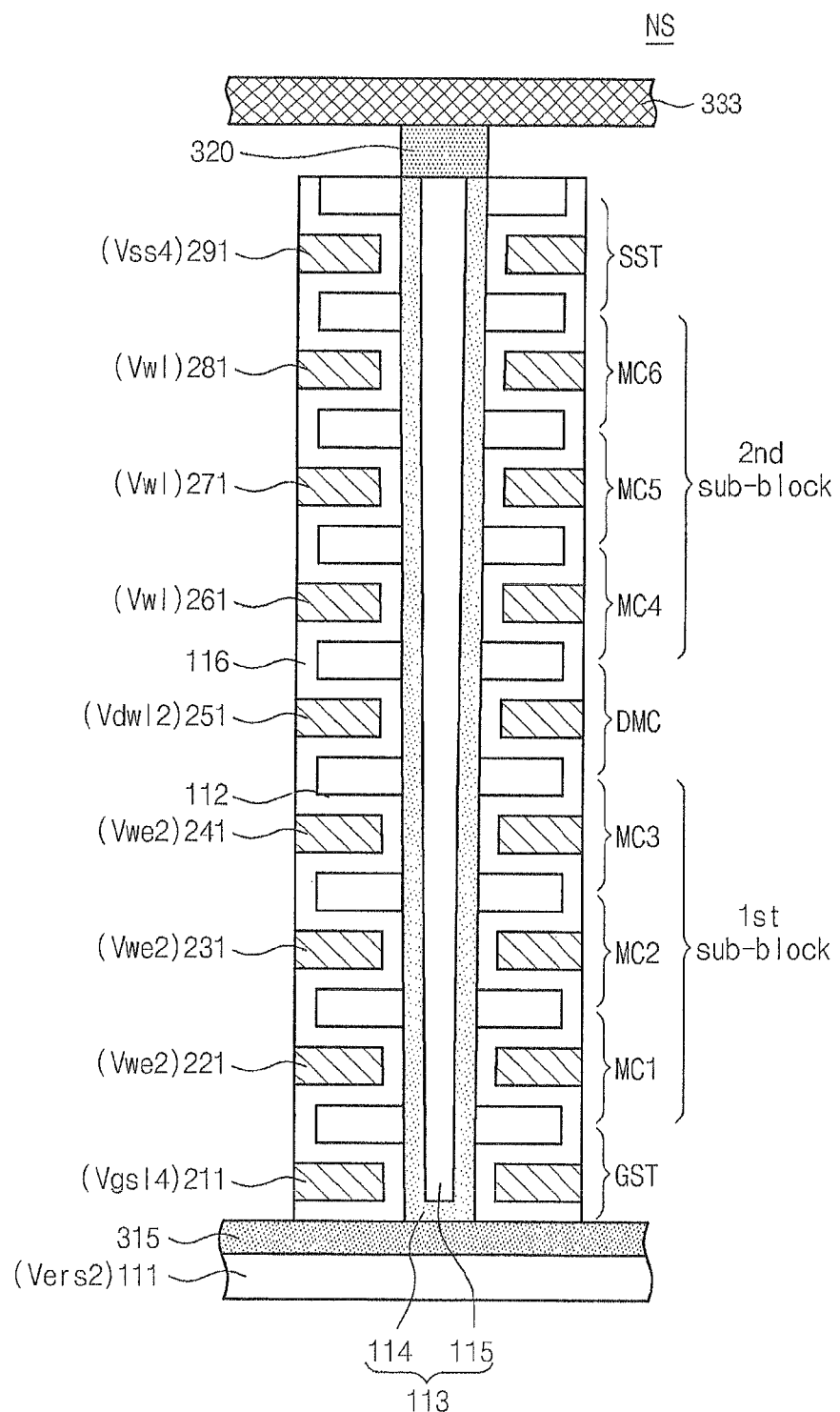
FIG. 43 is a cross-sectional view illustrating one NAND string of a memory block based on the voltage shift of FIG. 42.

FIG. 42 is a timing diagram showing the voltage shift of the memory block BLKe of FIGS. 36 and 37 based on the voltage conditions of FIG. 41. FIG. 43 is a cross-sectional view illustrating one NAND string NS of the memory block BLKe based on the voltage shift of FIG. 42. FIG. 40 is a cross-sectional view corresponding to the NAND string NS13 of the first row, third column of the memory block BLKa_2.

Referring to FIGS. 15, 36, 37 and 41 to 43, the pre-voltage Vpr is applied to the substrate 111 at a first time t1. The pre-voltage Vpr is transferred to the doping region 315 through the substrate 111. For example, the pre-voltage Vpr may be a high voltage.

The ground voltage Vss is applied to the ground selection line GSL. Thermal electrons are generated in the ground selection transistor GST by a voltage difference between the pre-voltage Vpr and the ground voltage Vss. The generated thermal electrons are transferred from the doping region 315 to the surface layer 114. Therefore, the voltage of the surface layer 114 increases.

The word lines WL1 to WL3 of the selected sub-block and the word lines WL4 to WL6 of the unselected sub-block are floated. Therefore, the voltages of the word lines WL1 to WL3 of the selected sub-block and the voltages of the word lines WL4 to WL6 of the unselected sub-block increase by coupling due to the voltage increase of the surface layer 114.

The second dummy word line voltage Vdwl2 is applied to the dummy word line DWL.

The string selection lines SSL1 to SSL3 are floated. Therefore, the voltages of the string selection lines SSL1 to SSL3 increase by coupling due to the voltage increase of the surface layer 114.

The second erasure voltage Vers2 is applied to the substrate 111 at a second time t2. The second erasure voltage Vers2 is transferred to the doping region 315.

The ground selection line GSL is floated. Therefore, the voltage of the ground selection line GSL increases by coupling due to the voltage increase of the surface layer 114. For example, the voltage of the ground selection line GSL may increase by a fourth ground selection line voltage Vgsl4.

Thermal electrons are generated in the ground selection transistor GST by a difference between the second erasure voltage Vers2 and the fourth ground selection line voltage Vgsl4. The generated thermal electrons are injected into the surface layer 114, and thereby the voltage of the surface layer 114 increases.

The word lines WL1 to WL3 of the selected sub-block and the word lines WL4 to WL6 of the unselected sub-block are floated. Therefore, the voltages of the word lines WL1 to WL3 of the selected sub-block and the voltages of the word lines WL4 to WL6 of the unselected sub-block increase by coupling due to the voltage increase of the surface layer 114. For example, the voltages of the word lines WL1 to WL3 of the selected sub-block and the voltages of the word lines WL4 to WL6 of the unselected sub-block increase to the word line voltage Vwl.

The string selection lines SSL1 to SSL3 are floated. Therefore, the voltages of the string selection lines SSL1 to SSL3 increase by coupling due to the voltage increase of the surface layer 114. For example, the voltages of the string selection lines SSL1 to SSL3 increase the fourth string selection line voltage Vssl4.

The second word line erasure voltage Vew2 is applied to the word lines WL1 to WL3 of the selected sub-block at a third time t3. For example, the second word line erasure voltage Vew2 is a low voltage. For example, the second word line erasure voltage Vew2 is the ground voltage Vss. In this case, the voltage of the surface layer 114 is a high voltage. Therefore, F-N tunneling occurs in the memory cells of the selected sub-block. The memory cells MC1 to MC3 of the selected sub-block are erased by F-N tunneling.

The voltages of the word lines WL4 to WL6 of the unselected sub-block have the level of the word line voltage Vwl. Exemplarily, the word line voltage Vwl may be a voltage that is generated by coupling due to the voltage increase of the surface layer 114. For example, the word line voltage Vwl may be a high voltage. For example, the word line voltage Vwl may prevent F-N tunneling from occurring in the memory cells MC4 to MC6 of the unselected sub-block. Therefore, the memory cells MC4 to MC6 of the unselected sub-block are erasure-prohibited.

The voltage of the ground selection line GSL has the level of the fourth ground selection line voltage Vgsl4. Therefore, the ground selection transistor GST is erasure-prohibited.

The voltage of the string selection line SSL has the level of the fourth string selection line voltage Vssl4. Therefore, the string selection transistor SST is erasure-prohibited.

The voltage of the dummy word line DWL is maintained as the second dummy word line voltage Vdwl2 at the second to third times t1 to t3. Exemplarily, the level of the second dummy word line voltage Vdwl2 is set so that F-N tunneling can be prevented in the dummy memory cell DMC. Therefore, the dummy memory cell DMC is erasure-prohibited.

In an embodiment, the second dummy word line voltage Vdwl2 may have a level between the second erasure voltage Vers2 and the second word line erasure voltage Vwe2. For example, the second dummy word line voltage Vdwl2 may have a level between the word line voltage Vwl and the second word line erasure voltage Vwe2.

In an embodiment, the dummy word line DWL may be floated in erasing. The voltage of the dummy word line DWL increases by coupling due to the voltage increase of the surface layer 114. Therefore, when the dummy word line DWL is floated, the dummy memory cells DMC are erasure-prohibited.

In the above-described embodiment of the inventive concept, it has been described above that the word lines WL4 to WL6 of the unselected sub-block are floated. However, an erasure prohibition voltage may be applied to the word lines WL4 to WL6 of the unselected sub-block. The level of the erasure prohibition voltage may be set so that F-N tunneling will not be prevented in the word lines WL4 to WL6 of the unselected sub-block.

When the equivalent circuit of the memory block BLKe corresponds to the equivalent circuit BLKa_2 that has been described above with reference to FIG. 15, the erasure verification of the memory block BLKe is performed in the same scheme as erasure verification that has been described above with reference to FIGS. 19 to 21.

Figure 44:
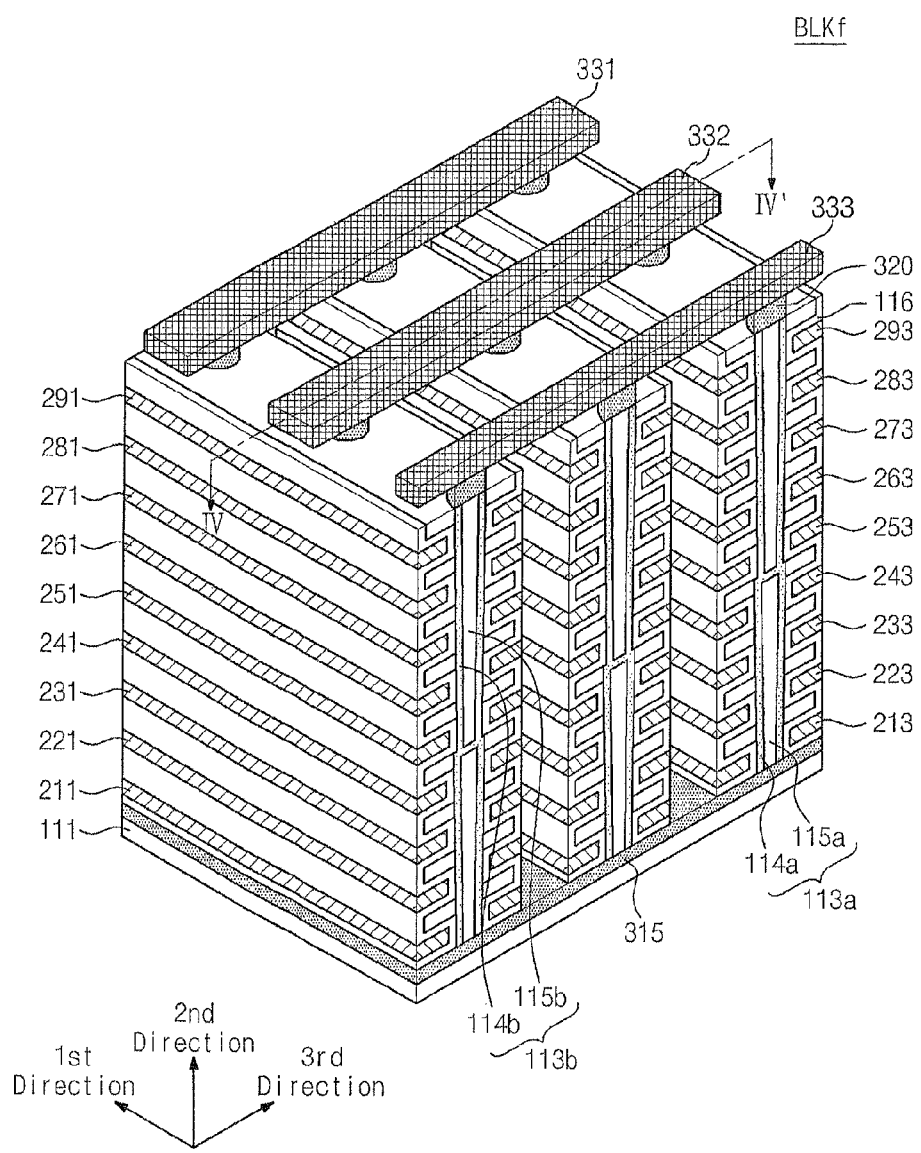
FIG. 44 is a perspective view illustrating a memory block according to an embodiment of the inventive concept.
Figure 45:
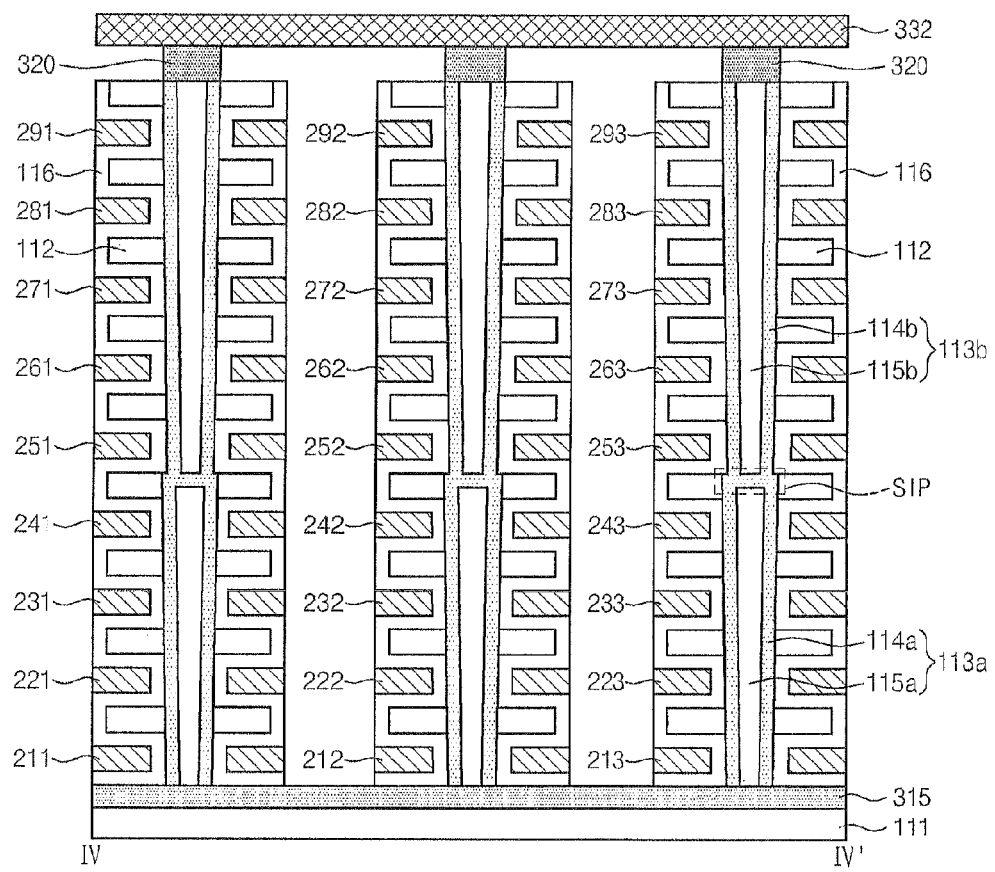
FIG. 45 is a cross-sectional view taken along the line IV-IV' of FIG. 44.

FIG. 44 is a perspective view illustrating a memory block BLKf according to an embodiment. FIG. 45 is a cross-sectional view taken along line IV-IV' of FIG. 44. A memory block BLKf is substantially the same as the memory block BLKe that has been described above with reference to FIGS. 36 and 37, except for one pillar of the memory block BLKf includes first and second sub-pillars 113a and 113b.

As described above with reference to FIGS. 32 and 33, one pillar includes the first and second sub-pillars 113a and 113b, in the memory block BLKf. The first and second sub-pillars 113a and 113b may have substantially the same structures as those of the sub-pillars 113a and 113b that have been described above with reference to FIGS. 32 and 33.

As described above with reference to FIGS. 36 and 37, the n-type doping region 315 forming the common source line CSL can be provided in a plate shape.

In an embodiment, an equivalent circuit of the memory block BLKf may correspond to one of the equivalent circuits BLKa_1, BLKa_2 and BLKa_3 that have respectively been described above with reference to FIGS. 6, 15 and 22. For example, the equivalent circuit of the memory block BLKf may correspond to one of the equivalent circuits BLKa_4 to BLKa_10 that have respectively been described above with reference to FIGS. 25 to 31.

As described above with reference to FIGS. 7 and 8, the memory block BLKf is erased, and thereafter erased memory cells MC may be erasure-verified by unit of respective string selection line SSL.

The erasure and erasure verification of the memory block BLKf is performed in the same method as the method that has been described above with reference to FIGS. 36 to 43.

In an embodiment, as described above with reference to FIGS. 32 and 33, the first conductive materials 251 to 253 having a height (i.e., the fifth height) corresponding to the silicon pad SIP may form the dummy word line DWL and the dummy memory cell DMC.

As an example, it has been described above that the pillar includes the first and second sub-pillars 113a and 113b. However, the pillar may include at least two sub-pillars.

In the memory blocks BLKa to BLKf that have been described above with reference to FIGS. 3 to 5, 32 to 37, 44 and 45, the pillars 113 or 113a and 113b may be formed, and thereafter the first conductive materials 211 to 291, 212 to 292 and 213 to 293 may be formed. That is, the first conductive materials 211 to 291, 212 to 292 and 213 to 293 may include a metal material incapable of being etched.

Figure 46:
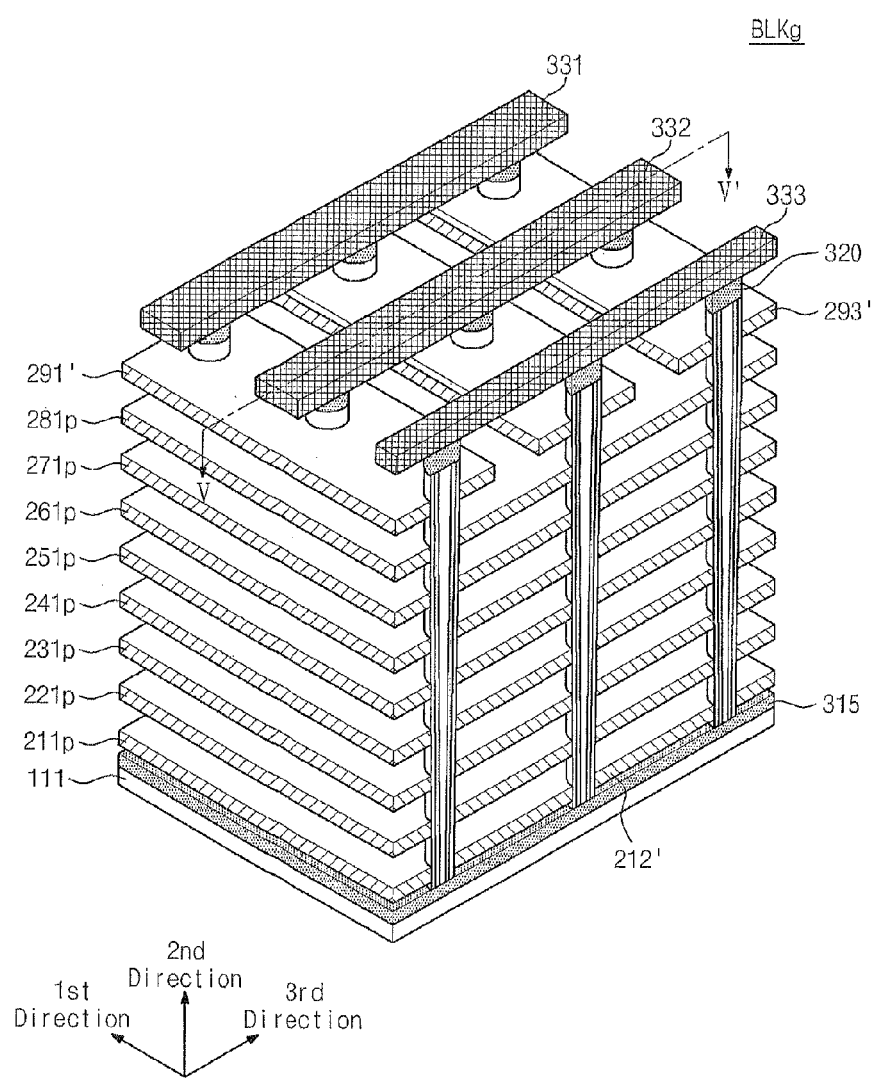
FIG. 46 is a perspective view illustrating a memory block according to an embodiment of the inventive concept.
Figure 47:
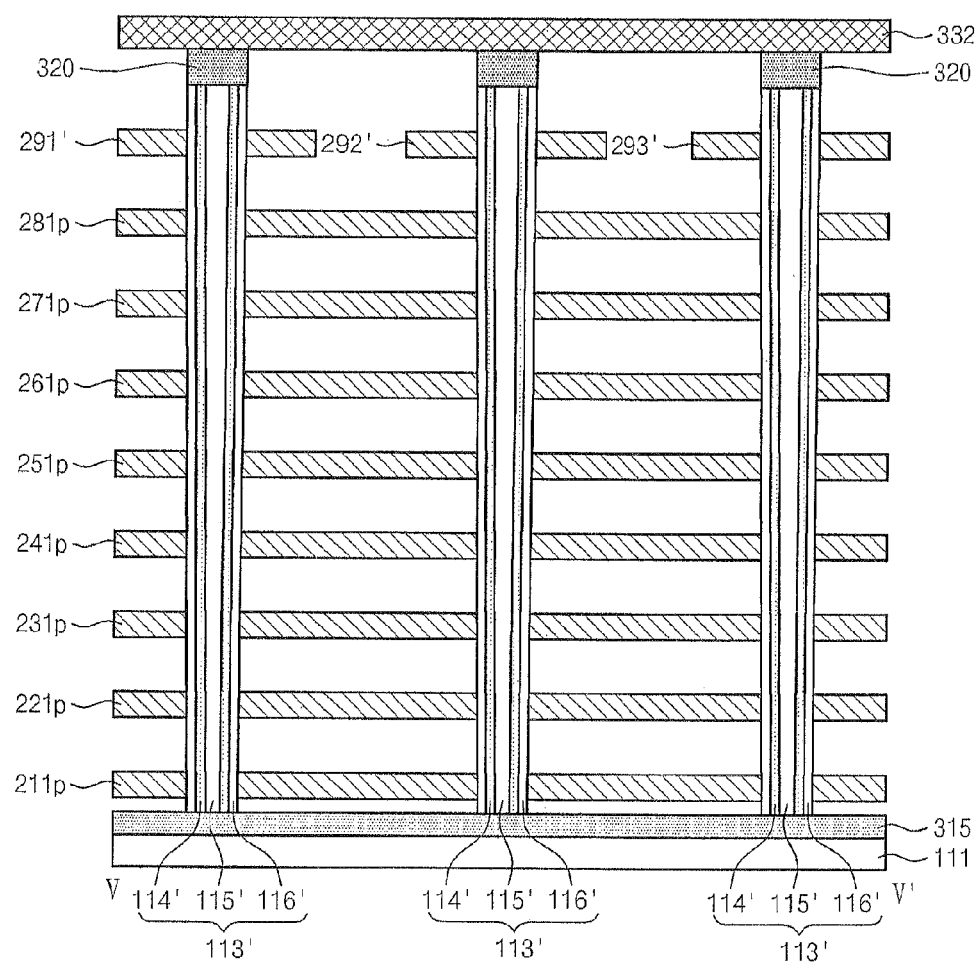
FIG. 47 is a cross-sectional view taken along the line V-V' of FIG. 46.

FIG. 46 is a perspective view illustrating a memory block BLKg according to an embodiment. FIG. 47 is a cross-sectional view taken along line V-V' of FIG. 46.

Referring to FIGS. 46 and 47, the n-type doping region 315 forming the common source line CSL is provided in a plate shape, as described above with reference to FIGS. 36 and 37.

Comparing with the memory block BLKa that has been described above with reference to FIGS. 3 and 4, first conductive materials 211p to 281p having the first to eighth heights are provided in a plate shape. First conductive materials 291' to 293' having the ninth height are extended in the first direction and are provided spaced a certain distance apart in the third direction.

A pillar 113' includes an insulation layer 116', a channel layer 114', and an inner material 115'.

The surface layer 116' of the each pillar 113' includes an insulation layer. The surface layer 116' of the pillar 113' stores data like the insulation layer 116 that has been described above with reference to FIG. 5. For example, the surface layer 116' may include a tunneling insulation layer, a charge storage layer, and a blocking insulation layer. The intermediate layer 114' of the pillar 113' includes p-type silicon. The intermediate layer 114' of the pillar 113' serves as a second-direction body. The inner layer 115' of the pillar 113' includes an insulating material.

In an embodiment, an equivalent circuit of a memory block BLKg may correspond to one of the equivalent circuits BLKa_1 and BLKa_2 that have been described above with reference to FIGS. 6 and 15. In an embodiment, the equivalent circuit of the memory block BLKg may correspond to one of the equivalent circuits BLKa_4 to BLKa_10 that have been described above with reference to FIGS. 25 to 31.

It has been described above that the inner material 115' is provided in the channel layer 114' of the pillar 113'. However, the inner material 115' may not be provided in the pillar 113'. In this case, a space to which the inner material 115' is provided may be charged by the channel layer 114'.

As described above with reference to FIGS. 7 and 8, the memory block BLKg is erased, and thereafter erased memory cells MC may be erasure-verified by unit of respective string selection line SSL.

The erasure and erasure verification of the memory block BLKg is performed in the same method as the method that has been described above with reference to FIGS. 36 to 43.

Figure 48:
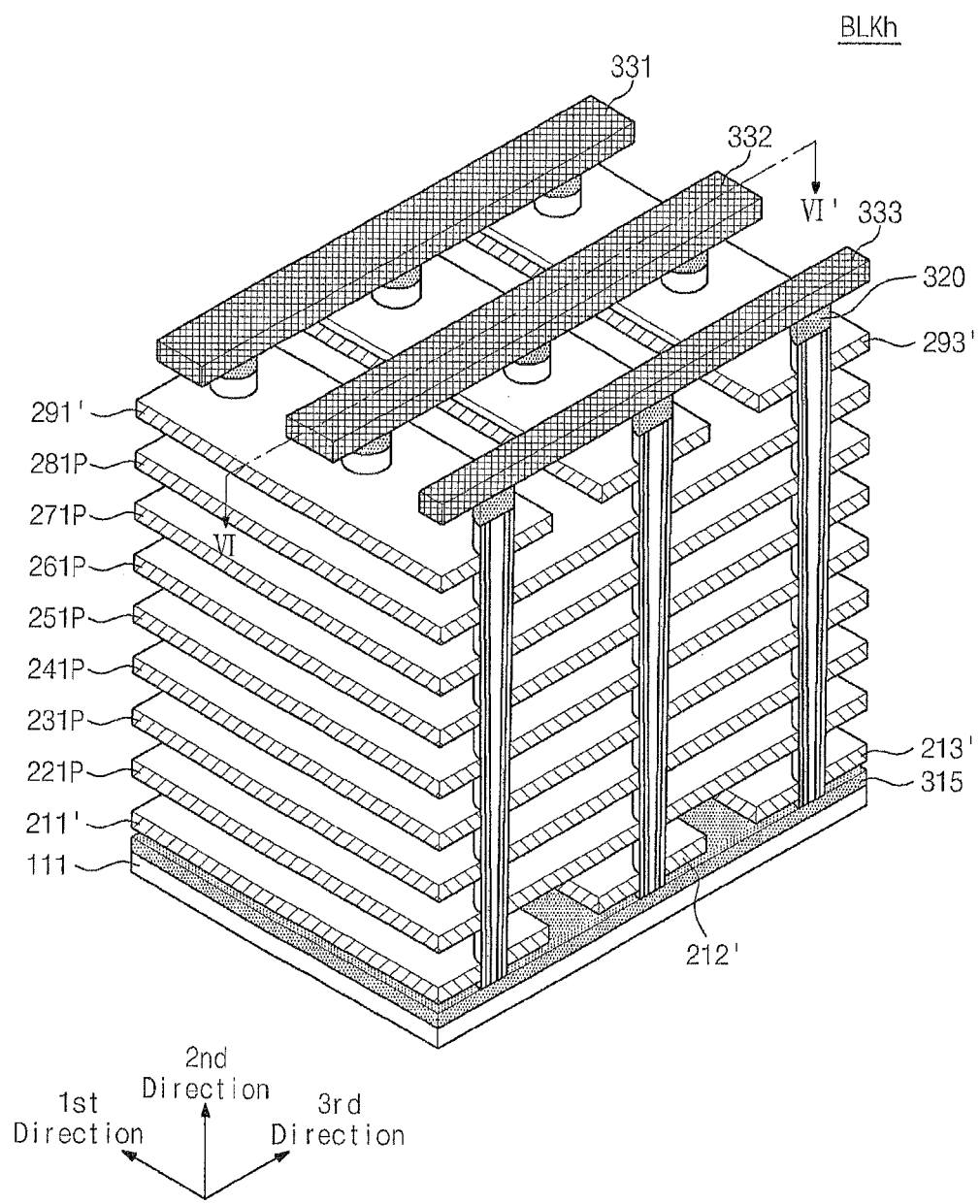
FIG. 48 is a perspective view illustrating a memory block according to an embodiment of the inventive concept.
Figure 49:
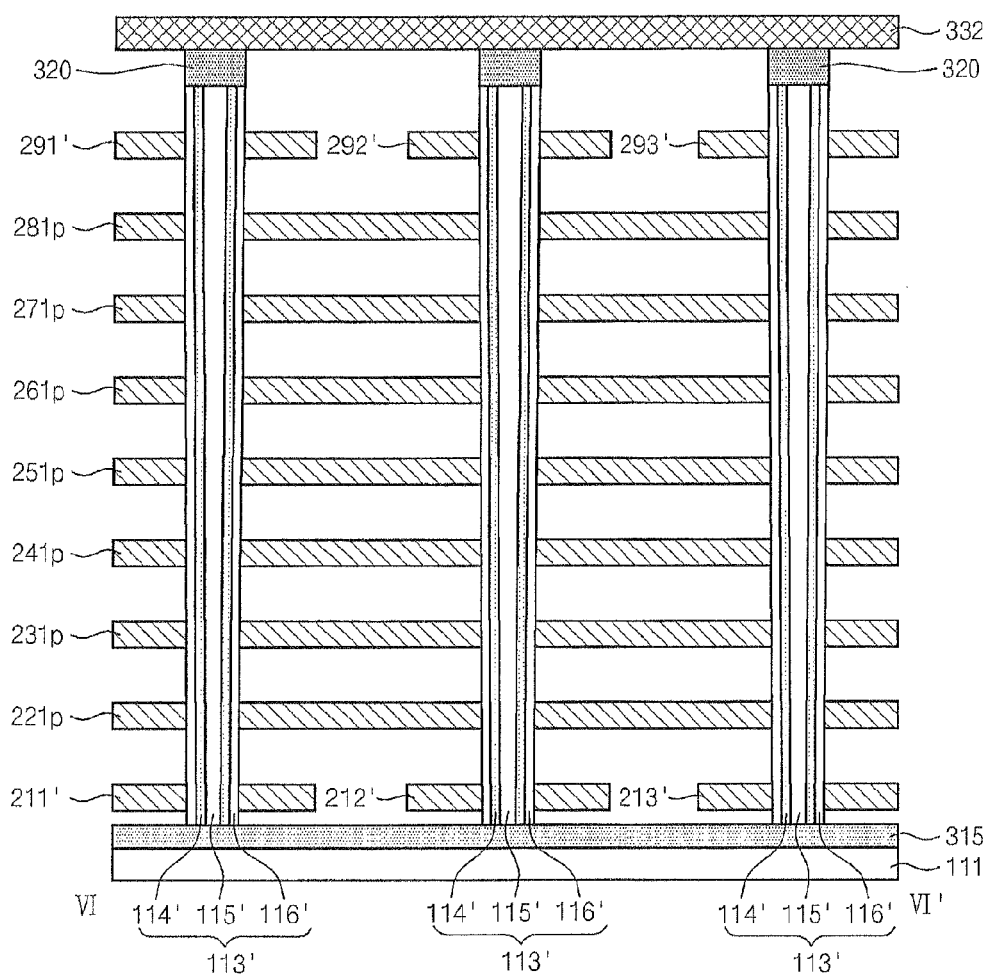
FIG. 49 is a cross-sectional view taken along the line VI-VI' of FIG. 48.

FIG. 48 is a perspective view illustrating a memory block BLKh according to an embodiment of the inventive concept. FIG. 49 is a cross-sectional view taken along line VI-VI' of FIG. 48. Comparing with the memory block BLKg that has been described above with reference to FIGS. 46 and 47, first conductive materials 211' to 213' having the first height in the memory block BLKh are provided spaced a certain distance apart in the third direction.

In an embodiment, an equivalent circuit of the memory block BLKh may correspond to the equivalent circuit BLKa_3 that has been described above with reference to FIG. 22.

As described above with reference to FIGS. 7 and 8, the memory block BLKh is erased, and thereafter erased memory cells MC may be erasure-verified by unit of respective string selection line SSL.

The erasure and erasure verification of the memory block BLKh is performed in the same method as the method that has been described above with reference to FIGS. 36 to 43.

Figure 50:
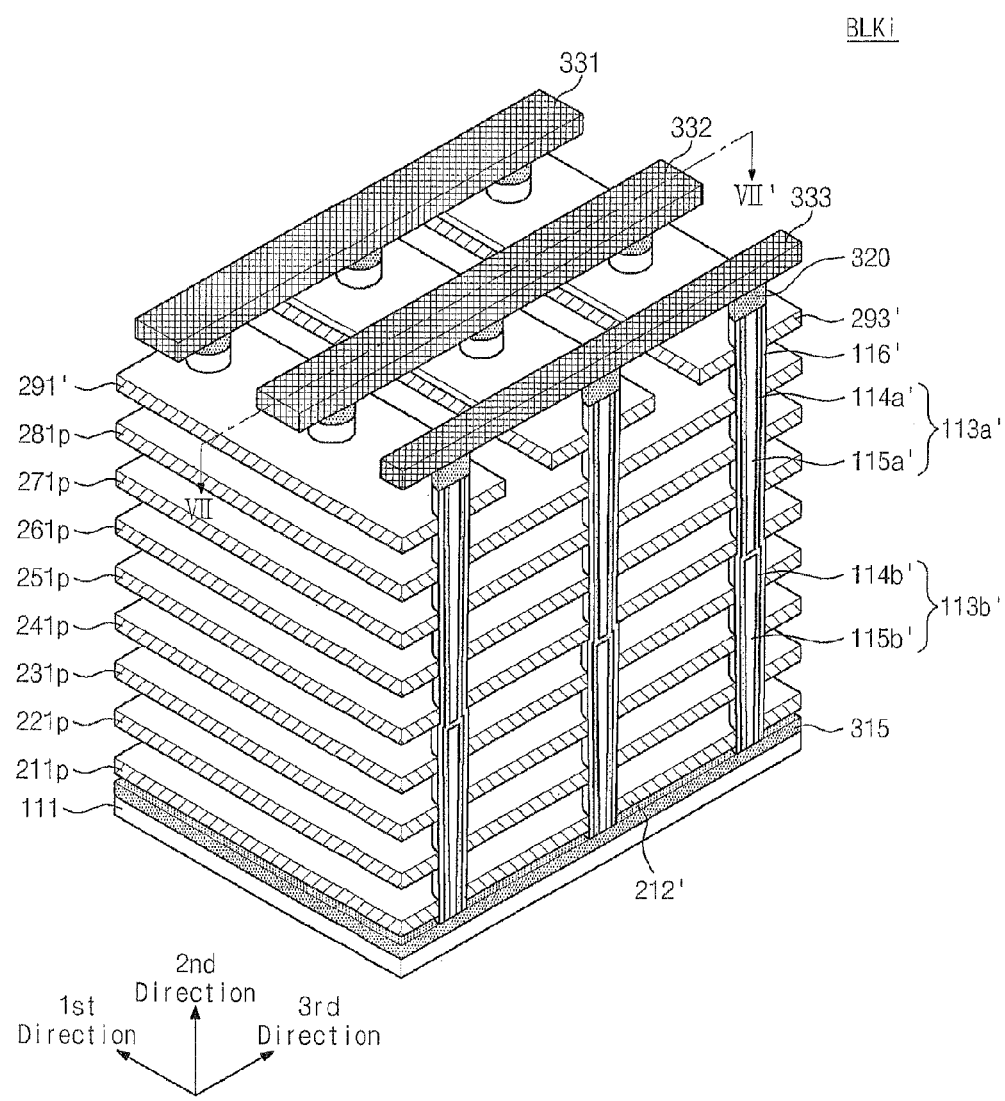
FIG. 50 is a perspective view illustrating a memory block according to an embodiment of the inventive concept.
Figure 51:
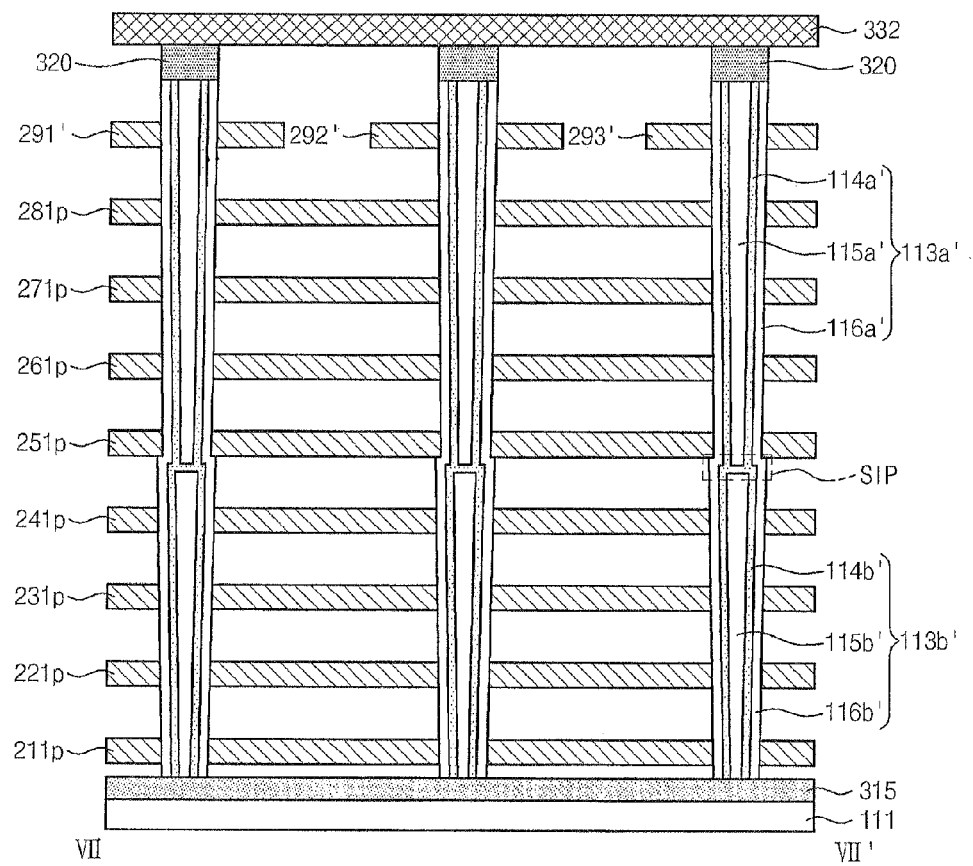
FIG. 51 is a cross-sectional view taken along the line VII-VII' of FIG. 50.

FIG. 50 is a perspective view illustrating a memory block BLKi according to an embodiment of the inventive concept. FIG. 51 is a cross-sectional view taken along line VII-VIP of FIG. 50. A memory block BLKi is substantially the same as the memory block BLKg that has been described above with reference to FIGS. 46 and 47, except for the a pillar of the memory block BLKi includes first and second sub-pillars 113a' and 113b'.

In the memory block BLKi, one pillar includes the first and second sub-pillars 113a' and 113b'. The first sub-pillar 113a' includes an insulation layer 116a', a channel layer 114a', and an inner material 115a'. The second sub-pillar 113b' includes an insulation layer 116b', a channel layer 114b', and an inner material 115b'.

In an embodiment, the intermediate layer 114a' of the first sub-pillar 113a' and the intermediate layer 114b' of the second sub-pillar 113b' are connected. For example, as illustrated in FIGS. 50 and 51, the intermediate layer 114a' of the first sub-pillar 113a' and the intermediate layer 114b' of the second sub-pillar 113b' may be connected through a silicon pad SIP having a p type.

In an embodiment, the first conductive material 251p having a height (i.e., the fifth height) corresponding to the silicon pad SIP form the dummy word line DWL and the dummy memory cells DMC.

In an embodiment, an equivalent circuit of the memory block BLKi may correspond to one of the equivalent circuits BLKa_1 and BLKa_2 that have respectively been described above with reference to FIGS. 6 and 15. In an embodiment, an equivalent circuit of the memory block BLKi may correspond to one of the equivalent circuits BLKa_4 to BLKa_10 that have respectively been described above with reference to FIGS. 25 to 31.

In an embodiment, the inner materials 115a' and 115b' are provided in the channel layer 114a' of the first sub-pillar 113a' and the channel layer 114b' of the second sub-pillar 113b'. However, the inner materials 115a' and 115b' may not be provided in the first sub-pillar 113a' and the second sub-pillar 113b'. In this case, a space to which the inner materials 115a' and 115b' are provided may be charged by the channel layers 114a' and 114b'.

As described above with reference to FIGS. 7 and 8, the memory block BLKi is erased, and thereafter erased memory cells MC may be erasure-verified by unit of respective string selection line SSL.

The erasure and erasure verification of the memory block BLKi is performed in the same method as the method that has been described above with reference to FIGS. 36 to 43.

Figure 52:
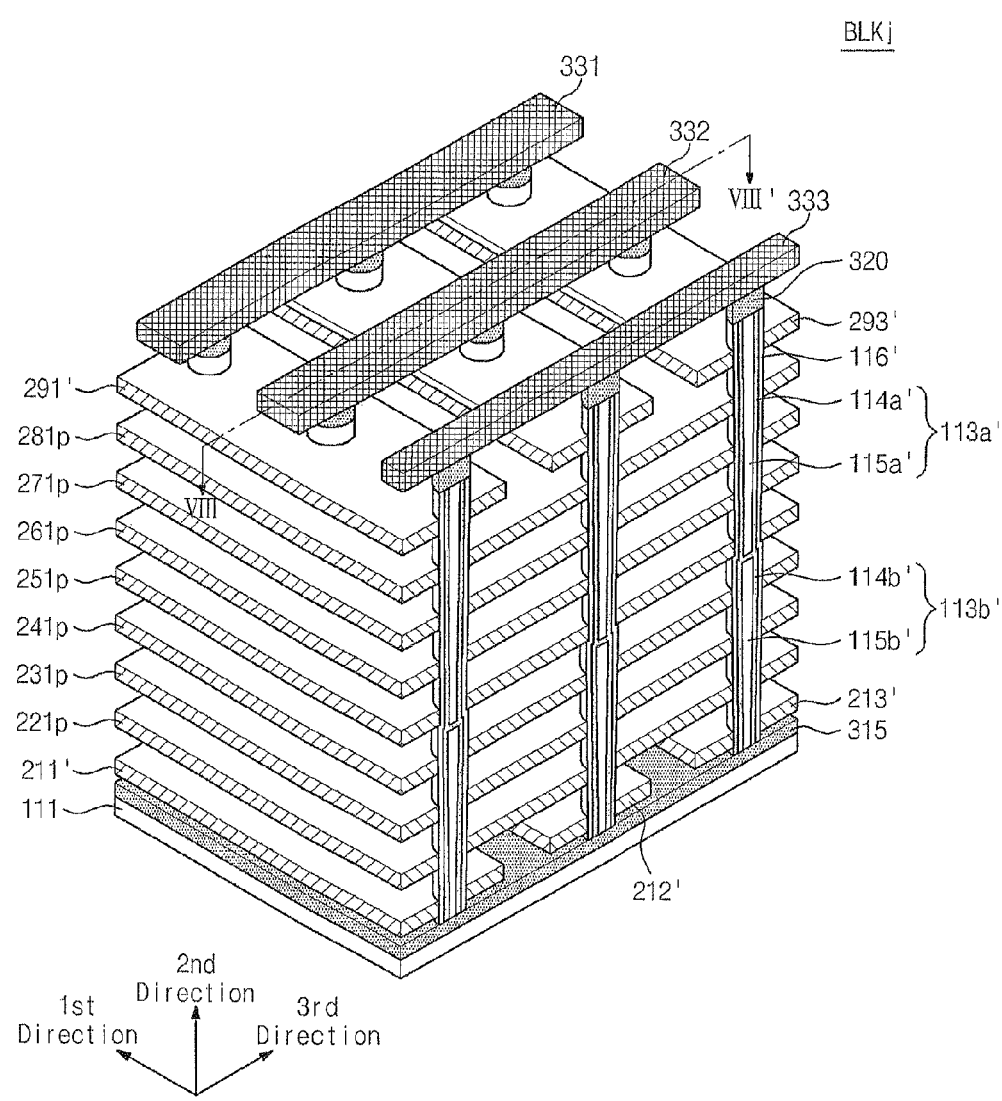
FIG. 52 is a perspective view illustrating a memory block according to an embodiment of the inventive concept.
Figure 53:
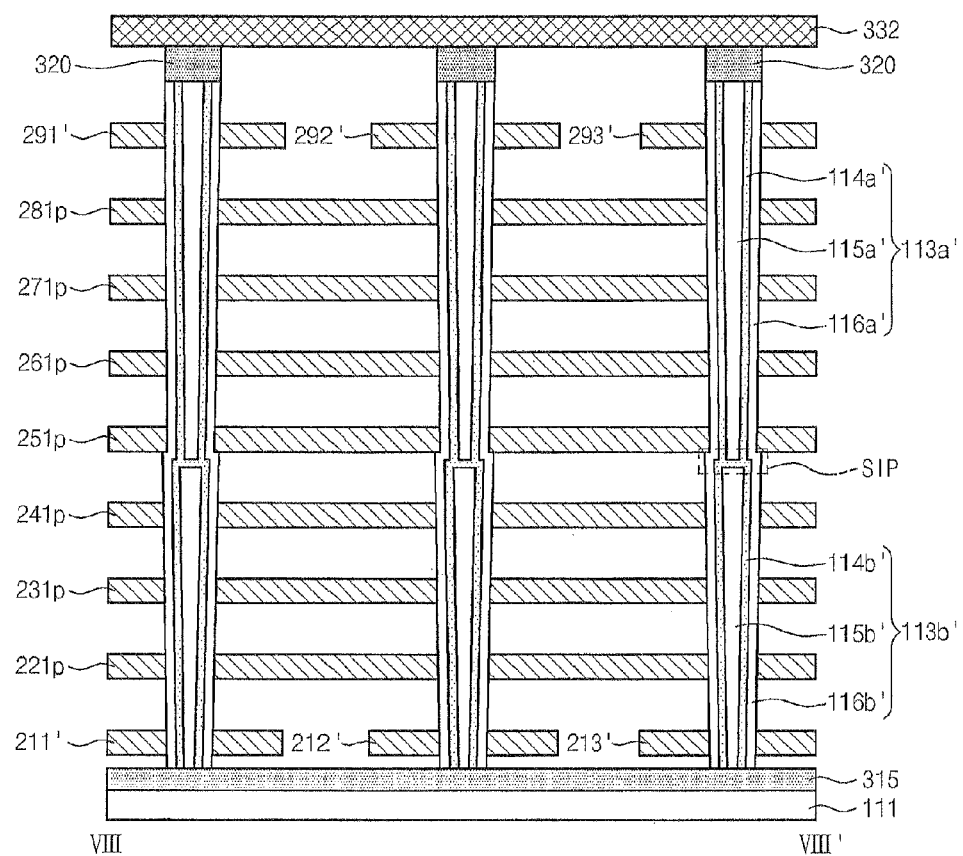
FIG. 53 is a cross-sectional view taken along the line VIII-VIII' of FIG. 52.

FIG. 52 is a perspective view illustrating a memory block BLKj according to an embodiment. FIG. 53 is a cross-sectional view taken along line VIII-VIII' of FIG. 52. Comparing with the memory block BLKi that has been described above with reference to FIGS. 50 and 51, first conductive materials 211' to 213' having the first height in a memory block BLKj are provided spaced a certain distance apart in the third direction.

In an embodiment, an equivalent circuit of the memory block BLKj may correspond to the equivalent circuit BLKa_3 that has been described above with reference to FIG. 22.

As described above with reference to FIGS. 7 and 8, the memory block BLKj is erased, and thereafter erased memory cells MC may be erasure-verified by unit of respective string selection line SSL.

The erasure and erasure verification of the memory block BLKj is performed in the same method as the method that has been described above with reference to FIGS. 36 to 43.

Figure 54:
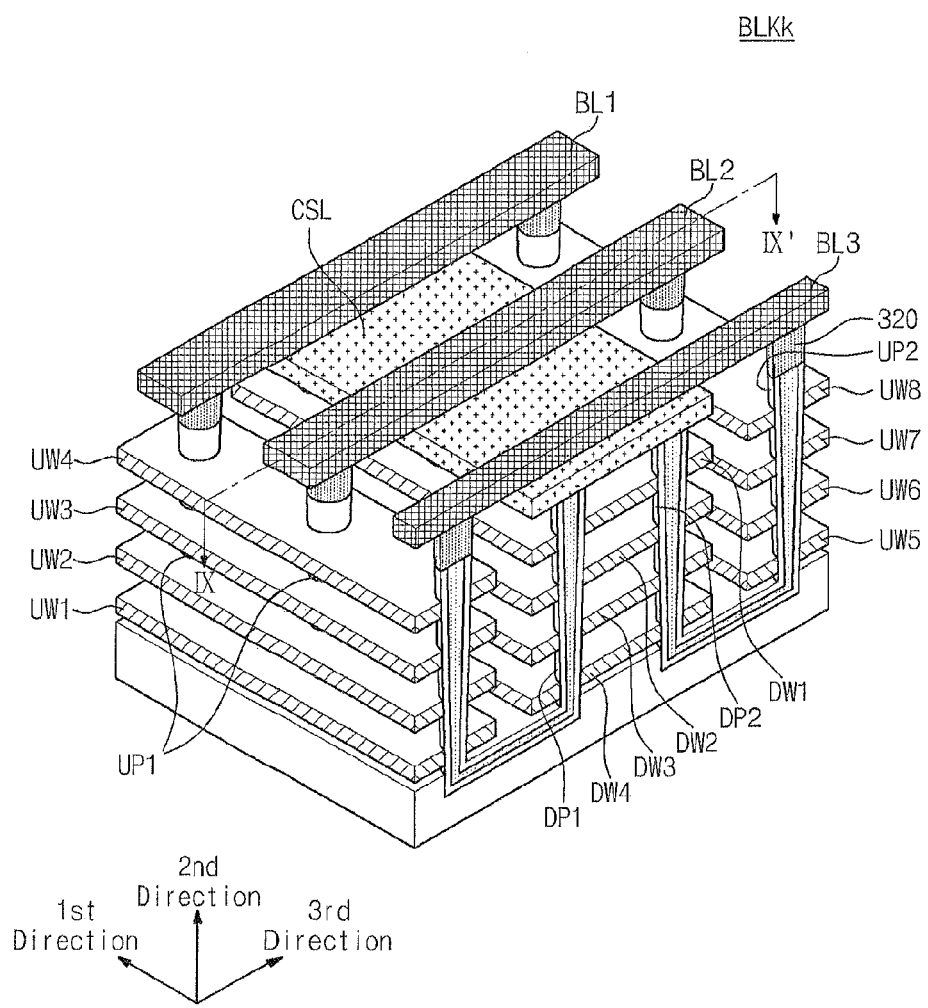
FIG. 54 is a perspective view illustrating a memory block according to an embodiment of the inventive concept.
Figure 55:
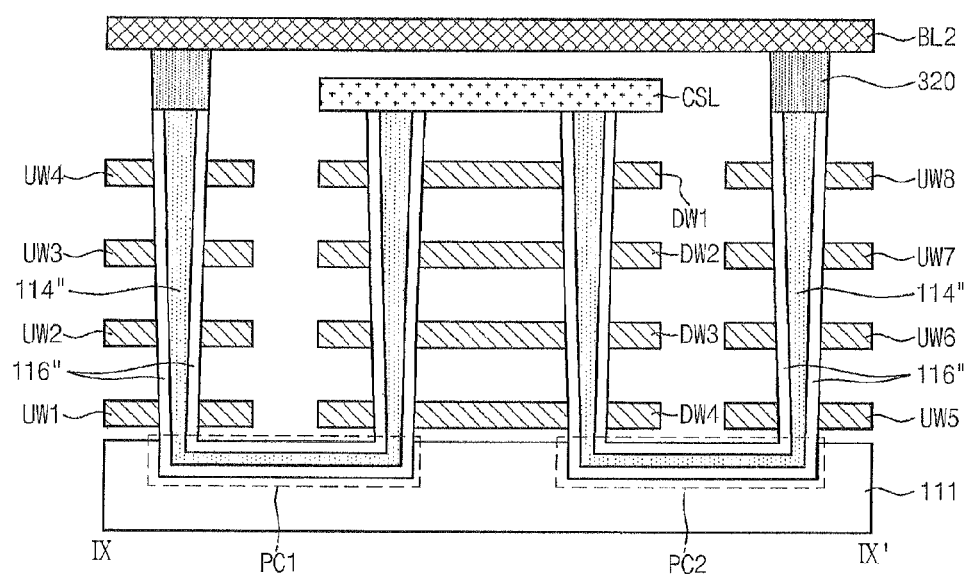
FIG. 55 is a cross-sectional view taken along the line IX-IX' of FIG. 54.

FIG. 54 is a perspective view illustrating a memory block BLKk according to an embodiment. FIG. 55 is a cross-sectional view taken along line IX-IX' of FIG. 54.

Referring to FIGS. 54 and 55, first to fourth upper word lines UW1 to UW4 extended in a first direction are provided onto the substrate 111. The first to fourth upper word lines UW1 to UW4 are provided spaced a certain distance apart in the second direction. Provided are first upper pillars UP1 that are provided spaced a certain distance apart in the first direction and pass through the first to fourth upper word lines UW1 to UW4 in the second direction.

First to fourth lower word lines DW1 to DW4 extended in the first direction are provided onto the substrate 111. The first to fourth lower word lines DW1 to DW4 are provided a certain distance apart in the second direction. The first to fourth lower word lines DW1 to DW4 are provided spaced a certain distance apart in the third direction from the first to fourth upper word lines UW1 to UW4.

Provided are first lower pillars DP1 that are disposed spaced a certain distance apart in the first direction and pass through the first to fourth lower word lines DW1 to DW4 in the second direction. Furthermore, provided are second lower pillars DP2 that are provided spaced a certain distance apart in the first direction and pass through the first to fourth lower word lines DW1 to DW4 in the second direction. In an embodiment, the first lower pillars DP1 and the second lower pillars DP2 may be disposed in parallel in the second direction. For example, the first lower pillars DP1 and the second lower pillars DP2 may be provided spaced a certain distance apart in the third direction.

Fifth to eighth upper word lines UW5 to UW8 extended in the first direction are provided in onto the substrate 111. The fifth to eighth upper word lines UW5 to UW8 are provided spaced a certain distance apart in the second direction. Provided are second upper pillars UP2 that are disposed spaced a certain distance apart in the first direction and pass through the fifth to eighth upper word lines UW5 to UW8 in the second direction.

A common source line CSL extended in the first direction is provided onto the upper portions of the first and second lower pillars DP1 and DP2. The common source line CSL may include an n-type silicon material. When the common source line CSL is formed of a conductive material having no conductive type such as an n type or a p type, n-type sources may be additionally provided between the common source line CSL and the first and second lower pillars DP1 and DP2. For example, among the regions of the first and second lower pillars DP1 and DP2, a region adjacent to the common source line CSL may be doped in an n type and serve as a source. The common source line CSL and the first and second lower pillars DP1 and DP2 may be connected through contact plugs, respectively. In this case, the contact plugs may be doped in the n type and serve as the source.

Drains 320 are provided onto the upper portions of the first and second upper pillars UP1 and UP2, respectively. The drains 320 may include an n-type silicon material. A plurality of bit lines BL1 to BL3 extended in the third direction are provided onto the portions of the drains 320. For example, the bit lines BL1 to BL3 may be provided spaced a certain distance apart in the first direction. The first and second upper pillars UP1 and UP2 provided in the third direction are connected to the same bit line in common. The bit lines BL1 to BL3 may comprise a metal. The bit lines BL1 to BL3 and the drains 320 may be connected through contact plugs.

Each of the first and second upper pillars UP1 and UP2 includes a surface layer 116" and an inner layer 114". Each of the first and second lower pillars DP1 and DP2 includes a surface layer 116" and an inner layer 114". As described above with reference to FIGS. 47 and 48, the surface layer 116" of the first and second upper pillars UP1 and UP2 and first and second lower pillars DP1 and DP2 include a blocking insulation layer, a charge storing layer and a tunneling insulation layer.

The tunneling insulation layer may include a thermal oxide layer. The charge storing layer may include a nitride layer or metal oxide layer (for example, an aluminum oxide layer or a hafnium oxide layer). The blocking insulation layer may be formed in a single layer or a multi layer. The blocking insulation layer may be a high dielectric layer (for example, an aluminum oxide layer or a hafnium oxide layer) having a higher dielectric constant than the charge storing layer and the tunneling insulation layer. The blocking insulation layer, the charge storing layer and the tunneling insulation layer may form ONO.

The inner layer 114" of the first and second upper pillars UP1 and UP2 and first and second lower pillars DP1 and DP2 may include a p-type silicon material. The inner layer 114" of the first and second upper pillars UP1 and UP2 and first and second lower pillars DP1 and DP2 may serve as a second-direction body.

The first upper pillars UP1 and the first lower pillars DP1 are connected first pipeline contacts PC1. Exemplarily, the surface layers 116" of the first upper pillars UP1 and the first lower pillars DP1 are connected through the surface layers of the first pipeline contacts PC1. The surface layers of the first pipeline contacts PC1 may comprise the same materials as those of the surface layers 116" of the first upper pillars UP1 and the first lower pillars DP1.

The inner layers 114" of the first upper pillars UP1 and UP2 and first lower pillars DP1 are connected through the inner layers of the first pipeline contacts PC1. The inner layers of the first pipeline contacts PC1 may comprise the same materials as those of the inner layers 114" of the first upper pillars UP1 and UP2 and first lower pillars DP1.

That is, the first upper pillars UP1 and the first to fourth upper word lines UW1 to UW4 form first upper strings, and the first lower pillars DP1 and the first to fourth lower word lines DW1 to DW4 form first lower strings. The first upper strings and the first lower strings are connected through the first pipeline contacts PC1, respectively. The drains 320 and the bit lines BL1 to BL3 are connected to the one ends of the first upper strings. The common source line CSL is connected to the one ends of the first lower strings. That is, the first upper strings and the first lower strings form a plurality of NAND stings NS that are connected between the bit lines BL1 to BL3 and the common source line CSL.

Likewise, the second upper pillars UP2 and the fifth to eighth upper word lines UW5 to UW8 form second upper strings, and the second lower pillars DP2 and the first to fourth lower word lines DW1 to DW4 form second lower strings. The second upper strings and the second lower strings are connected through second pipeline contacts PC2, respectively. The drains 320 and the bit lines BL1 to BL3 are connected to the one ends of the second upper strings. The common source line CSL is connected to the one ends of the second lower strings. That is, the second upper strings and the second lower strings form a plurality of NAND stings NS that are connected between the bit lines BL1 to BL3 and the common source line CSL.

For respectively forming channels at the bodies 114" in the first and second pipeline contacts PC1 and PC2, first and second pipeline contact gates may be provided. The first and second pipeline contact gates may be provided onto the surfaces of the first and second pipeline contacts PC1 and PC2.

Except for that eight transistors are provided to one string and two strings are respectively connected to the first to third bit lines BL1 to BL3, exemplarily, an equivalent circuit of a memory block BLKk may correspond to one of the equivalent circuits BLKa_1, BLKa_2 and BLKa_4 to BLKa_10 that have been described above with reference to FIGS. 6, 15 and 25 to 31.

As described above with reference to FIGS. 7 and 8, the memory block BLKk is erased, and thereafter erased memory cells MC may be erasure-verified by unit of respective string selection line SSL.

The erasure and erasure verification of the memory block BLKk are performed in the same method as the method that has been described above with reference to FIGS. 36 to 43.

Figure 56:
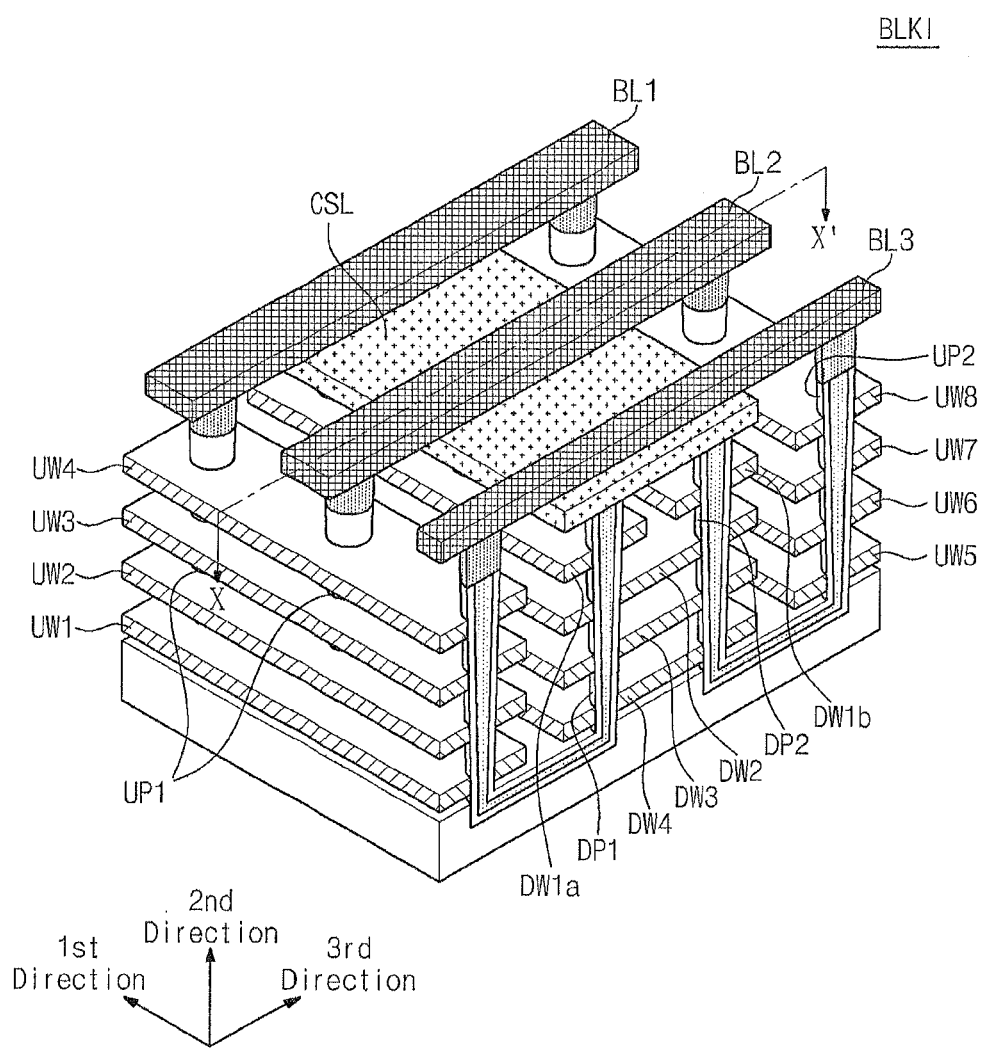
FIG. 56 is a perspective view illustrating a memory block according to an embodiment of the inventive concept.
Figure 57:
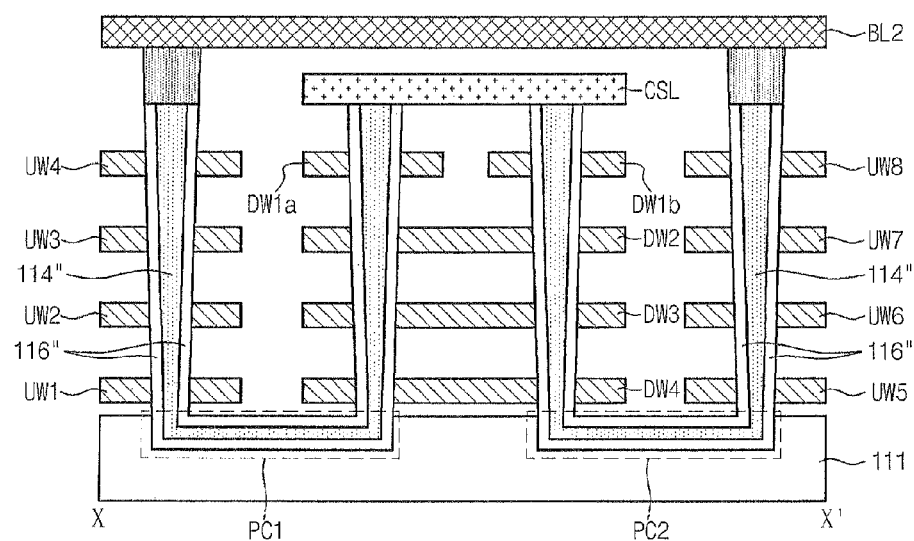
FIG. 57 is a cross-sectional view taken along the line X-X' of FIG. 56.

FIG. 56 is a perspective view illustrating a memory block BLK1 according to an embodiment. FIG. 57 is a cross-sectional view taken along line X-X' of FIG. 56. Comparing with the memory block BLKz that has been described above with reference to FIGS. 54 and 55, a first lower word line is divided into a first portion DW1a and a second portion DW1b, in a memory block BLK1. The first portion DW1a and the second portion DW1b are provided spaced a certain distance apart in the third direction.

The first lower pillars DP1 configuring NAND strings NS together with the first upper pillars UP1 pass through the first portion DW1a of the first lower word line. The second lower pillars DP2 configuring NAND strings NS together with the second upper pillars UP2 pass through the second portion DW1b of the first lower word line.

Except for that eight transistors are provided to one string and two strings are respectively connected to the first to third bit lines BL1 to BL3, exemplarily, an equivalent circuit of a memory block BLK1 may correspond to the equivalent circuit BLKa_3 that has been described above with reference to FIG. 22.

As described above with reference to FIGS. 7 and 8, the memory block BLK1 is erased, and thereafter erased memory cells MC may be erasure-verified by unit of respective string selection line SSL.

The erasure and erasure verification of the memory block BLK1 are performed in the same method as the method that has been described above with reference to FIGS. 36 to 43.

In the memory blocks BLKg to BLK1 that have been described above with reference to FIGS. 46 to 57, the first conductive materials 211p to 281p and 291' to 293' or 211' to 213', 221p to 281p and 291' to 293' may be formed and then the pillars 113' or 113a' to 113b' may be formed. That is, the first conductive materials 211p to 281p and 291' to 293' or 211' to 213', 221p to 281p and 291' to 293' may comprise conductive materials capable of being etched.

Figure 58:
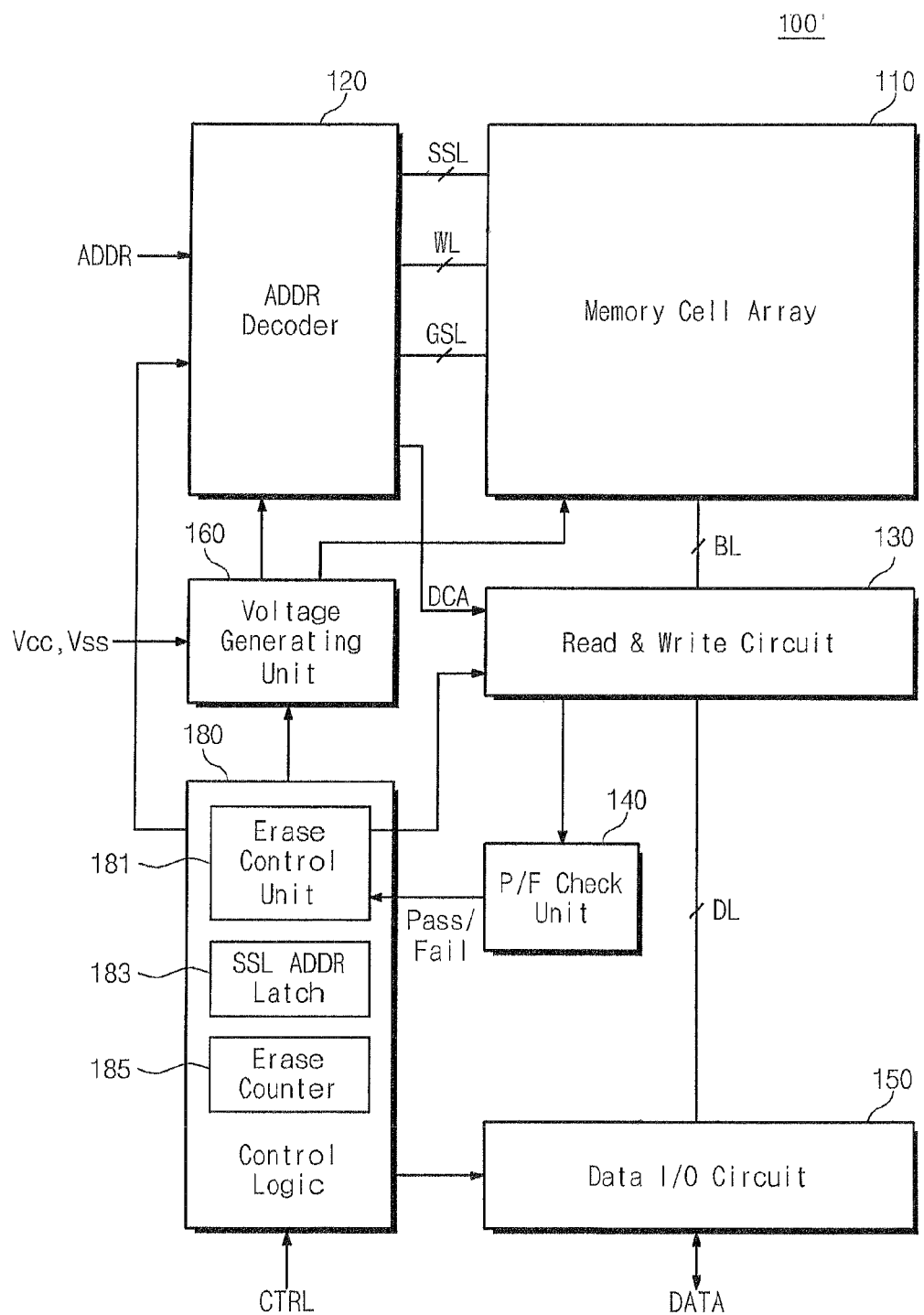
FIG. 58 is a block diagram illustrating a nonvolatile memory device according to an embodiment of the inventive concept.

FIG. 58 is a block diagram illustrating a nonvolatile memory device 100' according to an embodiment of the inventive concept. Except for the control logic 180, the nonvolatile memory device 100' has the same structure as that of the nonvolatile memory device 100 that has been described above with reference to FIG. 1.

The control logic 180 is connected to the address decoder 120, the reading and writing circuit 130, the pass/fail check unit 140 and the data input/output circuit 1150. The control logic 180 controls the overall operation of the nonvolatile memory device 100'. The control logic 180 operates in response to a control signal CTRL transferred from the outside.

The control logic 180 includes an erasure control unit 181, a string selection line address latch 183 (hereinafter referred to as an SSL latch), and an erasure counter 185. The erasure control unit 181 controls the erasing operation of the nonvolatile memory device 100'. For example, the erasing operation of the nonvolatile memory device 100' includes erasure and erasure verification. Erasure and erasure verification are performed in the selected memory block of the memory cell array 110 according to the control of the erasure control unit 181.

The erasure control unit 181 controls the address decoder 120, the reading and writing circuit 130 and the voltage generating unit 160 in order for the selected memory block of the memory cell array 110 to be erased. The erasure control unit 181 controls the address decoder 120, the reading and writing circuit 130 and the voltage generating unit 160 in order for the selected memory block of the memory cell array 110 to be erasure-verified. For example, the erasure control unit 181 controls erasure on the basis of information that is stored in the erasure counter 185. For example, the erasure control unit 181 controls erasure verification on the basis of information that is stored in the SSL latch 183.

The erasure control unit 181 recognizes erasure pass or erasure fail based on the output of the pass/fail check unit 140. The erasure control unit 181 controls successive erasure or erasure verification according to erasure pass or erasure fail.

The SSL latch 183 stores the addresses of a string selection line SSL. For example, the count values of the SSL latch 183 stores the address of a string selection line SSL corresponding to erasure-failed memory cells according to the control of the erasure control unit 181. For example, the count values of the SSL latch 183 stores the address of a string selection line SSL corresponding to erasure-passed memory cells according to the control of the erasure control unit 181.

The count value (hereinafter referred to as erasure count) of the erasure counter 185 corresponds to the number of times a specific memory block of the memory cell array 110 is erased in an erasing operation. For example, erasure count corresponds to the number of times the erasure voltage Vers is applied to a specific memory block in an erasing operation. For example, erasure count corresponds to the number of times an erasure voltage (or an erasure pulse) is applied to a specific memory block in ISPE.

As described above with reference to FIG. 7, the nonvolatile memory device 100' erases memory cells MC by memory block BLK units, and the erased memory cells MC are erasure-verified by unit of respective string selection line SSL.

Figure 59:
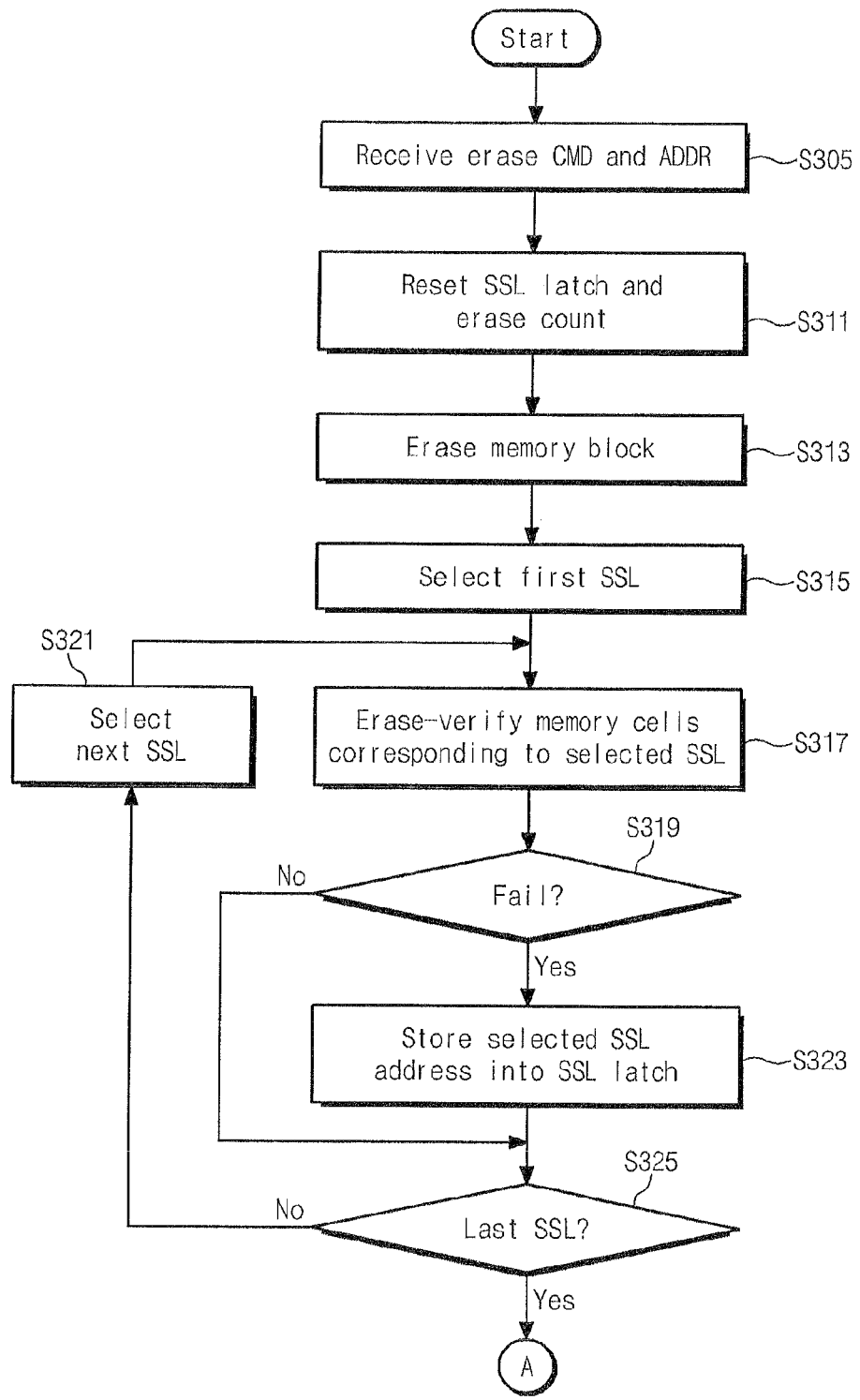
FIGS. 59 and 60 are flowcharts illustrating an operating method of the nonvolatile memory device of FIG. 58 according to an embodiment of the inventive concept.
Figure 60:
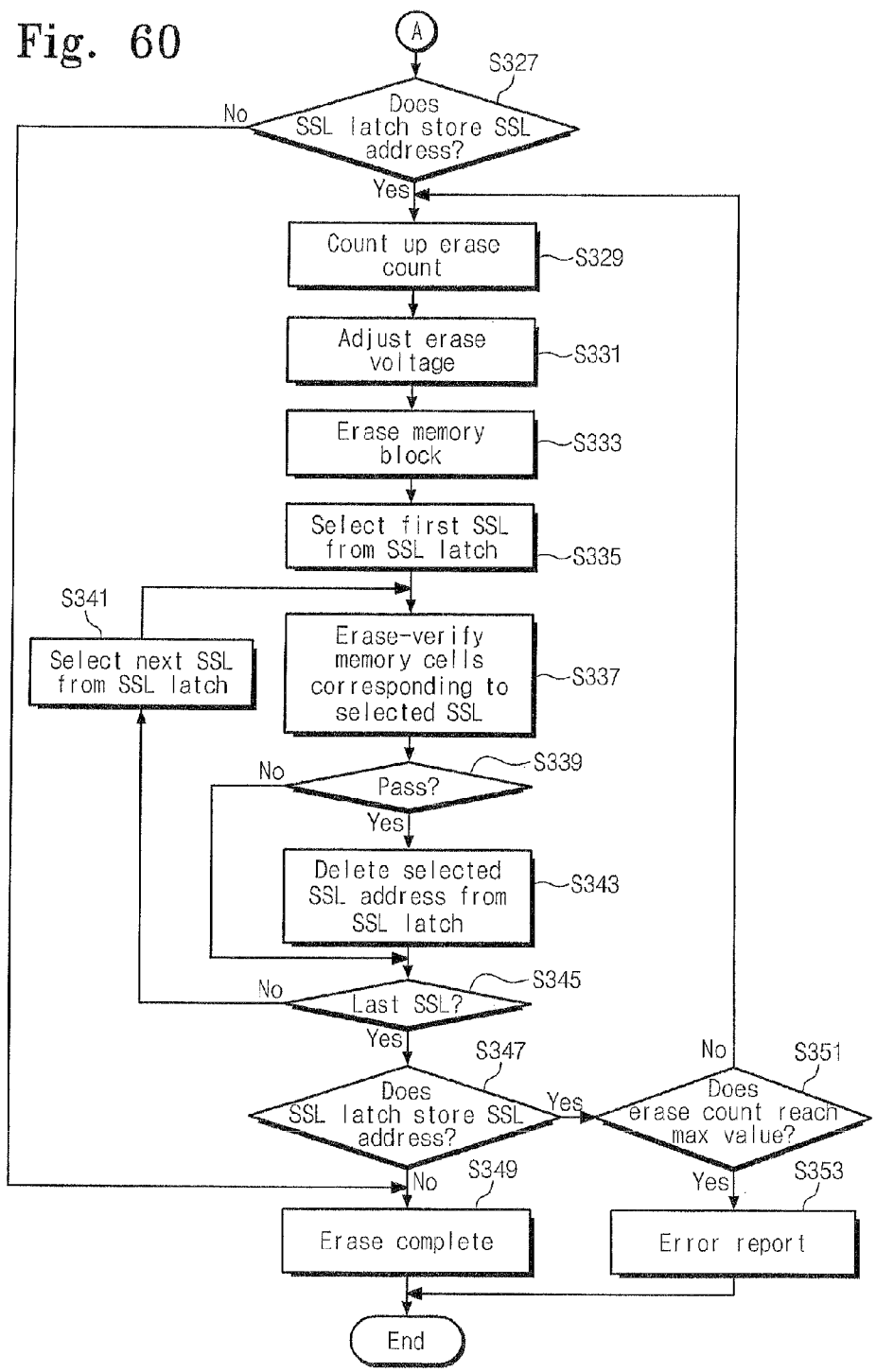

FIGS. 59 and 60 are flowcharts illustrating an operating method of the nonvolatile memory device 100' of FIG. 58 according to an embodiment of the inventive concept.

Referring to FIGS. 58 to 60, an erasure command and an address are received in operation S305. For example, the received address corresponds to at least two string selection lines SSL.

The SSL latch 183 and erasure count are reset in operation S311. For example, the erasure control unit 181 deletes information stored in the SSL latch 183, and it is initialized.

Memory cells MC corresponding to the received address are erased in operation S313. Exemplarily, the erasure control unit 181 controls the address decoder 120 and the voltage generating unit 160 in order for the selected memory block BLK of the memory cell array 110 to be erased. For example, the erasure of the memory block BLK may be performed identically to the erasing method that has been described above with reference to the nonvolatile memory device 100 of FIG. 1.

A first string selection line SSL1 is selected in operation S315. For example, the first string selection line SSL1 among string selection lines SSL1 to SSL3 corresponding to the erased memory cells MC may be selected.

Memory cells MC corresponding to the selected string selection line SSL1 are erasure-verified in operation S317. For example, erasure verification may be performed identically to the erasure-verifying method that has been described above with reference to the nonvolatile memory device 100 of FIG. 1.

Whether erasure fail or not is determined in operation S319. When the erasure-verified memory cells MC are determined as erasure fail, operation S323 is performed. The address of a selected string selection line SSL is stored in the SSL latch 183 in operation S323. When the first string selection line SSL1 is selected, the address of the first string selection line SSL1 is stored in the SSL latch 183. Subsequently, operation S325 is performed. When the erasure-verified memory cells MC are determined as erasure pass, operation S323 is omitted, and operation S325 is performed.

Whether the selected string selection line SSL is the final string selection line SSL is determined in operation S325. When the selected string selection line SSL is not the final string selection line SSL, a next string selection line SSL is selected in operation S321. Subsequently, operations S317 to S323 are again performed. When the selected string selection line SSL is the final string selection line SSL, operation S327 is performed.

That is, when operations S315 to S325 are performed, erased memory cells MC are erasure-verified by unit of respective string selection line SSL. The addresses of string selection lines SSL corresponding to the erasure-failed memory cells MC of the erased memory cells MC are stored in the SSL latch 183.

Whether the address of a string selection line SSL is stored in the SSL latch 183 is determined in operation S327. That is, whether erasure-failed memory cells MC exist as an erasure-verified result is determined. When the erasure-failed memory cells MC do not exist, i.e., the address of the string selection line SSL is not stored in the SSL latch 183, an erasing operation is completed in operation S349.

When the address of a string selection line SSL is stored in the SSL latch 183, i.e., the erasure-failed memory cells MC exist, erasure count is counted up in operation S329.

An erasure voltage Vers is adjusted in operation S331. For example, the level of the erasure voltage Vers increases. For example, the voltage generating unit 160 increases the level of the erasure voltage Vers according to the control of the erasure control unit 181.

The memory block BLK is erased in operation S333. For example, the selected memory block BLK is again erased with the erasure voltage Vers having the adjusted level.

The first string selection line SSL is selected from the SSL latch 183 in operation S335. For example, a string selection line SSL, which corresponds to the first address among the addresses of the string selection line SSL stored in the SSL latch 183, may be selected. That is, the first string selection line SSL among string selection lines SSL corresponding to erasure-failed memory cells MC may be selected.

Memory cells corresponding to the selected string selection line SSL are erasure-verified in operation S337.

Erasure pass is determined in operation S339. When the erasure-verified memory cells MC are determined as erasure pass, the address of the selected string selection line SSL is deleted from the SSL latch 183 in operation S343. Subsequently, operation S345 is performed. When the erasure-verified memory cells MC are determined as erasure fail, operation S343 is omitted, and operation S345 is performed.

Whether the selected string selection line SSL is the final string selection line SSL is determined in operation S345. For example, whether the selected string selection line SSL corresponds to the final address among the addresses of the string selection line SSL stored in the SSL latch 183 is determined.

When the selected string selection line SSL is not the final string selection line SSL, a next string selection line SSL is selected from the SSL latch 341 in operation S341. Subsequently, operations S337 to S343 are again performed.

When the selected string selection line SSL is the final string selection line SSL, operation S347 is performed.

When operations S335 to S345 are performed, memory cells MC corresponding to the addresses of the string selection line SSL stored in the SSL latch 183 are erasure-verified by unit of respective string selection line SSL. Furthermore, the address of a string selection line SSL corresponding to erasure-failed memory cells MC is stored in the SSL latch 183.

Whether the SSL latch 183 stores the address of a string selection line SSL is determined in operation S347. That is, whether erasure-failed memory cells MC exist is determined.

When the erasure-failed memory cells MC do not exist, i.e., the SSL latch 183 does not store the address of a string selection line SSL, the erasing operation is completed in operation S349. When the erasure-failed memory cells MC exist, i.e., the SSL latch 183 stores the address of a string selection line SSL, operation S351 is performed.

Whether erasure count reaches the maximum value is determined in operation S351. When the erasure count does not reach the maximum value, operations S329 to S347 are again performed. When the erasure count reaches the maximum value, an error report is performed in operation S353. The erasing operation is ended.

As described above, a memory block BLK is erased according to the control of the erasure control unit 181, and erased memory cells MC are erasure-verified by unit of respective string selection line SSL. The address of a string selection line SSL corresponding to memory cells MC determined as erasure fail is stored in the SSL latch 183. Erasure and erasure verification are repeated until the address of the string selection line SSL stored in the SSL latch 183 does not exist or the erasure count reaches the maximum value.

A criterion of erasure pass and erasure fail may vary according to electronic devices that are used together with the nonvolatile memory device 100. For example, when a device having an n-bit error correction function is used together with the nonvolatile memory device 100', failed bits less than (or equal to) n bits that are generated in erasure verification may be ignored. That is, even when failed bits less than (or equal to) n bits are detected in erasure verification, erasure pass may be determined.

Figure 61:
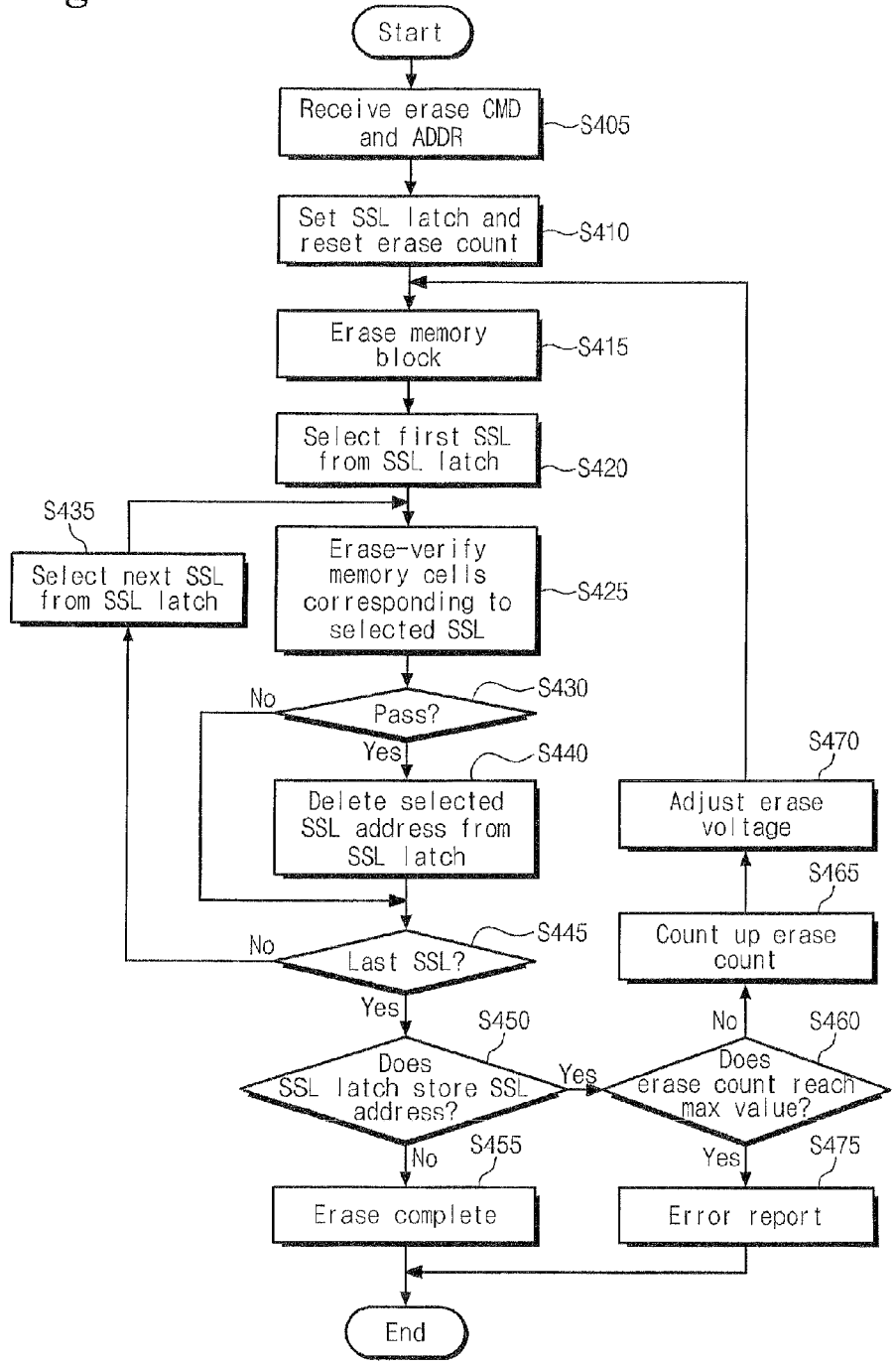
FIG. 61 is a flowchart illustrating an operating method of the nonvolatile memory device of FIG. 58 according to an embodiment of the inventive concept.

FIG. 61 is a flowchart illustrating an operating method of the nonvolatile memory device 100' of FIG. 58 according to an embodiment. Referring to FIGS. 58 and 61, an erasure command and an address are received in operation S405. For example, the received address corresponds to at least two string selection lines SSL.

The SSL latch 183 is set, and erasure count is reset in operation S410. For example, the SSL latch 183 is controlled to store the addresses of at least two string selection lines SSL corresponding to the received address. For example, the SSL latch 183 stores the addresses of the string selection lines SSL of a memory block BLK corresponding to the received address, according to the control of the erasure control unit 181. Also, the erasure counter 185 is initialized according to the control of the erasure control unit 181.

Memory cells MC corresponding to the received address are erased in operation S415. For example, a selected memory block BLK is erased. For example, the erasure control unit 181 controls the address decoder 120 and the voltage generating unit 160 in order for the selected memory block BLK to be erased. The erasure of the nonvolatile memory device 100' may be performed in the same method as the erasure of the nonvolatile memory device 100 that has been described above with reference to FIG. 1.

A first string selection line SSL1 is selected from the SSL latch 183 in operation S420. For example, a string selection line SSL corresponding to the first address among the addresses of string selection lines SSL stored in the SSL latch 183 may be selected.

Memory cells MC corresponding to the selected string selection line SSL1 are erasure-verified in operation S425. For example, the erasure control unit 181 controls the address decoder 120, the reading and writing circuit 130 and the voltage generating unit 160 in order for memory cells MC corresponding to a selected string selection line SSL to be erasure-verified. The erasure verification of the nonvolatile memory device 100' may be performed in the same method as the erasure verification of the nonvolatile memory device 100 that has been described above with reference to FIG. 1.

Whether the erasure-verified memory cells MC are erasure pass is determined in operation S430. When the erasure-verified memory cells MC are determined as erasure pass, the address of the selected string selection line SSL is deleted from the SSL latch 183 in operation S440. Subsequently, operation S445 is performed. When the erasure-verified memory cells MC are determined as erasure fail, operation S440 is omitted, and operation S445 is performed.

Whether the final string selection line SSL or not is determined in operation S445. For example, whether the selected string selection line SSL is the final address among the addresses of string selection lines SSL stored in the SSL latch 183 is determined. When the selected string selection line SSL is not the final string selection line SSL, a next string selection line SSL is selected from the SSL latch 183 in operation S435. Subsequently, operations S425 to S445 are again performed. When the selected string selection line SSL is the final string selection line SSL, operation S450 is performed.

When operations S420 to S445 are performed, erased memory cells MC are erasure-verified by unit of respective string selection line SSL. The address of a string selection line SSL corresponding to memory cells MC determined as erasure pass is deleted from the SSL latch 183. That is, the SSL latch 183 stores the addresses of a string selection line SSL corresponding to the erasure-failed memory cells MC of the erased memory cells MC.

Whether the address of a string selection line SSL is stored in the SSL latch 183 is determined in operation S450. That is, whether memory cells MC determined as erasure fail exist is determined.

When the erasure-failed memory cells MC do not exist, i.e., the addresses of the string selection line SSL are not stored in the SSL latch 183, an erasing operation is completed in operation S455. When the erasure-failed memory cells MC exist, i.e., the addresses of the string selection line SSL are stored in the SSL latch 183, operation S460 is performed.

Whether erasure count reaches the maximum value is determined in operation S460. When the erasure count reaches the maximum value, an error report is performed in operation S475. The erasing operation is ended.

When the erasure count does not reach the maximum value, it is counted up in operation S465. Furthermore, an erasure voltage Vers is adjusted in operation S470. For example, the level of the erasure voltage Vers increases. For example, the voltage generating unit 160 increases the level of the erasure voltage Vers according to the control of the erasure control unit 181.

As described above, the selected memory block BLK is erased, and erased memory cells MC are erasure-verified by unit of respective string selection line SSL. Erasure and erasure verification are repeated until the memory cells MC are erasure-passed or the erasure count reaches the maximum value.

A criterion of erasure pass and erasure fail may vary according to electronic devices that are used together with the nonvolatile memory device 100. For example, when a device having an n-bit error correction function is used together with the nonvolatile memory device 100', failed bits less than (or equal to) n bits that are generated in erasure verification may be ignored. That is, even when failed bits less than (or equal to) n bits are detected in erasure verification, erasure pass may be determined.

Figure 62:
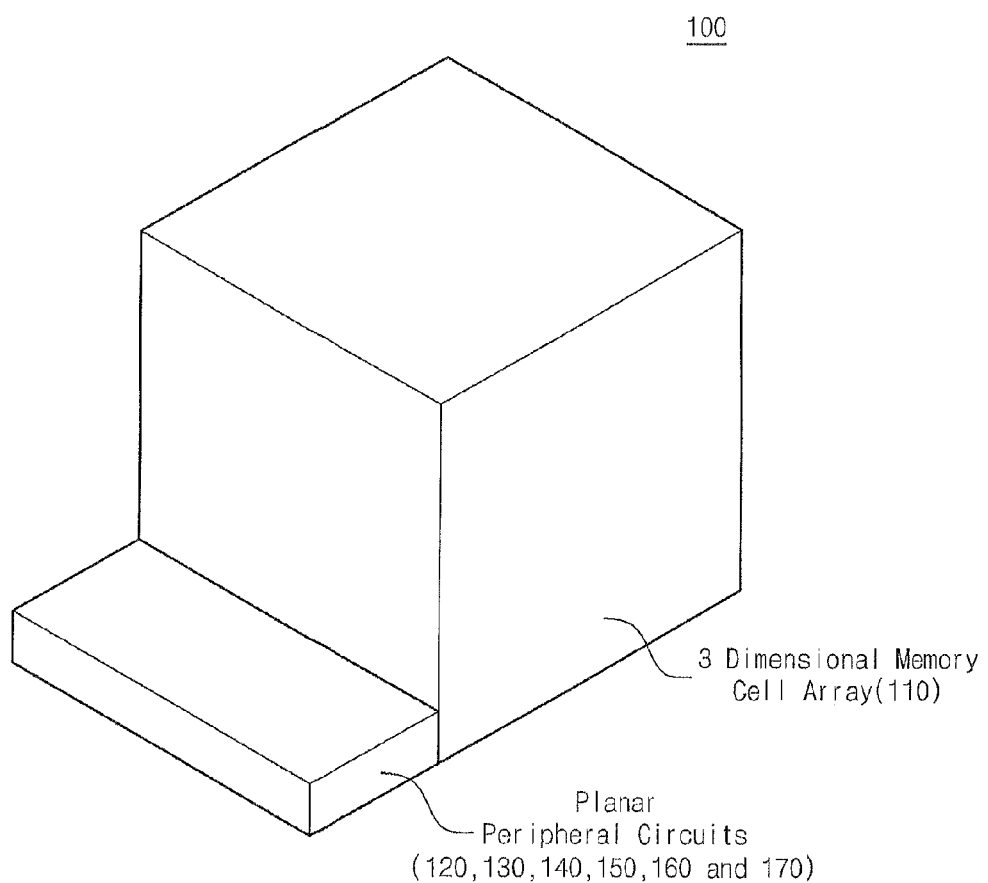
FIG. 62 is a perspective view illustrating a structure of a nonvolatile memory device according to an embodiment of the inventive concept.

FIG. 62 is a perspective view illustrating a structure of the nonvolatile memory device 100 or 100' which has been described above with reference to FIG. 1 or 58.

Referring to FIG. 62, the nonvolatile memory device 100 or 100' includes a 3-D memory cell array 110 and planar peripheral circuits 120, 130, 140, 150, 160 and 170 or 180.

As described above with reference to FIGS. 2 to 57, the memory cell array 110 includes the memory cells that are stacked in the direction that crosses with the substrate 111. That is, the memory cell array 110 has a 3-D structure where the memory cells are arranged in a 3-D structure.

On the other hand, the planar peripheral circuits 120, 130, 140, 150, 160 and 170 or 180 are configured with elements that are provided in a single layer onto the substrate 111. That is, the planar peripheral circuits 120, 130, 140, 150, 160 and 170 or 180 are configured with elements having a planar structure.

In an embodiment, the planar peripheral circuits 120, 130, 140, 150, 160 and 170 or 180 are provided to the one side of the 3-D memory cell array 110. However, the position relationships and number between the 3-D memory cell array 110 and the planar peripheral circuits 120, 130, 140, 150, 160 and 170 or 180 are not limited.

For example, the planar peripheral circuits 120, 130, 140, 150, 160 and 170 or 180 may be provided to at least two sides of the 3-D memory cell array 110. Also, at least two 3-D memory cell arrays 110 may be provided, and the planar peripheral circuits 120, 130, 140, 150, 160 and 170 or 180 may be provided to at least one side of each of the at least two 3-D memory cell arrays 110.

Figure 63:
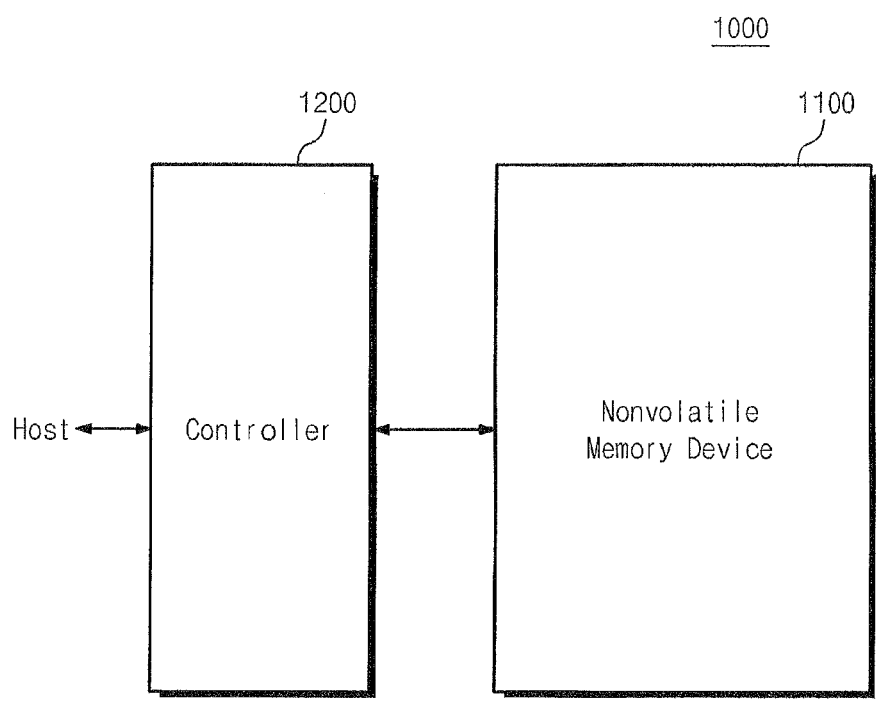
FIG. 63 is a block diagram illustrating a memory system according to an embodiment of the inventive concept.

FIG. 63 is a block diagram illustrating a memory system 1000 according to an embodiment of the inventive concept.

Referring to FIG. 63, a memory system 1000 according to an embodiment of the inventive concept includes a nonvolatile memory device 1100 and a controller 1200.

The nonvolatile memory device 1100 has the same structure as that of the nonvolatile memory device 100 which has been described above with reference to FIG. 1 or that of the nonvolatile memory device 100' which has been described above with reference to FIG. 58, and it operates identically to the nonvolatile memory device 100 or the nonvolatile memory device 100'. That is, the nonvolatile memory device 1100 erases a selected memory block BLK and erasure-verifies erased memory cells MC by unit of respective string selection line SSL.

The controller 1200 is connected to a host and the nonvolatile memory device 1100. In response to a request from the host, the controller 1200 accesses the nonvolatile memory device 1100. For example, the controller 1200 controls the reading, writing, erasing and background operations of the nonvolatile memory device 1100. The controller 1200 provides interface between the nonvolatile memory device 1100 and the host. The controller 1200 drives firmware for controlling the nonvolatile memory device 1100.

In an embodiment, as described above with reference to FIGS. 1 and 58, the controller 1200 provides a control signal CTRL and an address ADDR to the nonvolatile memory device 1100. Furthermore, the controller 12000 exchanges data DATA with the nonvolatile memory device 1100.

In an embodiment, the controller 1200 provides an erasure command and an address to the nonvolatile memory device 1100. In response to the erasure command and the address that are provided from the controller 1200, the nonvolatile memory device 1100 performs erasure and erasure verification in an operating method according to an embodiment of the inventive concept. For example, the nonvolatile memory device 1100 erases memory cells MC corresponding to a received address, and erasure-verifies the erased memory cells MC by unit of respective string selection line SSL.

The nonvolatile memory device 1100 transmits the result of an erasing operation to the controller 1200. For example, when the memory cells MC corresponding to the received address are erasure-passed, the nonvolatile memory device 1100 may provide a signal indicating erasure pass to the controller 1200. When erasure count reaches the maximum value before the memory cells MC corresponding to the received address are erasure-passed, the nonvolatile memory device 1100 provides an error report to the controller 1200.

In an embodiment, the controller 1200 may further include a RAM, a processing unit, a host interface, and a memory interface. The RAM is used as at least one of a working memory of the processing unit, a cache memory between the nonvolatile memory device 1100 and the host, and a buffer memory between the nonvolatile memory device 1100 and the host. The processing unit controls the overall operation of the controller 1200.

The host interface includes a protocol for data exchange between the host and the controller 1200. Exemplarily, the controller 1200 communicates with external devices (for example, a host) through at least one of various interface protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Component Small Interface (SCSI) protocol, an Enhanced Small Disk Interface (ESDI) protocol and a Integrated Drive Electronics (IDE) protocol. A memory interface interfaces with the nonvolatile memory device 1100. For example, the memory interface includes a NAND interface or a NOR interface.

The memory system 1000 may further include an error correction block. The error correction block detects and corrects the error of data that is read from the nonvolatile memory device 1100 with an Error Correction Code (ECC). Exemplarily, the error correction block is provided as the element of the controller 1200. The error correction block may be provided as the element of the nonvolatile memory device 1100.

The controller 1200 and the nonvolatile memory device 1100 may be integrated as one semiconductor device. Exemplarily, the controller 1200 and the nonvolatile memory device 1100 are integrated as one semiconductor device to configure a memory card. For example, the controller 1200 and the nonvolatile memory device 1100 are integrated as one semiconductor device to configure a memory card such as a PC card (Personal Computer Memory Card International Association (PCMICA)), a compact flash card (CF), a smart media card (SM, SMC), a memory stick, a multimedia card (MMC, RS-MMC, MMCmicro), an SD card (SD, miniSD, microSD, SDHC) and a universal flash memory device (UFS).

The controller 120 and the nonvolatile memory device 1100 are integrated as one semiconductor device to configure a semiconductor drive (Solid State Drive (SSD)). The semiconductor drive (SSD) includes a storage unit for storing data in a semiconductor memory. When the memory system 1000 is used as the semiconductor drive (SSD), the operation speed of the host connected to the memory system 1000 is considerably improved.

As another example, the memory system 1000 is provided as one of various elements of electronic devices such as computers, Ultra Mobile PCs (UMPCs), workstations, netbooks, Personal Digital Assistants (PDAs), portable computers, web tablets, wireless phones, mobile phones, smart phones, e-books, Portable Multimedia Players (PMPs), portable game machines, navigation devices, black boxes, digital cameras, Digital Multimedia Broadcasting (DMB) players, digital audio recorders, digital audio players, digital picture recorders, digital picture players, digital video recorders, digital video players, devices for transmitting/receiving information at a wireless environment, one of various electronic devices configuring a home network, one of various electronic devices configuring a computer network, one of various electronic devices configuring a telematics network, RFID devices and one of various elements configuring a computing system.

The nonvolatile memory device 1100 or the memory system 1000 may be implemented as various types of packages. For example, the nonvolatile memory device 1100 or the memory system 1000 may be implemented in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP), thereby being mounted.

Figure 64:
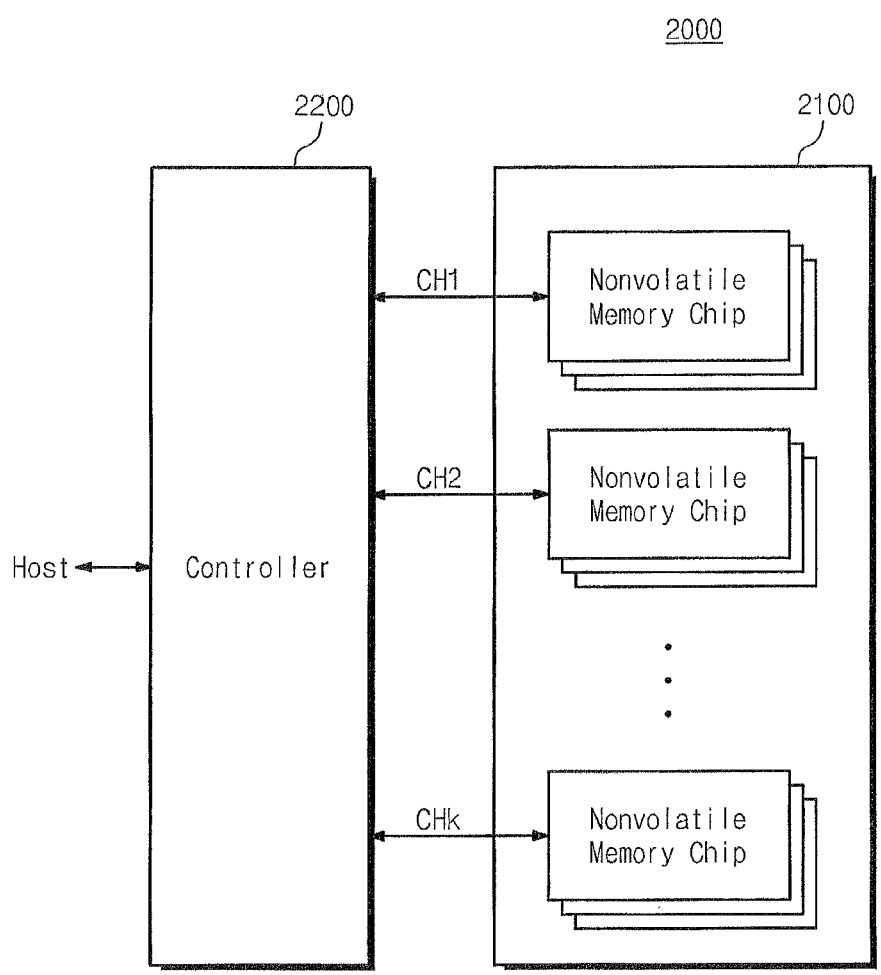
FIG. 64 is a block diagram of a memory system according to an embodiment of the inventive concept.

FIG. 64 is a block diagram of a memory system according to an embodiment of the inventive concept.

Referring to FIG. 64, a memory system 2000 includes a nonvolatile memory device 2100 and a controller 2200. The nonvolatile memory device 2100 includes a plurality of nonvolatile memory chips. The plurality of nonvolatile memory chips are divided into a plurality of groups. The each group of the nonvolatile memory chips communicates with the controller 2200 through a common channel. Exemplarily, it is illustrated that the plurality of nonvolatile memory chips communicate with the controller 2200 through first to kth channels CH1 to CHk.

Each nonvolatile memory chip has the same structure as that of the nonvolatile memory device 100 which has been described above with reference to FIG. 1 or that of the nonvolatile memory device 100' which has been described above with reference to FIG. 58, and it operates identically to the nonvolatile memory device 100 or the nonvolatile memory device 100'. That is, the each nonvolatile memory chip erases a selected memory block BLK and erasure-verifies erased memory cells MC by unit of respective string selection line SSL.

In FIG. 64, the plurality of nonvolatile memory chips are connected to one channel. However, the memory system 2000 may be modified so that one nonvolatile memory chip may be connected to one channel.

Figure 65:
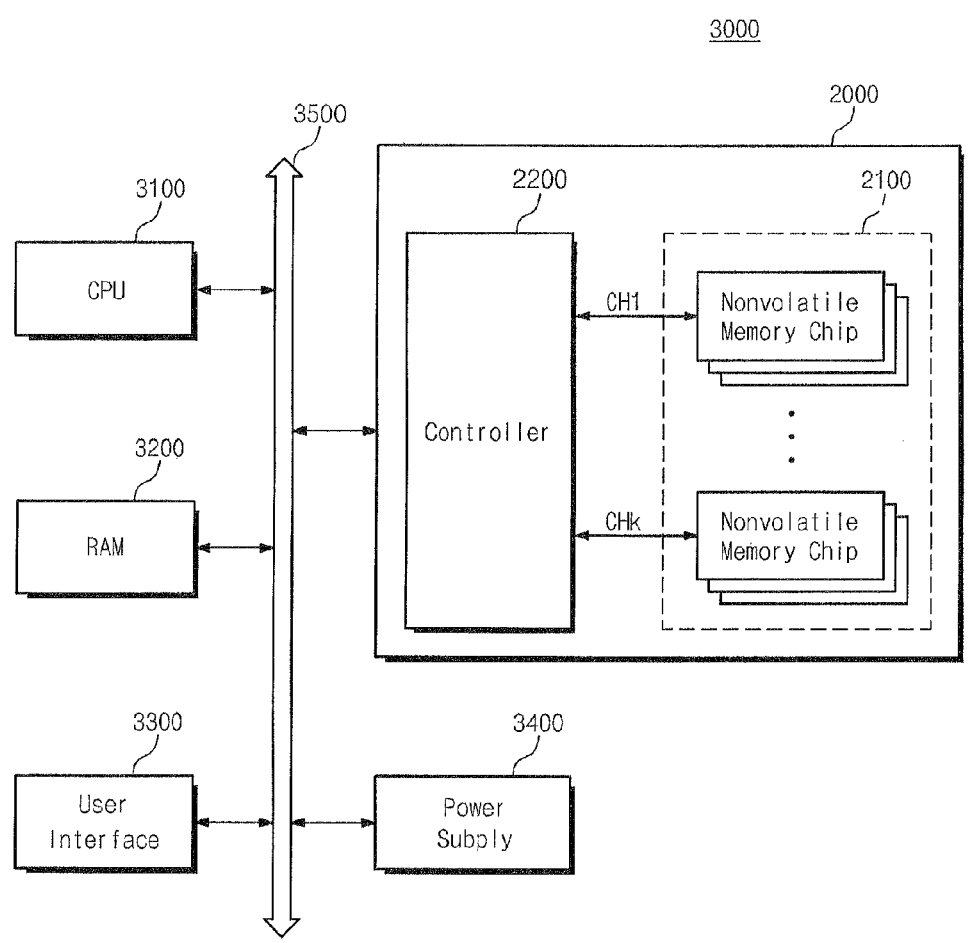
FIG. 65 is a block diagram illustrating a computing system according to an embodiment of the inventive concept.

FIG. 65 is a block diagram of a computing system according to an embodiment of the inventive concept.

Referring to FIG. 65, a computing system 3000 includes a Central Processing Unit (CPU) 3100, a RAM 3200, a user interface 3300, a power supply 3400, and the memory system 2000.

The memory system 2000 is electrically connected to the CPU 3100, the RAM 3200, the user interface 3300 and the power supply 3400 through a system bus 3500. Data, which is provided through the user interface 3300 or is processed by the CPU 3100, is stored in the memory system 2000.

In FIG. 65, it is illustrated that the nonvolatile memory device 2100 is connected to the system bus 3500 through the controller 2200. However, the nonvolatile memory device 2100 may be directly connected to the system bus 3500.

In FIG. 65, it is illustrated that the memory system 2000 is provided which has been described above with reference to FIG. 64. However, the memory system 2000 may be replaced by the memory system 1000 that has been described above with reference to FIG. 63.

The computing system 3000 may include all the memory systems 1000 and 2000 that have respectively been described above with reference to FIGS. 63 and 64.

In the above-described embodiments of the inventive concept, an operation of resetting a latch that stores an address and an operation of deleting the address stored in the latch have been described above, on the basis of the string selection lines and the word lines. The reset latch is not limited to have a specific value. In an embodiment, if the reset latch does not store an address, the reset latch may be applied to have various logical values. Likewise, when a specific address is deleted from the latch, the logical value of a storage region from which the address is deleted is not limited.

According to embodiments of the inventive concept, erasure (e.g., ISPE) and erasure verification are performed in the erasing operation. Accordingly, provided are the nonvolatile memory device having enhanced reliability, the operating method thereof, and the memory system including the same.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of operating a non-volatile memory device including a plurality of cell strings connected to a bit line, each cell string having at least one ground selection transistor, a plurality of memory cells and at least one string selection transistor stacked sequentially from a substrate in a direction perpendicular to the substrate, ground selection transistors of the plurality of cell strings being connected to a ground selection line in common, string selection transistors of the plurality of cell strings being connected to a plurality of string selection lines respectively, and memory cells having the same height from the substrate being connected to a word line in common, the method comprising:
   performing an erasing operation to memory cells of the plurality of cell strings;
   verifying first memory cells associated with a first string selection line of the plurality of string selection lines; and
   verifying second memory cells associated with a second string selection line of the plurality of string selection lines subsequent to verifying the first memory cells.

2. The method of claim 1, wherein verifying the first memory cells and the second memory cells includes recognizing an erasure pass or an erasure fail from respective memory cells.

3. The method of claim 1, further comprising resetting an SSL count and an erase count prior to performing the erasing operation.

4. The method of claim 3, further comprising counting up the SSL count when verifying the first memory cells passes.

5. The method of claim 3, further comprising counting up the erase count and adjusting an erase voltage to perform a second erasing operation to the memory cells of the plurality of cell strings when verifying the first memory cells fails.

6. The method of claim 5, further comprising performing an error report when the erase count reaches a preset value.

7. The method of claim 1, wherein an address of a string selection line associated with erasure-failed memory cells is hold, and
an additional verifying operation is performed according to the hold address subsequent to an additional erasing operation.

8. The method of claim 1, further comprising resetting an SSL latch and an erase count prior to the erasing operation.

9. The method of claim 8, further comprising storing an address of the first string selection line into the SSL latch when verifying the first memory cells fails.

10. The method of claim 9, further comprising counting up the erase count and adjusting an erase voltage to perform a second erasing operation to the memory cells of the plurality of cell strings when the SSL latch stores the address of the first string selection line after completing verifying the second memory cells.

11. The method of claim 10, further comprising verifying the first memory cells when the SSL latch stores the address of the first string selection line subsequent to the second erasing operation.

12. The method of claim 11, further comprising deleting the address of the first string selection line from the SSL latch when verifying the first memory cells passes after the second erasing operation.

13. The method of claim 1, further comprising setting an SSL latch and resetting an erase count prior to the erasing operation.

14. The method of claim 13, further comprising deleting an address of the first string selection line from the SSL latch when verifying the first memory cells passes.

15. The method of claim 14, further comprising counting up the erase count and adjusting an erase voltage to perform a second erasing operation to the memory cells of the plurality of cell strings when the SSL latch stores an address of the first string selection line after completing verifying the second memory cells.

16. A non-volatile memory device comprising:
a memory cell array comprising
a plurality of cell strings connected to a bit line, each cell string having at least one ground selection transistor, a plurality of memory cells and at least one string selection transistor stacked sequentially from a substrate in a direction perpendicular to the substrate, ground selection transistors of the plurality of cell strings being connected to a ground selection line in common, string selection transistors of the plurality of cell strings being connected to a plurality of string selection lines respectively, and memory cells having the same height from the substrate being connected to a word line in common;
a voltage generating unit configured to generate an erase voltage for an erasing operation to memory cells of the plurality of cell strings; and
a control logic configured to perform the erasing operation, a first verifying operation to first memory cells associated with a first string selection line of the plurality of string selection lines, and a second verifying operation to second memory cells associated with a second string selection line of the plurality of string selection lines in response to an erasure command.

17. The non-volatile memory device of claim 16, further comprising an address decoder connected to the memory cell array through the plurality of string selection lines, a plurality of word lines, and the ground selection line.

18. The non-volatile memory device of claim 16, further comprising a read/write circuit connected to the memory cell array through the bit line.

19. The non-volatile memory device of claim 16, further comprising a pass/fail check unit configured to determine whether each of the first and second verifying operations is failed or passed.

20. The non-volatile memory device of claim 19, wherein the control logic comprises an erase control unit, an SSL counter, and an erase counter, the erase control unit receiving a pass/fail data from the pass/fail check unit.

21. The nonvolatile memory device of claim 20, wherein the control logic is configured to perform a verifying operation to memory cells associated with a string selection line corresponding to a SSL count value of the SSL counter.

22. The nonvolatile memory device of claim 21, wherein the control logic is configured to increase the SSL count value when the string selection line corresponding to the SSL count value is erasure-passed.

23. The nonvolatile memory device of claim 21, wherein the control logic is configured to increase a erasure count value of the erase counter and perform a second erasing operation when the string selection line corresponding to the SSL count value is erasure-failed.

24. The nonvolatile memory device of claim 19, wherein the control logic comprises an erase control unit, an SSL latch and an erase counter, the erase control unit receiving a pass/fail data from the pass/fail check unit.

25. The nonvolatile memory device of claim 24, wherein the control logic is configured to reset the SSL latch before performing the erasing operation.

26. The nonvolatile memory device of claim 24, wherein the control logic is configured verify the memory cells of the plurality of cell strings sequentially in a unit of a string selection line, and store an address of a string selection line associated with erasure-failed memory cells.

27. The nonvolatile memory device of claim 26, wherein the control logic is configured to perform a second erasing operation when the SSL latch stores at least one address after a completion of verifying the memory cells of the plurality of cell strings.

28. The nonvolatile memory device of claim 27, wherein the control logic is configured to verify memory cells associated with at least one string selection line corresponding to the at least one address stored at the SSL latch in a unit of a string selection line.

29. The nonvolatile memory device of claim 24, wherein the control logic is configured to store address of the plurality of string selection lines into the SSL latch before performing the erasing operation.

30. The nonvolatile memory device of claim 29, wherein the control logic is configured to verify the memory cells of the plurality of cell strings sequentially in a unit of a string selection line, and delete an address of a string selection line associated with erasure-passed memory cells.

31. The nonvolatile memory device of claim 26, wherein the control logic is configured to perform a second erasing operation when the SSL latch stores at least one address after a completion of verifying the memory cells of the plurality of cell strings.

32. The nonvolatile memory device of claim 27, wherein the control logic is configured to verify memory cells associated with at least one string selection line corresponding to the at least one address stored at the SSL latch in a unit of a string selection line.

33. The nonvolatile memory device of claim 16, wherein the control logic configured to hold an address of a string selection line associated with erasure-failed memory cells, and perform an additional verifying operation according to the hold address after performing an additional erasing operation.

* * * * *